US010950734B2

(12) United States Patent
Tezuka et al.

(10) Patent No.: US 10,950,734 B2
(45) Date of Patent: Mar. 16, 2021

(54) SEMICONDUCTOR DEVICE AND MANUFACTURING METHOD THEREOF

(71) Applicant: SEMICONDUCTOR ENERGY LABORATORY CO., LTD., Atsugi (JP)

(72) Inventors: Sachiaki Tezuka, Kanagawa (JP); Tetsuhiro Tanaka, Tokyo (JP); Toshiya Endo, Kanagawa (JP); Mitsuhiro Ichijo, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/248,903

(22) Filed: Jan. 16, 2019

(65) Prior Publication Data

US 2019/0165179 A1    May 30, 2019

Related U.S. Application Data

(62) Division of application No. 15/131,298, filed on Apr. 18, 2016, now Pat. No. 10,192,995.

(30) Foreign Application Priority Data

Apr. 28, 2015   (JP) .............................. JP2015-091597

(51) Int. Cl.
*H01L 29/10*    (2006.01)
*H01L 29/12*    (2006.01)
(Continued)

(52) U.S. Cl.
CPC ........ *H01L 29/7869* (2013.01); *H01L 27/124* (2013.01); *H01L 27/127* (2013.01);
(Continued)

(58) Field of Classification Search
CPC ............. H01L 29/7869; H01L 27/1255; H01L 27/1207; H01L 29/78648; H01L 29/78603;
(Continued)

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

EP    1737044 A    12/2006
EP    2226847 A    9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Ismail A Muse
(74) *Attorney, Agent, or Firm* — Fish & Richardson P.C.

(57) ABSTRACT

A semiconductor device includes a semiconductor, a first conductor, a second conductor, a third conductor, a fourth conductor, a first insulator, a second insulator, a third insulator, and a fourth insulator. The first conductor and the semiconductor partly overlap with each other with the first insulator positioned therebetween. The second conductor and the third conductor have regions in contact with the semiconductor. The semiconductor has a region in contact with the second insulator. The fourth insulator has a first region and a second region. The first region is thicker than the second region. The first region has a region in contact with the second insulator. The second region has a region in (Continued)

contact with the third insulator. The fourth conductor and the second insulator partly overlap with each other with the fourth insulator positioned therebetween.

6 Claims, 61 Drawing Sheets

(51) Int. Cl.
    *H01L 29/786*     (2006.01)
    *H01L 27/12*     (2006.01)
    *H01L 29/66*     (2006.01)
    *H01L 29/78*     (2006.01)
    *H01L 27/06*     (2006.01)
    *H01L 27/108*     (2006.01)
    *H01L 27/1156*     (2017.01)
    *H01L 21/8258*     (2006.01)

(52) U.S. Cl.
    CPC ...... *H01L 27/1207* (2013.01); *H01L 27/1225* (2013.01); *H01L 27/1248* (2013.01); *H01L 27/1255* (2013.01); *H01L 29/66969* (2013.01); *H01L 29/7855* (2013.01); *H01L 29/78603* (2013.01); *H01L 29/78648* (2013.01); *H01L 21/8258* (2013.01); *H01L 27/0688* (2013.01); *H01L 27/10805* (2013.01); *H01L 27/10873* (2013.01); *H01L 27/1156* (2013.01)

(58) Field of Classification Search
    CPC ........... H01L 29/7855; H01L 29/66969; H01L 27/127; H01L 27/1248; H01L 27/124; H01L 27/1225; H01L 21/8258; H01L 27/1156; H01L 27/10873; H01L 27/10805; H01L 27/0688
    See application file for complete search history.

(56) References Cited

U.S. PATENT DOCUMENTS

| | | | |
|---|---|---|---|
| 5,866,932 A | 2/1999 | Yamazaki et al. |
| 6,025,630 A | 2/2000 | Yamazaki et al. |
| 6,294,274 B1 | 9/2001 | Kawazoe et al. |
| 6,563,174 B2 | 5/2003 | Kawasaki et al. |
| 6,025,630 C1 | 11/2003 | Yamazaki et al. |
| 6,727,522 B1 | 4/2004 | Kawasaki et al. |
| 6,875,674 B2 | 4/2005 | Asami et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,208,394 B2 | 4/2007 | Asami et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,465,679 B1 | 12/2008 | Yamazaki et al. |
| 7,468,304 B2 | 12/2008 | Kaji et al. |
| 7,501,293 B2 | 3/2009 | Ito et al. |
| 7,670,881 B2 | 3/2010 | Asami et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 8,304,327 B2 | 11/2012 | Asami et al. |
| 8,441,010 B2 | 5/2013 | Ichijo et al. |
| 8,547,771 B2 | 10/2013 | Koyama |
| 8,552,425 B2 | 10/2013 | Ichijo et al. |
| 8,603,899 B2 | 12/2013 | Asami et al. |
| 8,642,412 B2 | 2/2014 | Yamazaki et al. |
| 8,853,684 B2 | 10/2014 | Endo et al. |
| 8,995,174 B2 | 3/2015 | Koyama |
| 9,076,876 B2 | 7/2015 | Ichijo et al. |
| 9,123,692 B2 | 9/2015 | Noda et al. |
| 9,130,048 B2 | 9/2015 | Yamazaki et al. |
| 9,190,525 B2 | 11/2015 | Yamazaki |
| 9,209,795 B2 | 12/2015 | Okamoto et al. |
| 9,472,681 B2 | 10/2016 | Yamazaki |
| 9,761,736 B2 | 9/2017 | Yamazaki et al. |
| 9,954,114 B2 | 4/2018 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0153565 A1 | 10/2002 | Yamazaki et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |

(56) References Cited

U.S. PATENT DOCUMENTS

| | | |
|---|---|---|
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0215325 A1 | 9/2011 | Yamazaki et al. |
| 2011/0284959 A1 | 11/2011 | Kimura et al. |
| 2012/0025191 A1 | 2/2012 | Yamazaki |
| 2012/0061664 A1* | 3/2012 | Yamazaki ............ H01L 27/3248 257/43 |
| 2012/0061673 A1* | 3/2012 | Yamazaki ............. H01L 27/127 257/59 |
| 2012/0156556 A1 | 6/2012 | Kuriki et al. |
| 2012/0187396 A1 | 7/2012 | Yamazaki et al. |
| 2012/0248433 A1 | 10/2012 | Nakano et al. |
| 2012/0298998 A1 | 11/2012 | Yamazaki et al. |
| 2013/0015437 A1 | 1/2013 | Yamazaki |
| 2013/0113044 A1* | 5/2013 | Yamazaki ............ H01L 27/1255 257/347 |
| 2013/0288426 A1 | 10/2013 | Akimoto |
| 2013/0334533 A1 | 12/2013 | Yamazaki |
| 2014/0001468 A1 | 1/2014 | Yamazaki et al. |
| 2014/0138683 A1 | 5/2014 | Yamazaki et al. |
| 2014/0151674 A1* | 6/2014 | Yamazaki ............ H01L 27/1225 257/40 |
| 2014/0339540 A1 | 11/2014 | Takemura |
| 2014/0339544 A1 | 11/2014 | Hanaoka et al. |
| 2014/0339546 A1 | 11/2014 | Yamazaki et al. |
| 2014/0361289 A1 | 12/2014 | Suzawa |
| 2015/0008428 A1 | 1/2015 | Yamamoto et al. |
| 2015/0053975 A1 | 2/2015 | Endo et al. |
| 2015/0079731 A1 | 3/2015 | Yamazaki et al. |
| 2015/0091009 A1 | 4/2015 | Yamazaki et al. |
| 2015/0137124 A1 | 5/2015 | Egi et al. |
| 2015/0280691 A1 | 10/2015 | Koyama |
| 2015/0295061 A1 | 10/2015 | Ichijo et al. |
| 2015/0325595 A1* | 11/2015 | Yamazaki ............. H01L 27/127 438/104 |
| 2015/0325702 A1 | 11/2015 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-049514 A | 3/2012 |
| JP | 2012-257187 A | 12/2012 |
| JP | 2014-030012 A | 2/2014 |
| JP | 2014-240833 A | 12/2014 |
| JP | 2014-241407 A | 12/2014 |
| JP | 2015-005733 A | 1/2015 |
| JP | 2015-015458 A | 1/2015 |
| JP | 2015-035597 A | 2/2015 |
| JP | 2015-043415 A | 3/2015 |
| KR | 2014-0136385 A | 11/2014 |
| KR | 2015-0006363 A | 1/2015 |
| TW | 201220352 | 5/2012 |
| TW | 201501316 | 1/2015 |
| WO | WO-2004/114391 | 12/2004 |
| WO | WO-2012/014786 | 2/2012 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions of Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. SOC. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High perfomance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies In ZnO", Appl. Phys. Lett. (Applied Physics Letters) , 2005, vol. 87, pp. 122102-1-122102-3.

(56) References Cited

OTHER PUBLICATIONS

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-242.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-Crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

(56) References Cited

OTHER PUBLICATIONS

Park.S et al., "Challenge to Future Displays: Transparent AM-OLED Driven by Peald Grown ZnO TFT", IMID '07 Digest, 2007, pp. 1249-1252.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on $SrTiO_3$ With Sputtered $Al_2O_3$ Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
International Search Report (Application No. PCT/IB2016/052227) dated Aug. 16, 2016.
Written Opinion (Application No. PCT/IB2016/052227) dated Aug. 16, 2016.

* cited by examiner

FIG. 2A
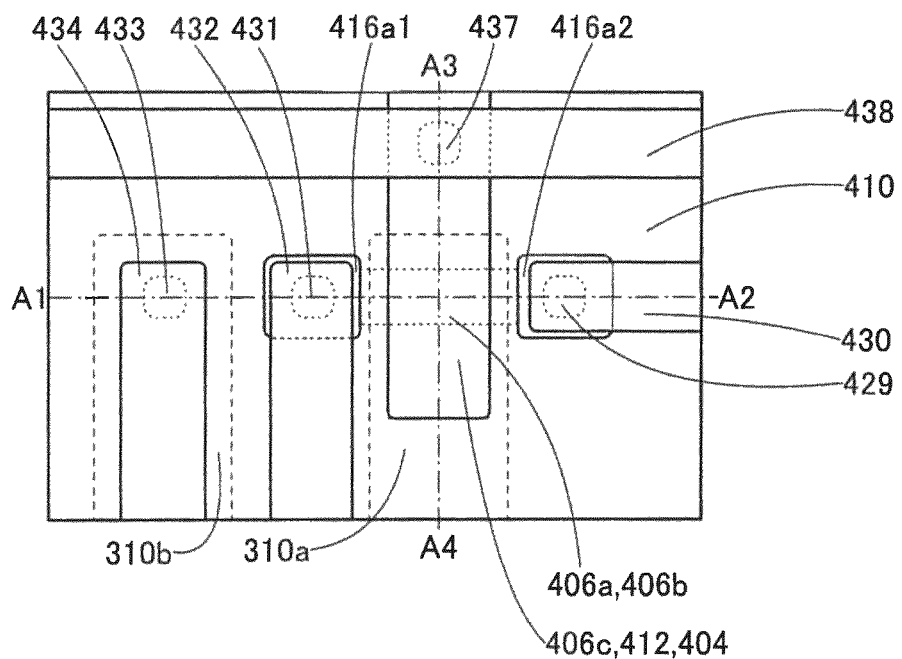
FIG. 2B
FIG. 2C
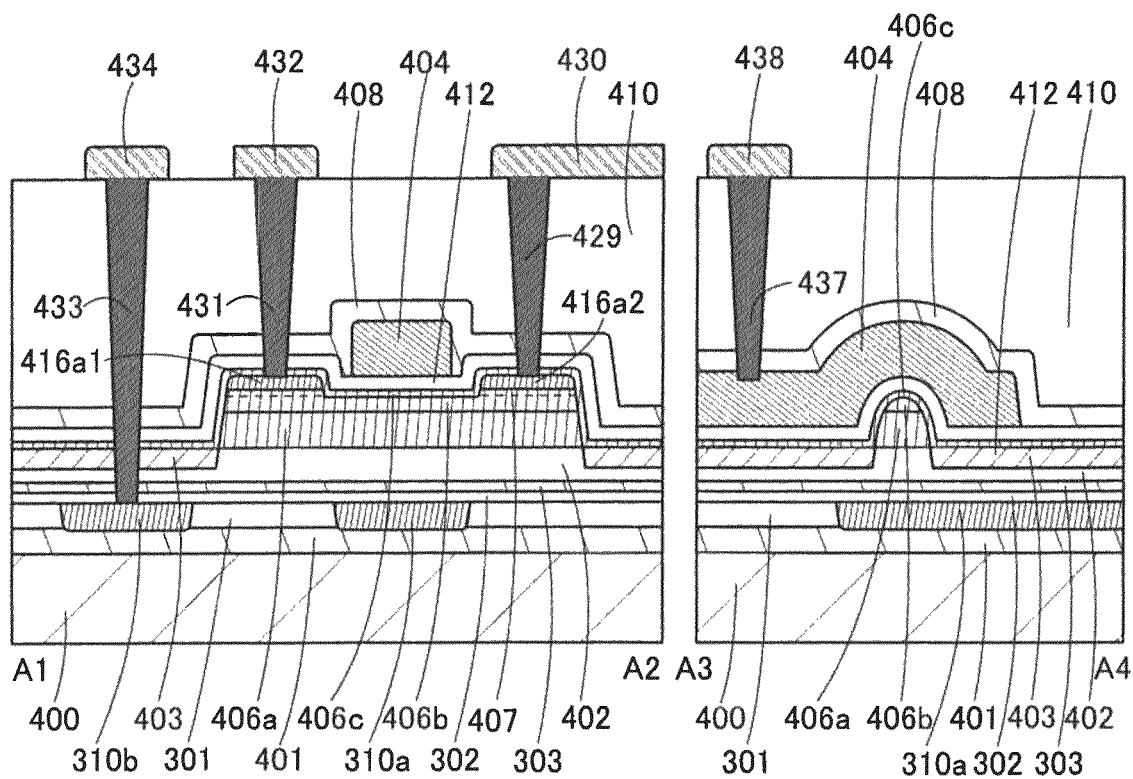

FIG. 3A
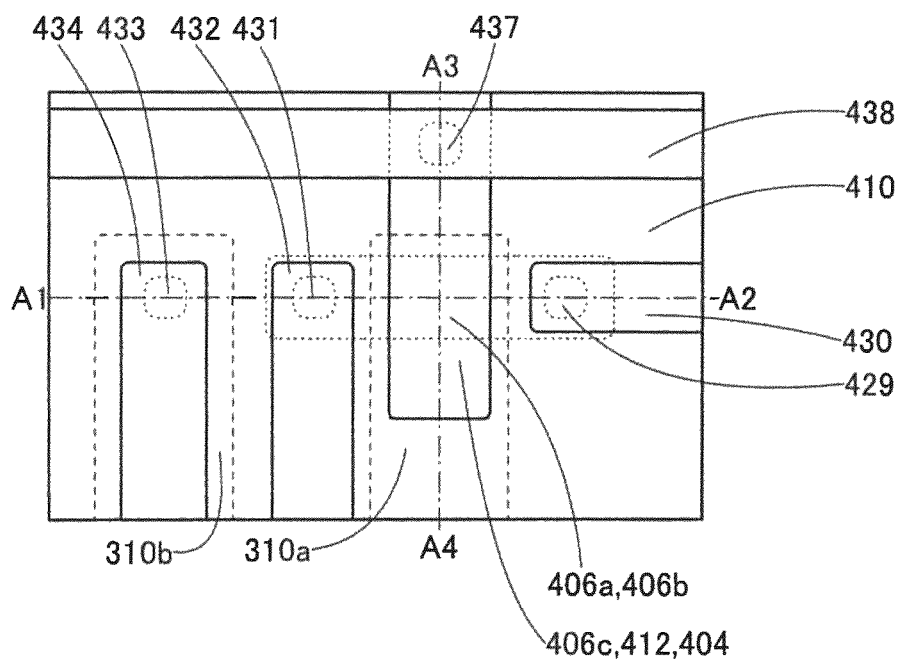
FIG. 3B
FIG. 3C
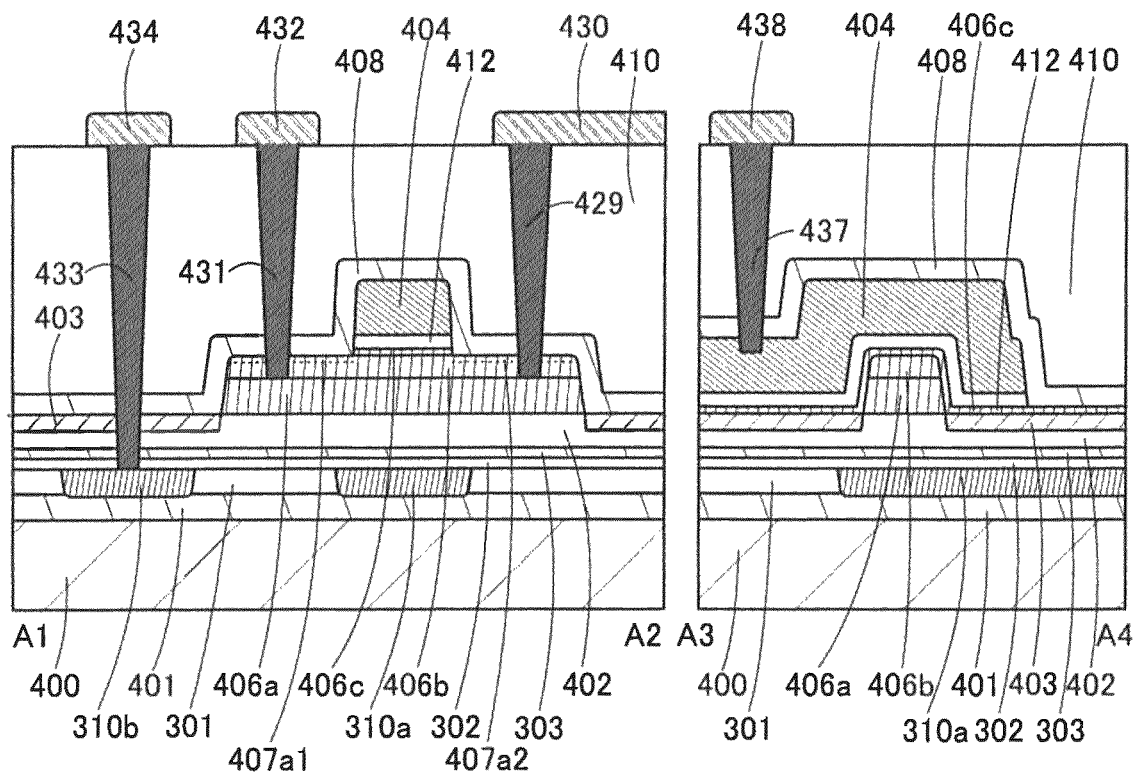

FIG. 4A
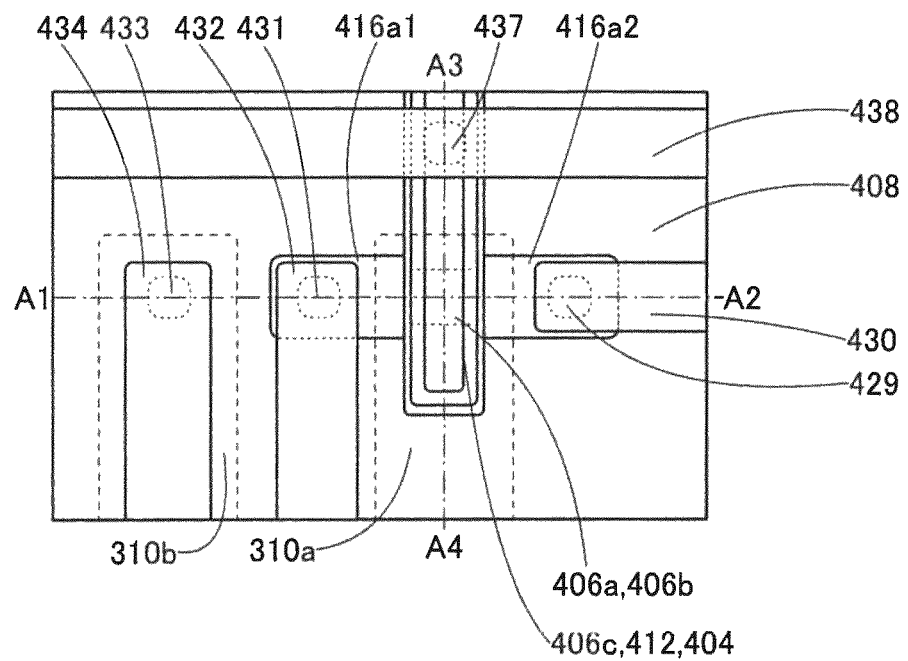
FIG. 4B
FIG. 4C
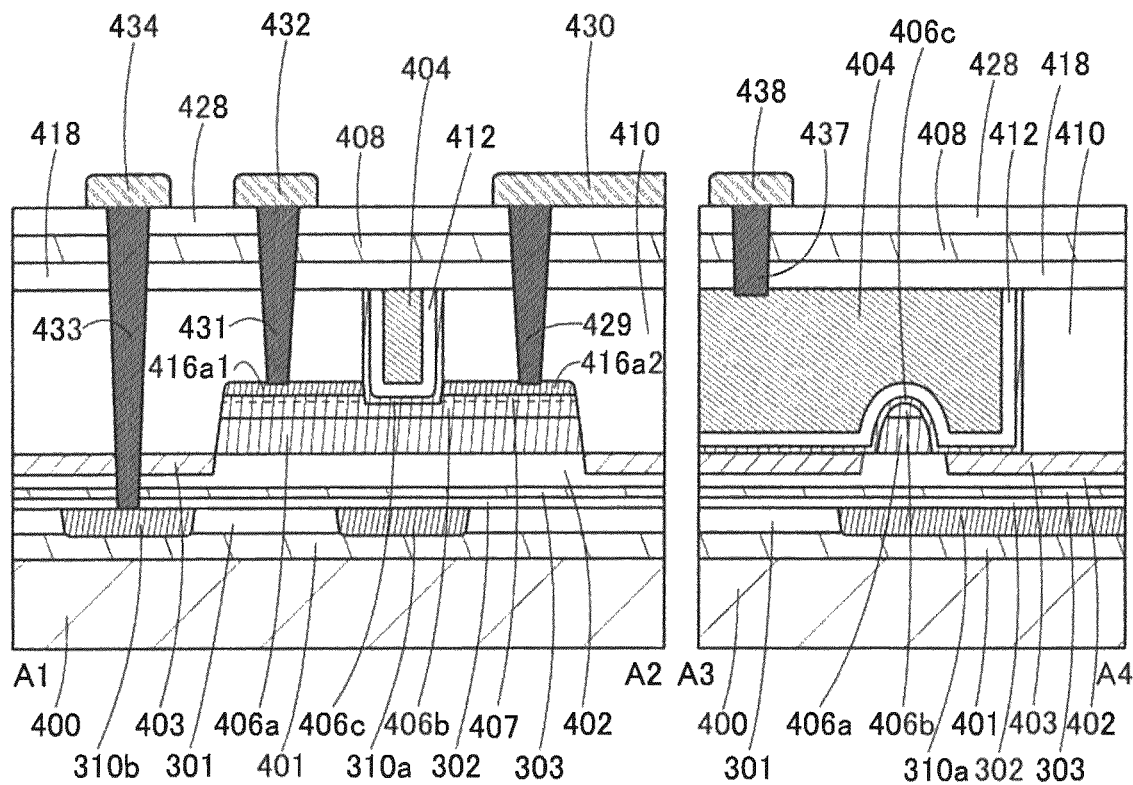

FIG. 6A
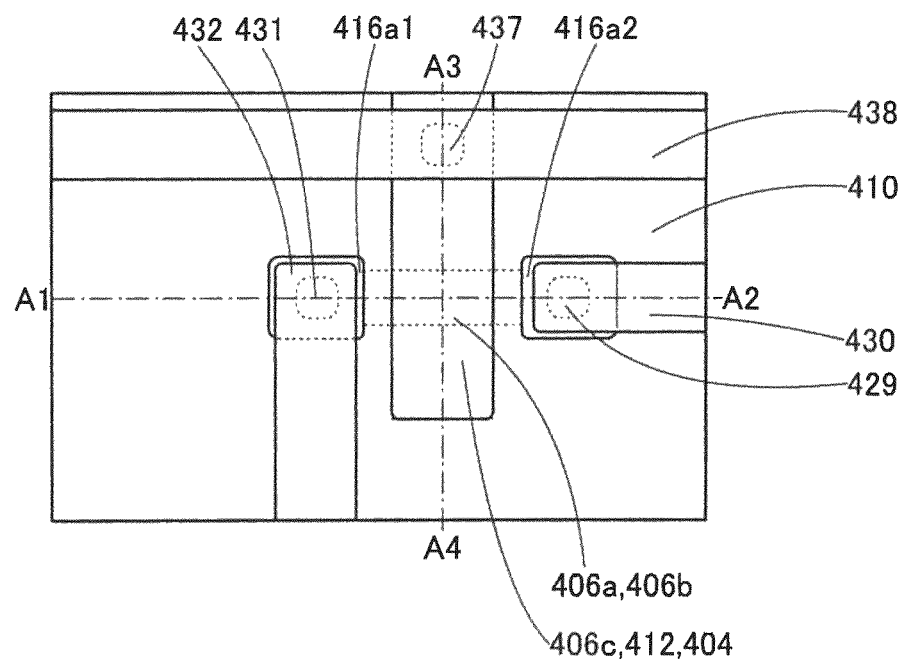
FIG. 6B
FIG. 6C
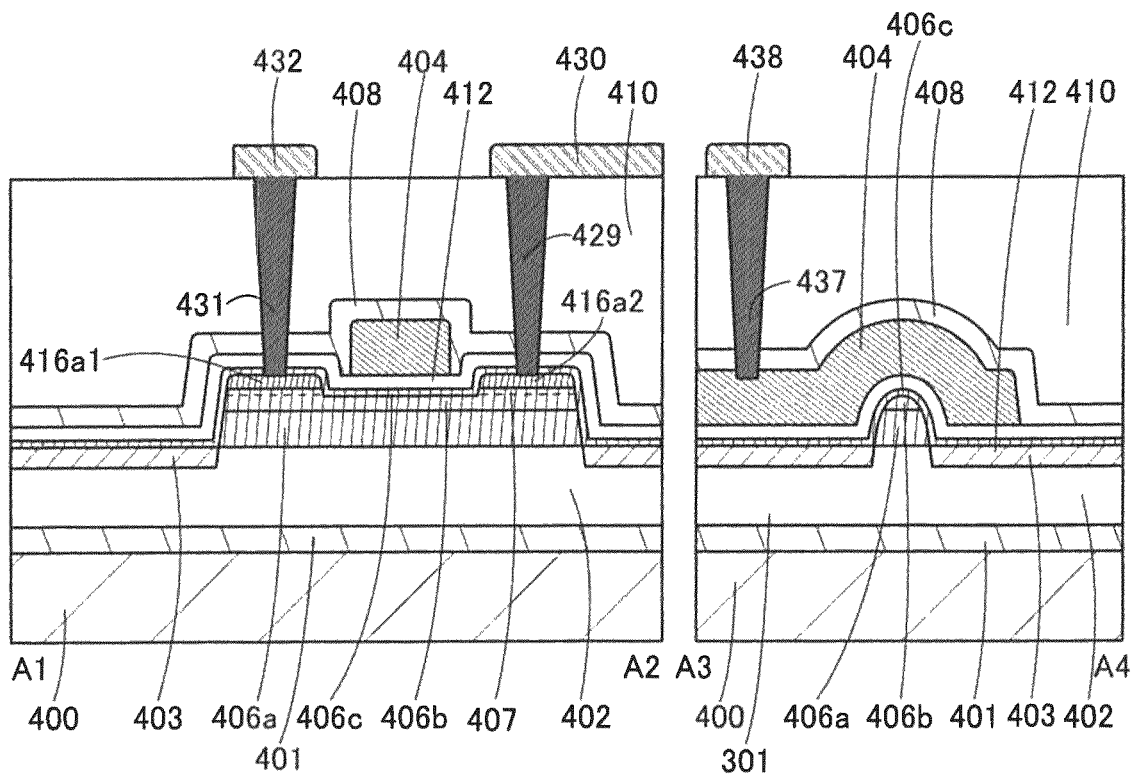

FIG. 7A
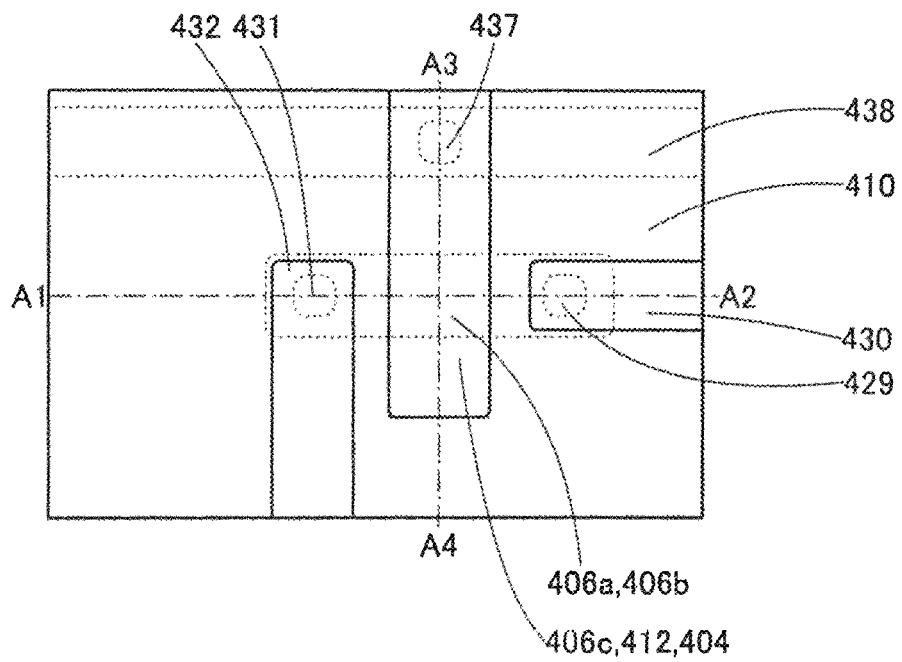
FIG. 7B
FIG. 7C
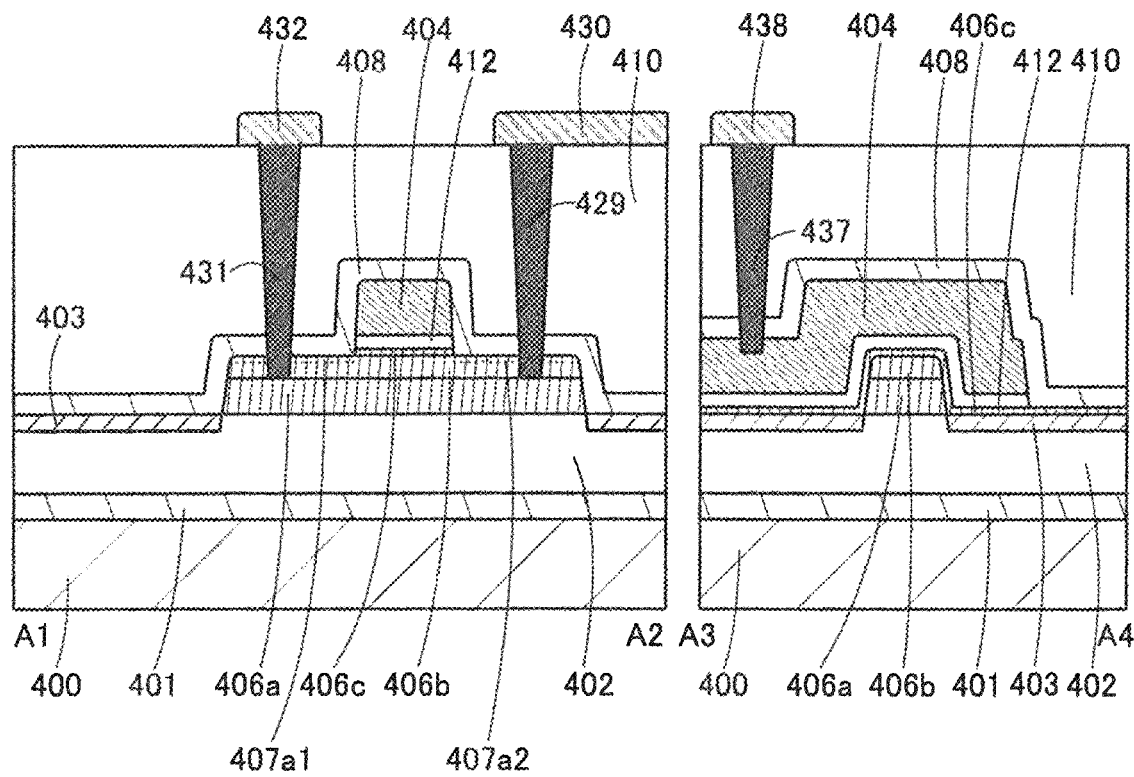

FIG. 12A out-of-plane method CAAC-OS
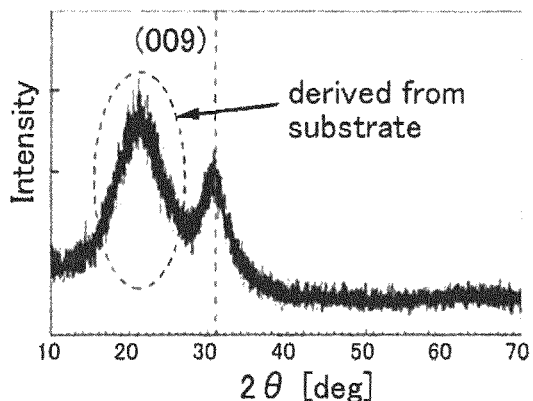
FIG. 12B
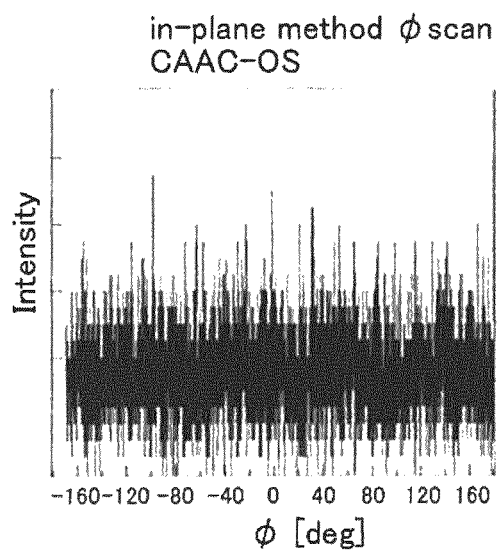
FIG. 12C
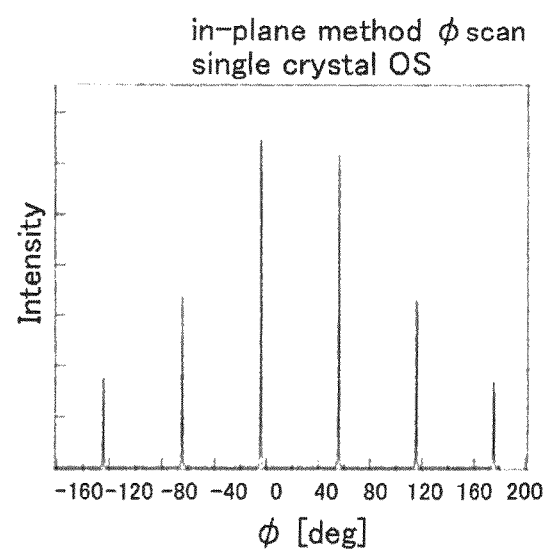
FIG. 12D
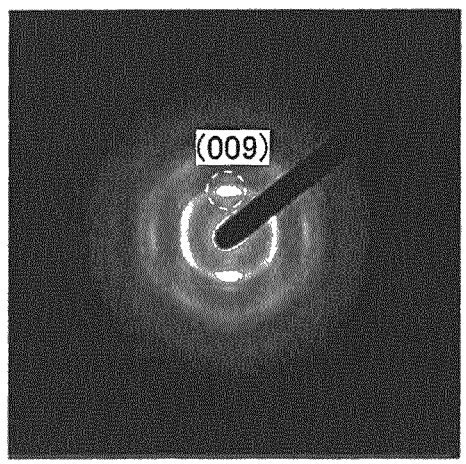
FIG. 12E
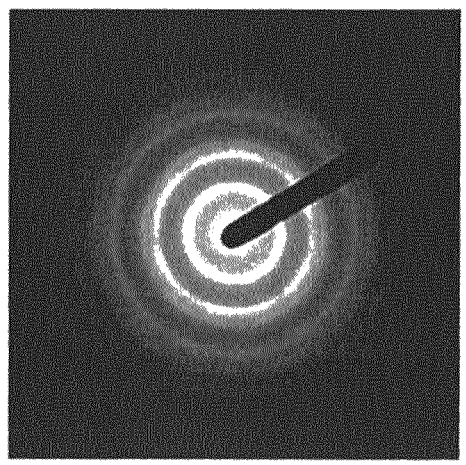

FIG. 29A
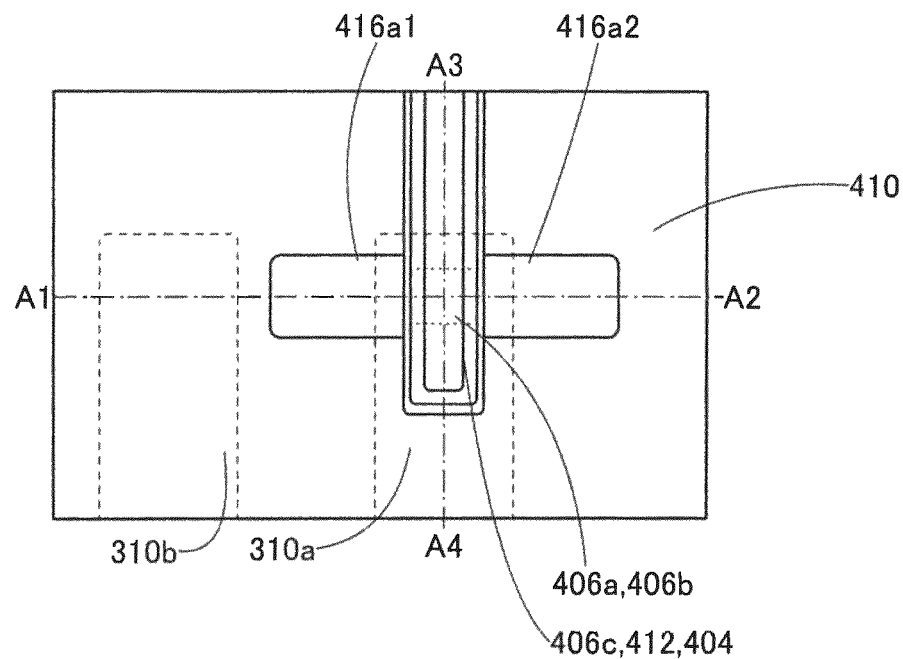
FIG. 29B
FIG. 29C
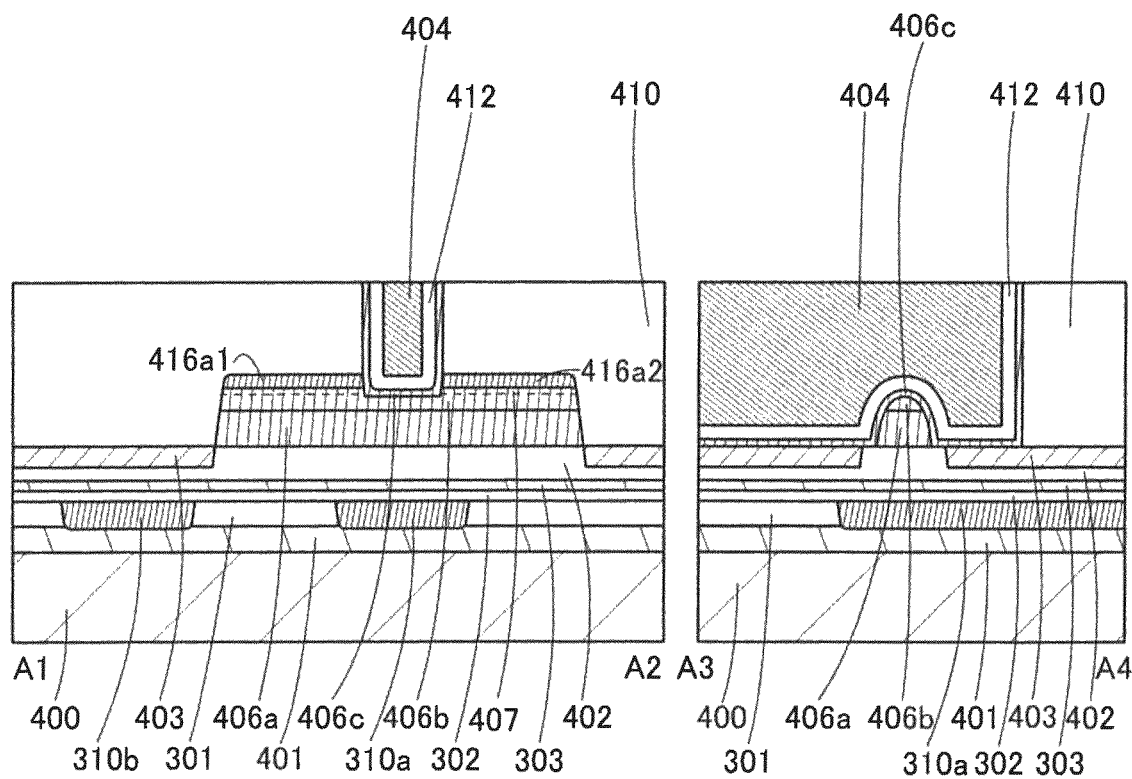

SEMICONDUCTOR DEVICE AND MANUFACTURING METHOD THEREOF

CROSS-REFERENCE TO RELATED APPLICATIONS

This application is a divisional of U.S. application Ser. No. 15/131,298, filed Apr. 18, 2016, now allowed, which claims the benefit of a foreign priority application filed in Japan as Serial No. 2015-091597 on Apr. 28, 2015, both of which are incorporated by reference.

TECHNICAL FIELD

The present invention relates to, for example, a transistor, a semiconductor device, and manufacturing methods thereof. The present invention relates to, for example, a display device, a light-emitting device, a lighting device, a power storage device, a memory device, a processor, and an electronic device. The present invention relates to a method for manufacturing a display device, a liquid crystal display device, a light-emitting device, a memory device, and an electronic device. The present invention relates to a driving method of a semiconductor device, a display device, a liquid crystal display device, a light-emitting device, a memory device, and an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

BACKGROUND ART

In recent years, a transistor including an oxide semiconductor has attracted attention. An oxide semiconductor can be formed by a sputtering method or the like, and thus can be used for a semiconductor of a transistor in a large display device. In addition, the transistor including an oxide semiconductor is advantageous in reducing capital investment because part of production equipment for a transistor including amorphous silicon can be retrofitted and utilized.

It is known that a transistor including an oxide semiconductor has an extremely low leakage current in an off state. For example, a low-power-consumption CPU utilizing a characteristic of low leakage current of the transistor including an oxide semiconductor is disclosed (see Patent Document 1).

Furthermore, a method for manufacturing a transistor including an oxide semiconductor in which a gate electrode is embedded in an opening is disclosed (see Patent Documents 2 and 3).

REFERENCE

Patent Document

[Patent Document 1] Japanese Published Patent Application No. 2012-257187

[Patent Document 2] Japanese Published Patent Application No. 2014-241407

[Patent Document 3] Japanese Published Patent Application No. 2014-240833

DISCLOSURE OF INVENTION

An object is to provide a transistor having a high withstand voltage. Another object is to provide a transistor with a high manufacturing yield. An object is to provide a minute transistor. Another object is to provide a transistor with low parasitic capacitance. Another object is to provide a transistor having high frequency characteristics. Another object is to provide a transistor with favorable electrical characteristics. Another object is to provide a transistor having stable electrical characteristics. Another object is to provide a transistor having a low off-state current. Another object is to provide a novel transistor. Another object is to provide a semiconductor device including the transistor. Another object is to provide a semiconductor device that operates at high speed. Another object is to provide a novel semiconductor device. Another object is to provide a module including any of the above semiconductor devices. Another object is to provide an electronic device including any of the above semiconductor devices or the module.

Note that the descriptions of these objects do not disturb the existence of other objects. In one embodiment of the present invention, there is no need to achieve all the objects. Other objects will be apparent from and can be derived from the description of the specification, the drawings, the claims, and the like.

(1) One embodiment of the present invention is a semiconductor device including a semiconductor, a first conductor, a second conductor, a third conductor, a fourth conductor, a first insulator, a second insulator, a third insulator, and a fourth insulator. The first conductor and the semiconductor partly overlap with each other with the first insulator positioned therebetween. The second conductor and the third conductor have regions in contact with the semiconductor. The semiconductor has a region in contact with the second insulator. The fourth insulator has a first region and a second region. The first region is thicker than the second region. The first region has a region in contact with the second insulator. The second region has a region in contact with the third insulator. The fourth conductor and the second insulator partly overlap with each other with the fourth insulator positioned therebetween. The third insulator contains fluorine.

(2) Another embodiment of the present invention is the semiconductor device described in (1), in which a deposition gas of the third insulator contains silicon and fluorine.

(3) Another embodiment of the present invention is the semiconductor device described in (1) or (2), in which the amount of hydrogen released from the third insulator when converted into hydrogen molecules is less than or equal to $6 \times 10^{14}$ molecules/cm$^2$ in thermal desorption spectroscopy analysis at a surface temperature of a film of higher than or equal to 100° C. and lower than or equal to 700° C., or higher than or equal to 100° C. and lower than or equal to 500° C.

(4) Another embodiment of the present invention is the semiconductor device described in any one of (1) to (3), in which the first insulator is a multilayer film including an insulator containing a metal oxide.

(5) Another embodiment of the present invention is the semiconductor device described in any one of (1) to (4), in which the fourth insulator is a multilayer film including an insulator containing a metal oxide.

(6) Another embodiment of the present invention is a semiconductor device including a semiconductor, a first conductor, a second conductor, a third conductor, a fourth conductor, a first insulator, a second insulator, a third insulator, a fourth insulator, and a fifth insulator. The first conductor and the semiconductor partly overlap with each other with the first insulator positioned therebetween. The second insulator has an opening through which a side surface of the second insulator and a side surface of the first conductor partly overlap with each other with the first insulator positioned therebetween. Part of a surface of the second conductor and part of a surface of the third conductor are in contact with the first insulator through the opening. The semiconductor has a region overlapping with the second conductor and a region overlapping with the third conductor. The fifth insulator has a first region and a second region. The first region is thicker than the second region. The first region has a region in contact with the third insulator. The second region has a region in contact with the fourth insulator. The fourth conductor and the third insulator partly overlap with each other with the fifth insulator positioned therebetween. The fourth insulator contains fluorine.

(7) Another embodiment of the present invention is the semiconductor device described in (6), in which a deposition gas of the fourth insulator contains silicon and fluorine.

(8) Another embodiment of the present invention is the semiconductor device described in (6) or (7), in which the amount of hydrogen released from the fourth insulator when converted into hydrogen molecules is less than or equal to $6 \times 10^{14}$ molecules/cm$^2$ in thermal desorption spectroscopy analysis at a surface temperature of a film of higher than or equal to 100° C. and lower than or equal to 700° C., or higher than or equal to 100° C. and lower than or equal to 500° C.

(9) Another embodiment of the present invention is the semiconductor device described in any one of (6) to (8), in which the first insulator is a multilayer film including a metal oxide.

(10) Another embodiment of the present invention is the semiconductor device described in any one of (6) to (9), in which the fifth insulator is a multilayer film including an insulator containing a metal oxide.

(11) Another embodiment of the present invention is a method for manufacturing a semiconductor device including the steps of forming a second insulator over a first insulator; forming a first conductor over the second insulator; forming a first conductive layer by partly etching the first conductor; forming a third insulator over the second insulator and the first conductive layer; forming a fourth insulator over the third insulator; forming a semiconductor over the fourth insulator; forming a second conductor over the semiconductor; forming a second conductive layer by partly etching the second conductor; dividing the second conductive layer into a third conductive layer and a fourth conductive layer by partly etching the second conductive layer; forming a semiconductor layer by partly etching the semiconductor; forming a first insulating layer by partly etching the fourth insulator; selectively forming a fifth insulator over the third insulator; forming a sixth insulator over the fifth insulator, on a side surface of the first insulating layer, on a side surface of the semiconductor layer, over the semiconductor layer, on a side surface of the third conductive layer, over the third conductive layer, on a side surface of the fourth conductive layer, and over the fourth conductive layer; forming a third conductor over the sixth insulator; and forming a fourth conductive layer by partly etching the third conductor.

(12) Another embodiment of the present invention is the method for manufacturing a semiconductor device described in (11), in which the fifth insulator is formed with a gas containing silicon and fluorine.

(13) Another embodiment of the present invention is a method for manufacturing a semiconductor device including the steps of forming a second insulator over a first insulator; forming a first conductor over the second insulator; forming a first conductive layer by partly etching the first conductor; forming a third insulator over the second insulator and the first conductive layer; forming a fourth insulator over the third insulator; forming a semiconductor over the fourth insulator; forming a second conductor over the semiconductor; forming a multilayer film including the fourth insulator, the semiconductor, and the second conductor by partly etching the fourth insulator, the semiconductor, and the second conductor; selectively forming a fifth insulator over the third insulator; forming a sixth insulator over the fifth insulator, on a side surface of the multilayer film, and over the multilayer film; dividing the second conductor into a second conductive layer and a third conductive layer by forming an opening reaching a surface of the fifth insulator and a surface of the semiconductor in the sixth insulator and the second conductor; forming a seventh insulator over the sixth insulator; forming a third conductor over the seventh insulator; and exposing the sixth insulator by performing chemical mechanical polishing on the third conductor and the seventh insulator to form a fourth conductive layer including the third conductor and a first insulating layer including the seventh insulator.

(14) Another embodiment of the present invention is the method for manufacturing a semiconductor device described in (13), in which the fifth insulator is formed with a gas containing silicon and fluorine.

Note that in the method for manufacturing a semiconductor device of one embodiment of the present invention, the oxide semiconductor may be replaced with another semiconductor.

A transistor having a high withstand voltage can be provided. Alternatively, a transistor with a high manufacturing yield can be provided. Alternatively, a minute transistor can be provided. Alternatively, a transistor with low parasitic capacitance can be provided. Alternatively, a transistor having high frequency characteristics can be provided. Alternatively, a transistor with favorable electrical characteristics can be provided. Alternatively, a transistor having stable electrical characteristics can be provided. Alternatively, a transistor having a low off-state current can be provided. Alternatively, a novel transistor can be provided. Alternatively, a semiconductor device including the transistor can be provided. Alternatively, a semiconductor device that operates at high speed can be provided. Alternatively, a novel semiconductor device can be provided. A module including any of the above semiconductor devices can be provided. An electronic device including any of the above semiconductor devices or the module can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIGS. 2A to 2C are a top view and cross-sectional views of a transistor of one embodiment of the present invention.

FIGS. 3A to 3C are a top view and cross-sectional views of a transistor of one embodiment of the present invention.

FIGS. 4A to 4C are a top view and cross-sectional views of a transistor of one embodiment of the present invention.

FIGS. 6A to 6C are a top view and cross-sectional views of a transistor of one embodiment of the present invention.

FIGS. 7A to 7C are a top view and cross-sectional views of a transistor of one embodiment of the present invention.

FIGS. 12A to 12E show structural analysis of a CAAC-OS and a single crystal oxide semiconductor by XRD and selected-area electron diffraction patterns of a CAAC-OS.

FIGS. 29A to 29C are a top view and cross-sectional views illustrating a method for manufacturing a transistor of one embodiment of the present invention.

FIGS. 57A to 57H are graphs each showing results of TDS analysis in Example.

BEST MODE FOR CARRYING OUT THE INVENTION

Figure 1A:
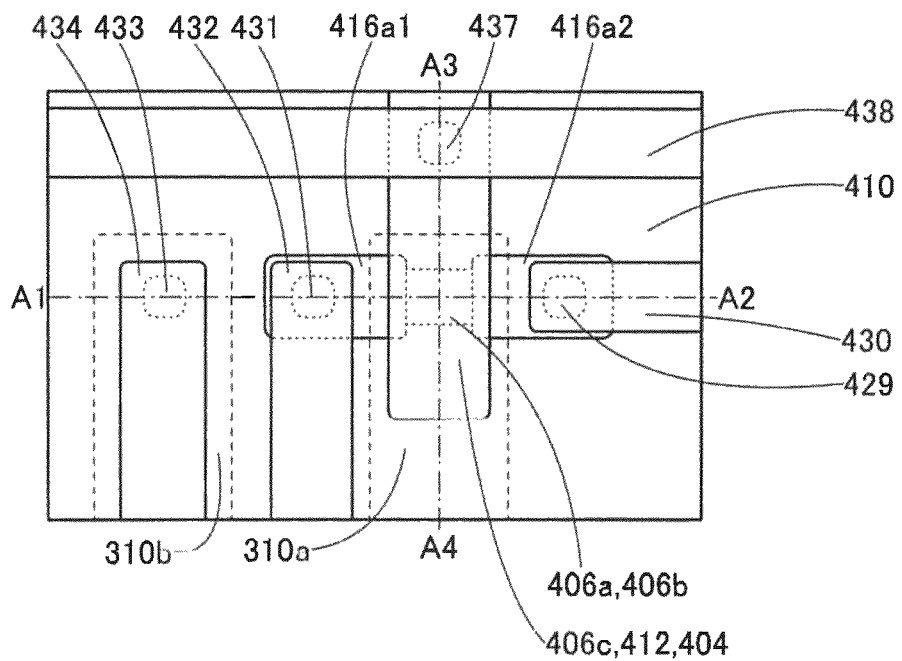
FIGS. 1A to 1C are a top view and cross-sectional views of a transistor of one embodiment of the present invention.

Hereinafter, embodiments and examples of the present invention will be described in detail with the reference to the drawings. However, the present invention is not limited to the description below, and it is easily understood by those skilled in the art that modes and details disclosed herein can be modified in various ways. Further, the present invention is not construed as being limited to description of the embodiments and the examples. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in drawings is sometimes exaggerated for simplicity.

In this specification, for example, when the shape of an object is described with the use of a term such as "diameter", "grain size (diameter)", "dimension", "size", or "width", the term can be regarded as the length of one side of a minimal cube where the object fits, or an equivalent circle diameter of a cross section of the object. The term "equivalent circle diameter of a cross section of the object" refers to the diameter of a perfect circle having the same area as that of the cross section of the object.

A voltage usually refers to a potential difference between a given potential and a reference potential (e.g., a ground potential (GND) or a source potential). A voltage can be referred to as a potential and vice versa.

Note that the ordinal numbers such as "first" and "second" in this specification are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

Note that an impurity in a semiconductor refers to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased, for example. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, an oxygen vacancy may be formed by entry of impurities such as hydrogen. Further, in the case where the semiconductor is a silicon film, examples of an impurity which changes characteristics of the semiconductor include oxygen, Group 1 elements except hydrogen, Group 2 elements, Group 13 elements, and Group 15 elements.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is increased in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

Note that in specification, the description "A has a shape such that an end portion extends beyond an end portion of B" may indicate, for example, the case where at least one of end portions of A is positioned on an outer side of at least one of end portions of B in a top view or a cross-sectional view. Thus, the description "A has a shape such that an end portion extends beyond an end portion of B" can be read as the description "one end portion of A is positioned on an outer side of one end portion of B in a top view," for example.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, the trigonal and rhombohedral crystal systems are included in the hexagonal crystal system.

Embodiment 1

<Transistor Structure 1>

A structure of a transistor included in a semiconductor device of one embodiment of the present invention is described below.

Figure 1B:
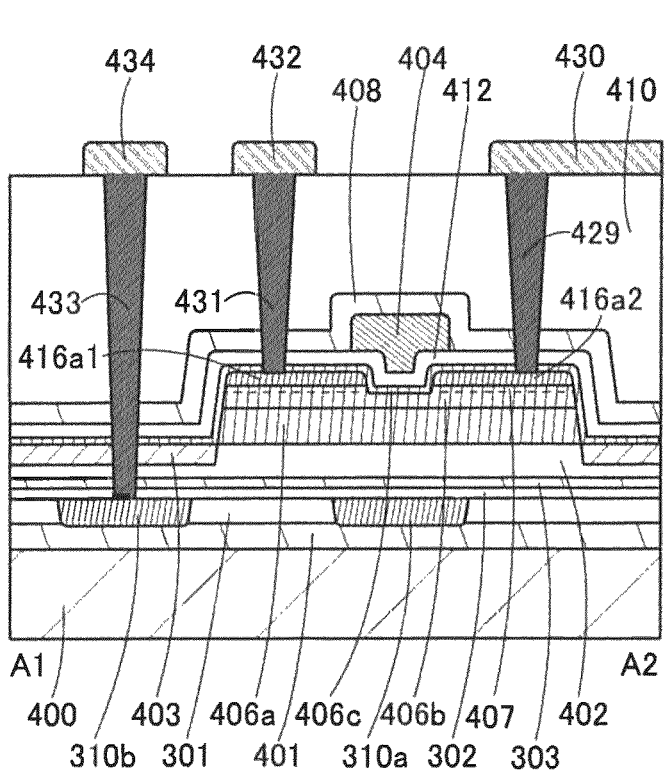
Figure 1C:
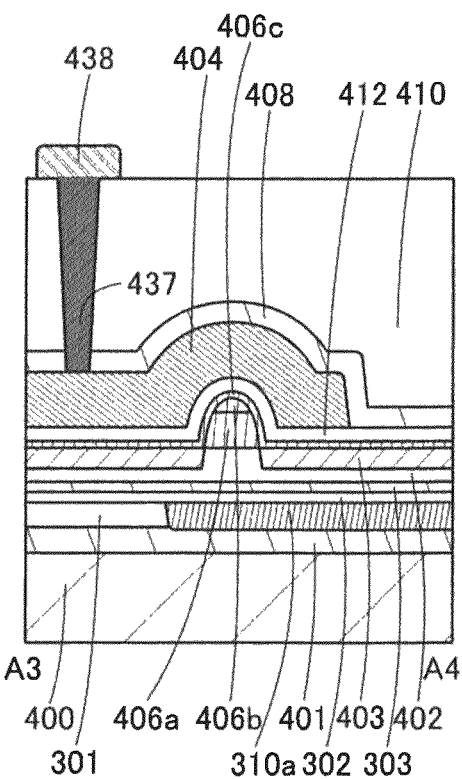

FIGS. 1A to 1C are a top view and cross-sectional views of a semiconductor device of one embodiment of the present invention. FIG. 1A is the top view, and FIGS. 1B and 1C are the cross-sectional views taken along dashed-dotted lines A1-A2 and A3-A4 in FIG. 1A, respectively. Note that for simplification of the drawing, some components are not illustrated in the top view in FIG. 1A.

In FIGS. 1B and 1C, the transistor includes an insulator 401 over a substrate 400; an insulator 301 and conductors 310a and 310b over the insulator 401; an insulator 302 over the insulator 301 and conductors 310a and 310b; an electron trap layer 303 over the insulator 302; an insulator 402 over the electron trap layer 303; an insulator 403 and an insulator 406a over the insulator 402; a semiconductor 406b over the insulator 406a; conductors 416a1 and 416a2 each having a region in contact with a top surface of the semiconductor 406b; an insulator 406c having regions in contact with a top surface of the insulator 403, side surfaces of the insulator 406a, the top surface and side surfaces of the semiconductor 406b, a top surface and side surfaces of the conductor 416a1, and a top surface and side surfaces of the conductor 416a2; an insulator 412 over the insulator 406c; and a conductor 404 partly overlapping with the semiconductor 406b with the insulator 412 positioned therebetween.

The following components are provided over the transistor: an insulator 408; an insulator 410 over the insulator 408; an opening reaching the conductor 310b through the insulators 410, 408, 412, 406c, 403, and 402, the electron trap layer 303, and the insulator 302; an opening reaching the conductor 416a1 through the insulators 410, 408, 412, and 406c; an opening reaching the conductor 416a2 through the insulators 410, 408, 412, and 406c; an opening reaching the conductor 404 through the insulators 410 and 408; a conductor 433, a conductor 431, a conductor 429, and a conductor 437 that are embedded in the respective openings; a conductor 434 over the insulator 410, which includes a region in contact with the conductor 433; a conductor 432 over the insulator 410, which includes a region in contact with the conductor 431; a conductor 430 over the insulator 410, which includes a region in contact with the conductor 429; and a conductor 438 over the insulator 410, which includes a region in contact with the conductor 437.

Note that the semiconductor 406b includes a region 407 in which the top surface of the semiconductor 406b is in contact with the conductors 416a1 and 416a2.

In the transistor, the conductor 404 functions as a first gate electrode. Furthermore, the conductor 404 can have a stacked-layer structure including a conductor that hardly allows oxygen to pass therethrough. For example, when the conductor that hardly allows oxygen to pass therethrough is formed as a lower layer, an increase in the electric resistance value due to oxidation of the conductor 404 can be prevented. The insulator 412 functions as a first gate insulating film.

The conductors 416a1 and 416a2 function as source and drain electrodes of the transistor. The conductors 416a1 and 416a2 each can have a stacked-layer structure including a conductor that hardly allows oxygen to pass therethrough. For example, when the conductor that hardly allows oxygen to pass therethrough is formed as an upper layer, an increase in the electric resistance value due to oxidation of the conductors 416a1 and 416a2 can be prevented. Note that the electric resistance values of the conductors can be measured by a two-terminal method or the like.

The resistance of the semiconductor 406b can be controlled by a potential applied to the conductor 404. That is, conduction or non-conduction between the conductor 416a1 and the conductor 416a2 can be controlled by the potential applied to the conductor 404.

As illustrated in FIGS. 1B and 1C, the top surface of the semiconductor 406b is in contact with the conductors 416a1 and 416a2. In addition, the insulator 406a and the semiconductor 406b can be electrically surrounded by an electric field of the conductor 404 functioning as the first gate electrode. A structure of a transistor in which a semiconductor is electrically surrounded by an electric field of a gate electrode is referred to as a surrounded channel (s-channel) structure. Therefore, a channel is formed in the entire semiconductor 406b in some cases. In the s-channel structure, a large amount of current can flow between a source and a drain of the transistor, so that an on-state current can be increased. In addition, since the insulator 406a and the semiconductor 406b are surrounded by the electric field of the conductor 404, an off-state current can be decreased.

The conductor 310a functions as a second gate electrode. The conductor 310a can be a multilayer film containing a conductive film that hardly allows oxygen to pass therethrough. When the conductor 310a is a multilayer film including a conductive film that hardly allows oxygen to pass therethrough, a reduction in conductivity caused by oxidation of the conductor 310a can be prevented. The insulator 302, the electron trap layer 303, and the insulator 402 function as a second gate insulating film.

Figure 9A:
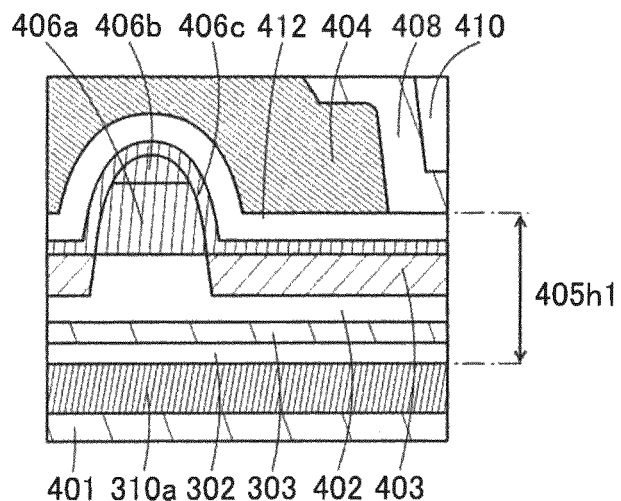
FIGS. 9A and 9B are cross-sectional views each illustrating part of a transistor of one embodiment of the present invention and part of a conventional transistor.
Figure 9B:
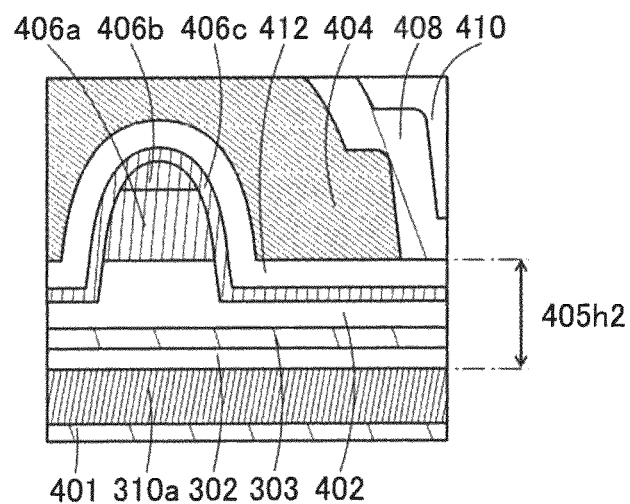

Features of the transistor of one embodiment of the present invention are described here with reference to FIGS. 9A and 9B. FIG. 9A is an enlarged view of part of the transistor in FIG. 1C. The conductor 404 functioning as the first gate electrode partly overlaps with the conductor 310a functioning as the second gate electrode with the insulators 412, 406c, 403, and 402, the electron trap layer 303, and the insulator 302 positioned therebetween. A distance 405h1 denotes a distance between the bottom surface of the conductor 404 and the top surface of the conductor 310a.

FIG. 9B is an enlarged view of part of a conventional transistor. The conductor 404 functioning as the first gate electrode partly overlaps with the conductor 310a functioning as the second gate electrode with the insulators 412, 406c, and 402, the electron trap layer 303, and the insulator 302 positioned therebetween. A reference numeral 405h2 denotes a distance between the bottom surface of the conductor 404 and the top surface of the conductor 310a.

The threshold voltage of the transistor of one embodiment of the present invention and the threshold voltage of the conventional transistor can be controlled by a potential applied to the conductor 310a. In addition, by the potential applied to the conductor 310a, electrons are injected to the electron trap layer 303 and thus the threshold voltage of the transistor can be controlled. Specifically, the conductor 404 is fixed to an earth potential and a potential is applied to the conductor 310a, so that electrons are injected to the electron trap layer 303. At this time, a potential difference is generated between the conductor 404 and the conductor 310a. The potential applied to the conductor 310a ranges from +30 V to +50 V or from −50 V to −30 V.

The distance 405h1 of the transistor of one embodiment of the present invention in FIG. 9A is larger than the distance 405h2 of the conventional transistor in FIG. 9B because of the insulator 403. This makes the transistor of one embodiment of the present invention preferable because the electric field generated by the potential difference between the conductor 404 and the conductor 310a is weakened and a breakdown of an element due to the electric field can be prevented.

FIGS. 10A to 10E show the insulator 403 which is different in thickness and shape from that in FIG. 9A.

Figure 10A:
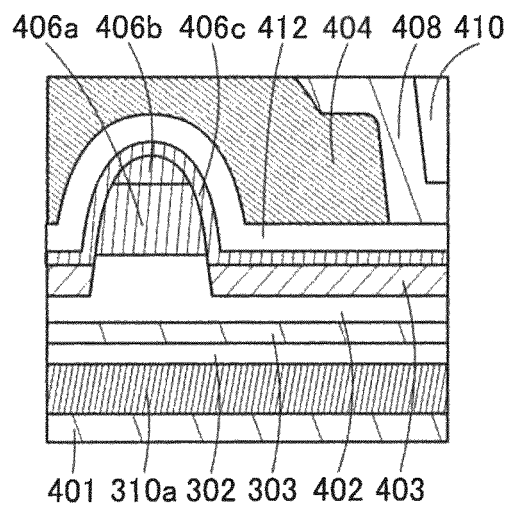
FIGS. 10A to 10E are cross-sectional views each illustrating part of a transistor of one embodiment of the present invention.
Figure 10B:
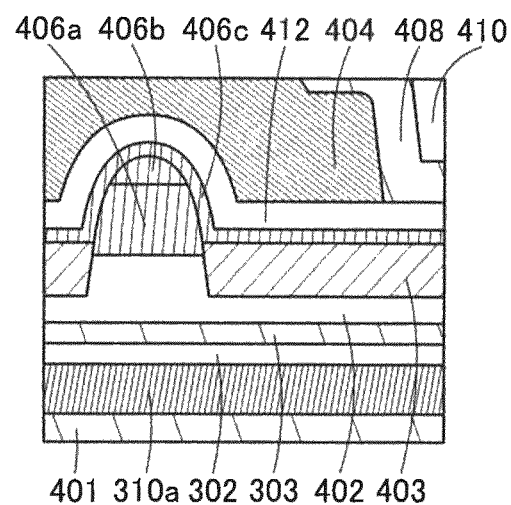
Figure 10C:
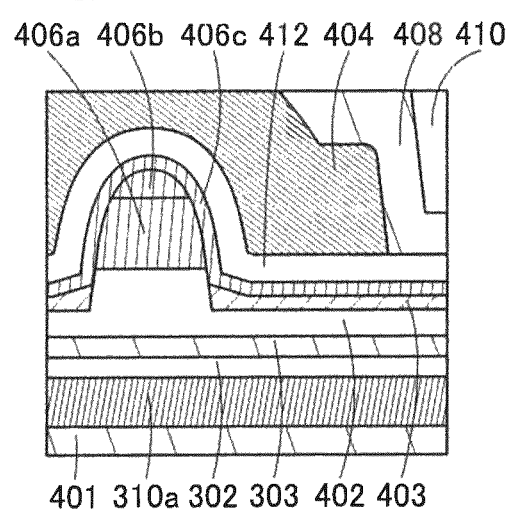
Figure 10D:
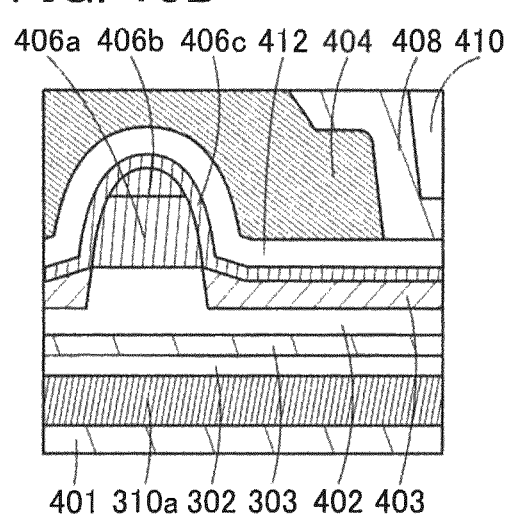
Figure 10E:
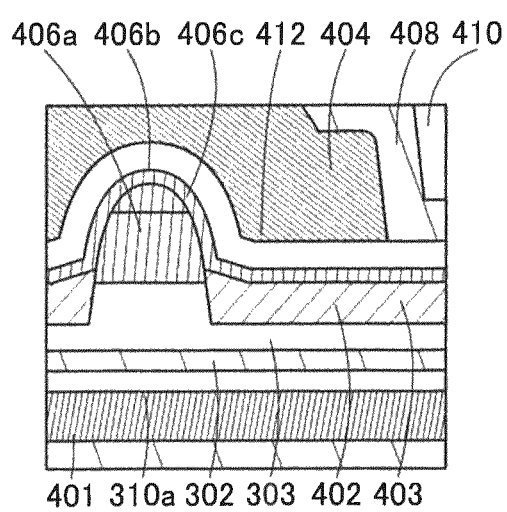

As illustrated in FIG. 10A, the insulator 403 may be thinner than the insulator 403 in FIG. 9A. Alternatively, as illustrated in FIG. 10B, the insulator 403 may be thicker than the insulator 403 in FIG. 9A and may include regions in contact with side surfaces of the insulator 406a. Further alternatively, as illustrated in FIG. 10C, the insulator 403 does not necessarily have a flat top surface and may be thinner than the insulator 403 in FIG. 9A. Still further alternatively, as illustrated in FIG. 10D, the insulator 403 does not necessarily have a flat top surface or, as illustrated in FIG. 10E, the insulator 403 does not necessarily have a flat top surface and may include regions in contact with side surfaces of the insulator 406a.

The first gate electrode and the second gate electrode electrically connected to each other can increase the on-state current. Note that the function of the first gate electrode and that of the second gate electrode may be interchanged.

Figure 11A:
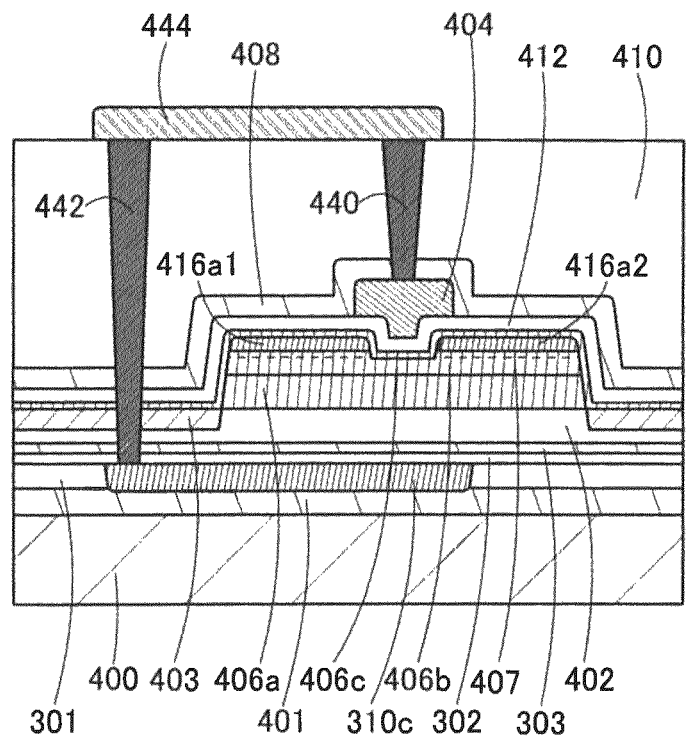
FIGS. 11A and 11B are cross-sectional views each illustrating a transistor of one embodiment of the present invention.

FIG. 11A illustrates an example in which the first gate electrode and the second gate electrode are electrically connected to each other. In an opening reaching the conductor 404 through the insulators 410 and 408, a conductor 440 is embedded, and a top surface of the conductor 440 is electrically connected to a conductor 444 formed over the insulator 410. In an opening reaching a conductor 310c through the insulators 410, 408, 412, 406c, 403, and 402, the electron trap layer 303, and the insulator 302, a conductor 442 is embedded, and a top surface of the conductor 442 is electrically connected to the conductor 444. That is, the conductor 404 functioning as the first gate electrode is electrically connected to the conductor 310c functioning as the second gate electrode through the conductors 440, 444, and 442.

Note that the transistor is surrounded by an insulator which has a function of blocking oxygen and impurities such as hydrogen, whereby stable electrical characteristics can be obtained. For example, as the insulator 408, an insulator which has a function of blocking oxygen and impurities such as hydrogen may be used.

An insulator which has a function of blocking oxygen and impurities such as hydrogen may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Furthermore, for example, the insulator 408 may be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride. Note that the insulator 408 preferably contains aluminum oxide. For example, when the insulator 408 is formed using plasma including oxygen, oxygen can be added to the insulator 412 serving as a base layer of the insulator 408. The added oxygen becomes excess oxygen in the insulator 412. When the insulator 408 contains aluminum oxide, entry of impurities such as hydrogen into the semiconductor 406b can be inhibited. Furthermore, when the insulator 408 contains aluminum oxide, for example, outward diffusion of excess oxygen added to the insulator 412 described above can be reduced.

The insulator 401 may be formed using, for example, aluminum oxide, magnesium oxide, silicon nitride oxide, silicon nitride, gallium oxide, germanium oxide, yttrium oxide, zirconium oxide, lanthanum oxide, neodymium oxide, hafnium oxide, or tantalum oxide.

Note that the insulator 401 preferably includes aluminum oxide or silicon nitride. For example, when the insulator 401 includes aluminum oxide or silicon nitride, entry of impurities such as hydrogen into the semiconductor 406b can be inhibited. Furthermore, when the insulator 401 includes aluminum oxide or silicon nitride, for example, outward diffusion of oxygen can be reduced.

The insulator 403 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 403 preferably includes fluorine-containing silicon oxide or fluorine-containing silicon oxynitride.

The insulator 301 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 301 preferably includes silicon oxide or silicon oxynitride.

The electron trap layer 303 may be formed to have, for example, a single-layer structure or a stacked-layer structure including an insulator or a metal oxide film containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the electron trap layer 303 preferably contains silicon nitride, hafnium oxide, or aluminum oxide.

The insulators 302 and 402 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 402 preferably contains silicon oxide or silicon oxynitride.

Note that the insulator 410 preferably includes an insulator with a low dielectric constant. For example, the insulator 410 preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator 410 preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low dielectric constant. Examples of the resin include polyester, polyolefin, polyamide (e.g., nylon or aramid), polyimide, polycarbonate, and acrylic.

The insulator 412 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 412 preferably includes silicon oxide or silicon oxynitride.

Note that the insulator 412 preferably contains an insulator with a high dielectric constant. For example, the insulator 412 preferably includes gallium oxide, hafnium oxide, an oxide including aluminum and hafnium, an oxynitride including aluminum and hafnium, an oxide including silicon and hafnium, an oxynitride including silicon and hafnium, or the like. The insulator 412 preferably has a stacked-layer structure including silicon oxide or silicon oxynitride and an insulator with a high dielectric constant. Because silicon oxide and silicon oxynitride are thermally stable, combination of silicon oxide or silicon oxynitride with an insulator with a high dielectric constant allows the stacked-layer structure to be thermally stable and have a high dielectric constant. For example, when aluminum oxide, gallium oxide, or hafnium oxide of the insulator 412 is on the insulator 406c side, entry of silicon included in the silicon oxide or the silicon oxynitride into the semiconductor 406b can be inhibited. When silicon oxide or silicon oxynitride is on the insulator 406c side, for example, trap centers might be formed at the interface between aluminum oxide, gallium oxide, or hafnium oxide and silicon oxide or silicon oxynitride. In some cases, the trap centers can shift the threshold voltage of the transistor in the positive direction by trapping electrons.

Each of the conductors 416a1 and 416a2 may be formed to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, platinum, silver, indium, tin, tantalum, and tungsten. Alternatively, a film of an alloy or a compound containing the above element may be used: a conductor containing aluminum, a conductor containing copper and titanium, a conductor containing copper and manganese, a conductor containing indium, tin, and oxygen, a conductor containing titanium and nitrogen, or the like may be used.

Each of the conductors 310a, 310b, 310c, 404, 429, 430, 431, 432, 433, 434, 437, 438, 440, 442, and 444 may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. Alternatively, a film of an alloy or a compound containing the above element may be used: a conductor containing aluminum, a conductor containing copper and titanium, a conductor containing copper and manganese, a conductor containing indium, tin, and oxygen, a conductor containing titanium and nitrogen, or the like may be used.

As the semiconductor 406b, an oxide semiconductor is preferably used. However, silicon (including strained silicon), germanium, silicon germanium, silicon carbide, gallium arsenide, aluminum gallium arsenide, indium phosphide, gallium nitride, an organic semiconductor, or the like can be used in some cases.

The insulator 406a and the insulator 406c are preferably oxides including one or more, or two or more elements other than oxygen included in the semiconductor 406b. However, silicon (including strained silicon), germanium, silicon germanium, silicon carbide, gallium arsenide, aluminum gallium arsenide, indium phosphide, gallium nitride, an organic semiconductor, or the like can be used in some cases.

<Transistor Structure 2>

A transistor having a structure different from that in FIGS. 1A to 1C will be described with reference to FIGS. 2A to 2C. FIGS. 2A to 2C are a top view and cross-sectional views of a semiconductor device of one embodiment of the present invention. FIG. 2A is the top view, and FIGS. 2B and 2C are the cross-sectional views taken along dashed-dotted lines A1-A2 and A3-A4 in FIG. 2A, respectively. Note that for simplification of the drawing, some components are not illustrated in the top view in FIG. 2A.

As illustrated in FIGS. 2A to 2C, the transistor has a structure different from that in FIGS. 1A to 1C in that the conductor 404 functioning as the first gate electrode does not have a region overlapping with the conductors 416a1 and 416a2 functioning as the source and drain electrodes.

Since the conductor 404 functioning as the first gate electrode does not have the region overlapping with the conductor 416a1 or 416a2 functioning as the source or drain electrode, parasitic capacitance is not generated between the conductor 404 functioning as the first gate electrode and the conductor 416a1 or the 416a1 functioning as the source or drain electrode, which is favorable for high-speed operation of the transistor. In addition, this structure can prevent leakage current between the conductor 404 functioning as the first gate electrode and the conductor 416a1 or 416a2 functioning as the source or drain electrode. For the other components, refer to the above description.

<Transistor Structure 3>

A transistor having a structure different from that in FIGS. 2A to 2C will be described with reference to FIGS. 3A to 3C. FIGS. 3A to 3C are a top view and cross-sectional views of a semiconductor device of one embodiment of the present invention. FIG. 3A is the top view, and FIGS. 3B and 3C are the cross-sectional views taken along dashed-dotted lines A1-A2 and A3-A4 in FIG. 3A, respectively. Note that for simplification of the drawing, some components are not illustrated in the top view in FIG. 3A.

As illustrated in FIGS. 3A to 3C, the transistor has a structure different from that in FIGS. 2A to 2C in that it does not include the conductors 416a1 and the 416a2 functioning as the source and drain electrodes, and includes: regions 407a1 and 407a2 functioning as source and drain region; an opening reaching the insulator 406a through the insulators 410 and 408, the region 407a1, and the semiconductor 406b; and an opening reaching the insulator 406a through the insulators 410 and 408, the region 407a2, and the semiconductor 406b.

The regions 407a1 and 407a2 serve as source and drain regions of the transistor. The regions 407a1 and 407a2 are formed by adding a rare gas element (e.g., Ar, Xe, Kr, Ne, or He) to the semiconductor 406b with an ion implantation apparatus, an ion doping apparatus, a plasma doping apparatus, a plasma treatment apparatus, or the like. Alternatively, the regions 407a1 and 407a2 can be formed also by adding hydrogen, nitrogen, boron, phosphorus, arsenic, tungsten, aluminum, or the like. For the other components, refer to the above description.

<Transistor Structure 4>

A transistor having a structure different from that in FIGS. 1A to 1C will be described with reference to FIGS. 4A to 4C. FIGS. 4A to 4C are a top view and cross-sectional views of a semiconductor device of one embodiment of the present invention. FIG. 4A is the top view, and FIGS. 4B and 4C are the cross-sectional views taken along dashed-dotted lines A1-A2 and A3-A4 in FIG. 4A, respectively. Note that for simplification of the drawing, some components are not illustrated in the top view in FIG. 4A.

In FIGS. 4B and 4C, the transistor includes the insulator 401 over the substrate 400; the insulator 301 and the conductors 310a and 310b over the insulator 401; the insulator 302 over the insulator 301 and conductors 310a and 310b; the electron trap layer 303 over the insulator 302; the insulator 402 over the electron trap layer 303; the insulators 403 and 406a over the insulator 402; the semiconductor 406b over the insulator 406a; the conductors 416a1 and 416a2 each having the region in contact with the top surface of the semiconductor 406b; the insulator 410 in contact with the top surfaces of the conductors 416a1 and 416a2; the insulator 406c in contact with the top surface of the semiconductor 406b; the insulator 412 over the insulator 406c; and the conductor 404 over the semiconductor 406b with the insulators 412 and 406c positioned therebetween.

The following components are provided over the transistor: an insulator 418, the insulator 408 over the insulator 418; an insulator 428 over the insulator 408; an opening reaching the conductor 310b through the insulators 428, 408, 418, 410, 403, and 402, the electron trap layer 303, and the insulator 302; an opening reaching the conductor 416a1 through the insulators 428, 408, 418, and 410; an opening reaching the conductor 416a2 through the insulators 428, 408, 418, and 410; an opening reaching the conductor 404 through the insulators 428, 408, and 418; the conductors 433, 431, 429, and 437 that are embedded in the respective openings; the conductor 434 over the insulator 428, which includes a region in contact with the conductor 433; the conductor 432 over the insulator 428, which includes a region in contact with the conductor 431; the conductor 430 over the insulator 428, which includes a region in contact with the conductor 429; and the conductor 438 over the insulator 428, which includes a region in contact with the conductor 437.

Note that the semiconductor 406b includes the region 407 in which the top surface of the semiconductor 406b is in contact with the conductors 416a1 and 416a2.

In the transistor, the conductor 404 functions as a first gate electrode. Furthermore, the conductor 404 can have a stacked-layer structure including a conductor that hardly allows oxygen to pass therethrough. For example, when the conductor that hardly allows oxygen to pass therethrough is formed as a lower layer, an increase in the electric resistance value due to oxidation of the conductor 404 can be prevented. The insulator 412 functions as a first gate insulating film.

The conductors 416a1 and 416a2 function as source and drain electrodes of the transistor. The conductors 416a1 and 416a2 each can have a stacked-layer structure including a conductor that hardly allows oxygen to pass therethrough. For example, when the conductor that hardly allows oxygen to pass therethrough is formed as an upper layer, an increase in the electric resistance value due to oxidation of the conductors 416a1 and 416a2 can be prevented.

The resistance of the semiconductor 406b can be controlled by a potential applied to the conductor 404. That is, conduction or non-conduction between the conductor 416a1 and the conductor 416a2 can be controlled by the potential applied to the conductor 404.

In the transistor, the region functioning as a gate electrode is formed in a self-aligned manner so as to fill an opening formed in the insulator 410 and the like. Such a transistor can be also referred to as a trench-gate-self-aligned s-channel FET (TGSA s-channel FET).

In FIG. 4B, the length of the region of the bottom surface of the conductor 404 functioning as a first gate electrode facing the top surface of the semiconductor 406b with the insulators 412 and 406c positioned therebetween is defined as a gate line width. The gate line width can be smaller than the width of the opening reaching the semiconductor 406b in the insulator 410. That is, the gate line width can be smaller than the minimum feature size. Specifically, the gate line width can be greater than or equal to 5 nm and less than or equal to 60 nm, preferably greater than or equal to 5 nm and less than or equal to 30 nm.

When an electric field from the gate electrode is blocked by other conductors, switching characteristics of the transistor may be degraded. In the transistor, the positional relationship between the conductor 404 and the conductors 416a1 and 416a2 is changed by the thicknesses of the insulators 406c and 412. That is, the relationship between the thicknesses of the conductors 416a1 and 416a2 functioning as the source and drain electrode and the thickness of the insulator 412 functioning as the first gate insulating film affects electrical characteristics of the transistor.

When the thickness of the insulator 412 in a region between the conductor 416a1 and the conductor 416a2 is smaller than that of the conductor 416a1 or 416a2 in FIG. 4B, an electric field from the gate electrode is applied to the entire channel formation region, making the operation of the transistor favorable. The thickness of the insulator 412 in the region between the conductor 416a1 and the conductor 416a2 is less than or equal to 30 nm, preferably less than or equal to 10 nm.

The transistor can have a structure in which the conductor 416a1 or 416a2 has a small thickness. An end portion of the conductor 416a1 has a region facing the conductor 404 with the insulators 406c and 412 positioned therebetween; furthermore, an end portion of the conductor 416a2 has a region facing the conductor 404 with the insulators 406c and 412 positioned therebetween; however, the area of these regions can be small. Thus, parasitic capacitance of these regions in the transistor is reduced.

The conductor 310a functions as a second gate electrode. The conductor 310a can be the multilayer film including a conductive film that hardly allows oxygen to pass therethrough. The use of the multilayer film including a conductive film that hardly allows oxygen to pass therethrough can prevent a decrease in conductivity due to oxidation of the conductor 310a. The insulator 302, the electron trap layer 303, and the insulator 402 function as a second gate insulating film. The threshold voltage of the transistor can be controlled by a potential applied to the conductor 310a. Furthermore, by the potential applied to the conductor 310a, electrons are injected to the electron trap layer 303 and thus the threshold voltage of the transistor can be controlled. The first gate electrode and the second gate electrode are electrically connected to each other, whereby a high on-state current can be obtained. Note that the functions of the first gate electrode and the second gate electrode may be replaced with each other.

Figure 11B:
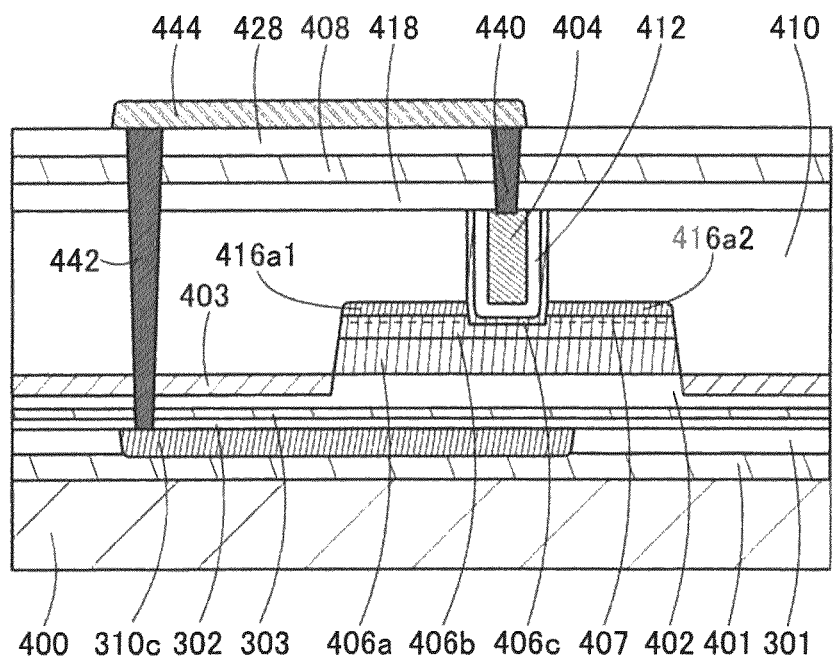

FIG. 11B illustrates an example in which the first gate electrode and the second gate electrode are electrically connected to each other. In an opening reaching the conductor 404 through the insulators 428, 408, and 418, the conductor 440 is embedded, and the top surface of the conductor 440 is electrically connected to the conductor 444 formed over the insulator 428. In an opening reaching the conductor 310c through the insulators 428, 408, 418, 410, 403, and 402, the electron trap layer 303, and the insulator 302, the conductor 442 is embedded, and the top surface of the conductor 442 is electrically connected to the conductor 444. That is, the conductor 404 functioning as the first gate electrode is electrically connected to the conductor 310c functioning as the second gate electrode through the conductors 440, 444, and 442.

The insulators 418 and 428 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 301 preferably contains silicon oxide or silicon oxynitride. For the other components, refer to the above description.

In Embodiment 1, one embodiment of the present invention has been described. Other embodiments of the present invention are described in Embodiments 2 to 14. Note that one embodiment of the present invention is not limited to the above examples. That is, since various embodiments of the present invention are disclosed in Embodiment 1 and Embodiments 2 to 14, one embodiment of the present invention is not limited to a specific embodiment. For example, an example in which a channel formation region of a transistor includes an oxide semiconductor, an example in which a transistor includes an oxide semiconductor, and the like are described as one embodiment of the present invention; however, one embodiment of the present invention is not limited to these examples. Depending on circumstances or conditions, various transistors of embodiments of the present invention may include various semiconductors. Depending on circumstances or conditions, transistors of embodiments of the present invention may include, for example, at least one of silicon, germanium, silicon germanium, silicon carbide, gallium arsenide, aluminum gallium arsenide, indium phosphide, gallium nitride, and an organic semiconductor. Alternatively, depending on circumstances or conditions, various transistors of embodiments of the present invention do not necessarily include an oxide semiconductor, for example.

<Transistor Structure 5>

Figure 5A:
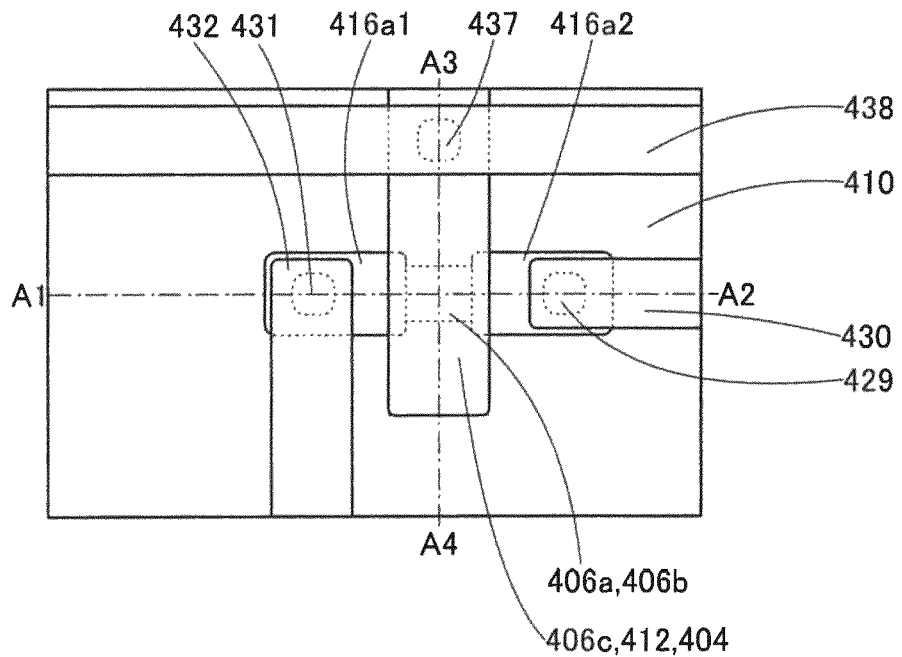
FIGS. 5A to 5C are a top view and cross-sectional views of a transistor of one embodiment of the present invention.
Figure 5B:
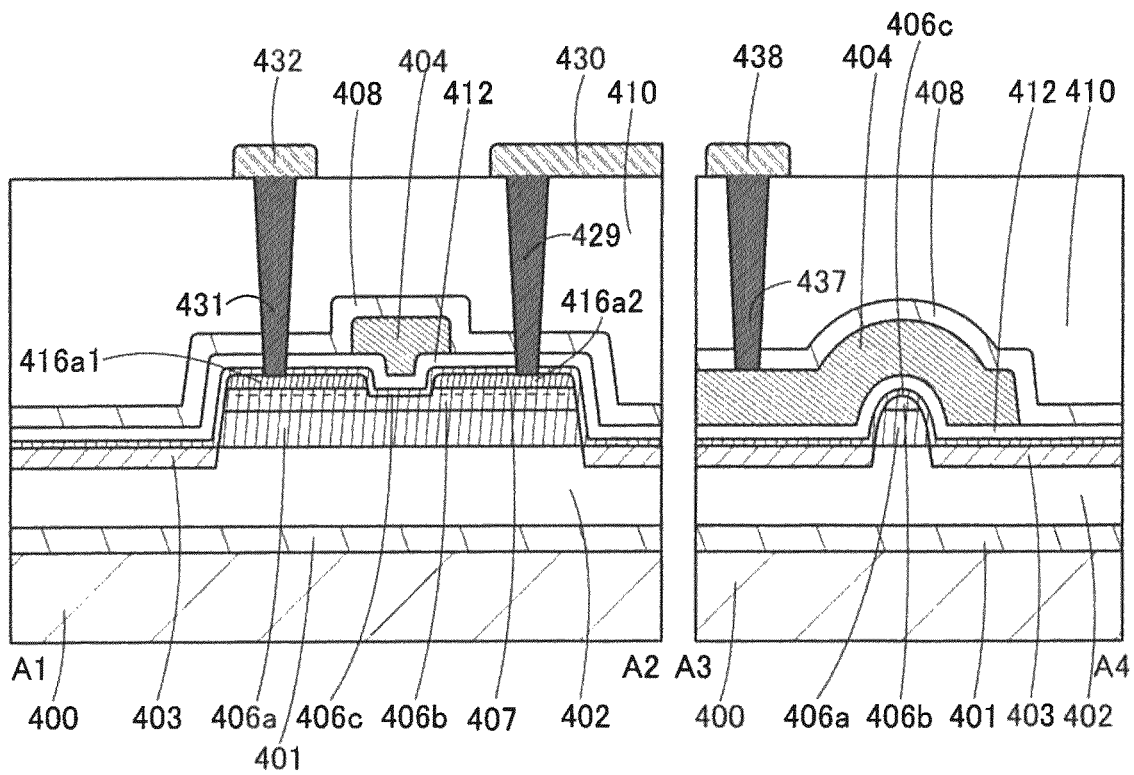
Figure 5C:
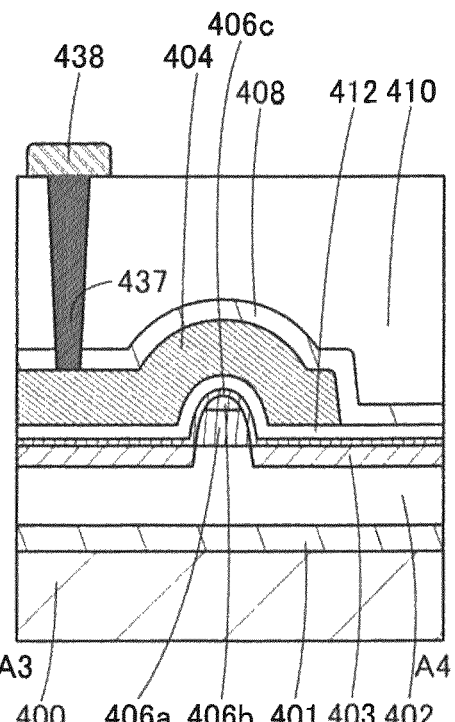

A transistor having a structure different from that in FIGS. 1A to 1C will be described with reference to FIGS. 5A to 5C. FIGS. 5A to 5C are a top view and cross-sectional views of a semiconductor device of one embodiment of the present invention. FIG. 5A is the top view, and FIGS. 5B and 5C are the cross-sectional views taken along dashed-dotted lines A1-A2 and A3-A4 in FIG. 5A, respectively. Note that for simplification of the drawing, some components are not illustrated in the top view in FIG. 5A.

The transistor in FIGS. 5B and 5C is different from the transistor in FIGS. 1A to 1C in that the following components are not provided: the insulator 301 and the conductors 310a and 310b over the insulator 401, the insulator 302 over the insulator 301 and the conductors 310a and 310b, and the electron trap layer 303 over the insulator 302. That is, the structure without the second gate electrode may also be employed.

<Transistor Structure 6>

A transistor having a structure different from that in FIGS. 2A to 2C will be described with reference to FIGS. 6A to 6C. FIGS. 6A to 6C are a top view and cross-sectional views of a semiconductor device of one embodiment of the present invention. FIG. 6A is the top view, and FIGS. 6B and 6C are the cross-sectional views taken along dashed-dotted lines A1-A2 and A3-A4 in FIG. 3A, respectively. Note that for simplification of the drawing, some components are not illustrated in the top view in FIG. 6A.

The transistor in FIGS. 6B and 6C is different from the transistor in FIGS. 2A to 2C in that the following components are not provided: the insulator 301 and the conductors 310a and 310b over the insulator 401, the insulator 302 over the insulator 301 and the conductors 310a and 310b, and the electron trap layer 303 over the insulator 302. That is, the structure without the second gate electrode may also be employed.

<Transistor Structure 7>

A transistor having a structure different from that in FIGS. 3A to 3C will be described with reference to FIGS. 7A to 7C. FIGS. 7A to 7C are a top view and cross-sectional views of a semiconductor device of one embodiment of the present invention. FIG. 7A is the top view, and FIGS. 7B and 7C are the cross-sectional views taken along dashed-dotted lines A1-A2 and A3-A4 in FIG. 4A, respectively. Note that for simplification of the drawing, some components are not illustrated in the top view in FIG. 7A.

The transistor in FIGS. 7B and 7C is different from the transistor in FIGS. 3A to 3C in that the following components are not provided: the insulator 301 and the conductors 310a and 310b over the insulator 401, the insulator 302 over the insulator 301 and the conductors 310a and 310b, and the electron trap layer 303 over the insulator 302. That is, the structure without the second gate electrode may also be employed.

<Transistor Structure 8>

Figure 8A:
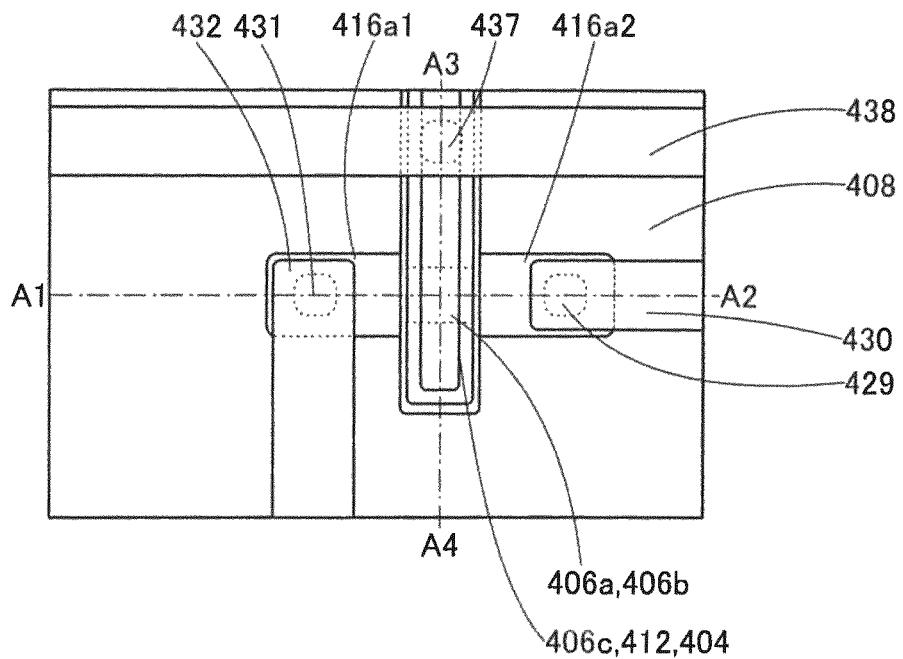
FIGS. 8A to 8C are a top view and cross-sectional views of a transistor of one embodiment of the present invention.
Figure 8B:
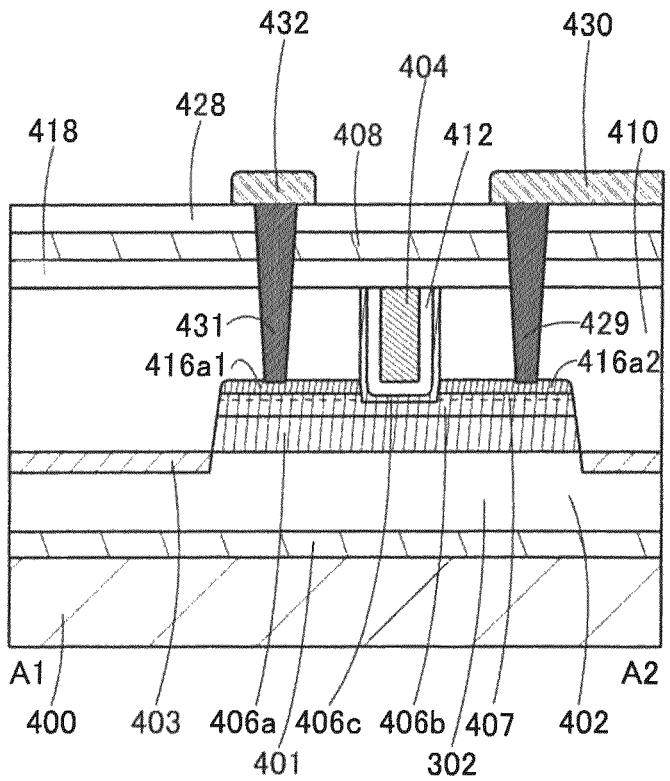
Figure 8C:
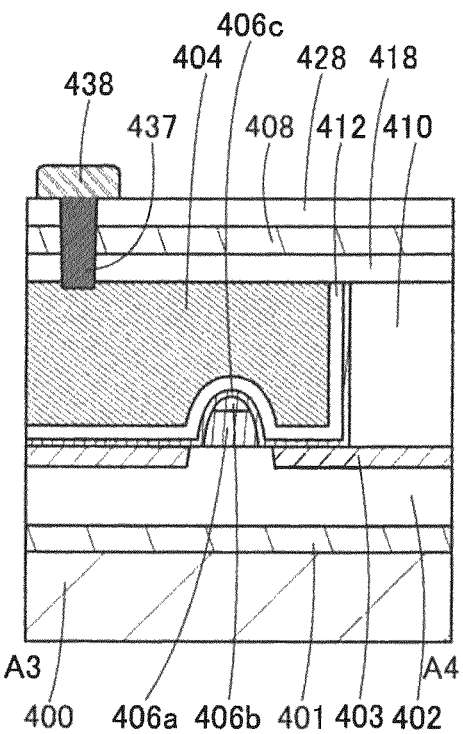

A transistor having a structure different from that in FIGS. 4A to 4C will be described with reference to FIGS. 8A to 8C. FIGS. 8A to 8C are a top view and cross-sectional views of a semiconductor device of one embodiment of the present invention. FIG. 8A is the top view, and FIGS. 8B and 8C are the cross-sectional views taken along dashed-dotted lines A1-A2 and A3-A4 in FIG. 8A, respectively. Note that for simplification of the drawing, some components are not illustrated in the top view in FIG. 8A.

The transistor in FIGS. 8B and 8C is different from the transistor in FIGS. 4A to 4C in that the following components are not provided: the insulator 301 and the conductors 310a and 310b over the insulator 401, the insulator 302 over the insulator 301 and the conductors 310a and 310b; and the electron trap layer 303 over the insulator 302. That is, the structure without the second gate electrode may also be employed.

At least part of this embodiment can be implemented in combination with any of the other embodiments described in this specification as appropriate.

Embodiment 2

<Structure of Oxide Semiconductor>

A structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 12A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (ϕ scan) is performed with 2θ fixed at around 56° and with the sample rotated using a normal vector to the sample surface as an axis (ϕ axis), as shown in FIG. 12B, a peak is not clearly observed. In contrast, in the case where single crystal InGaZnO$_4$ is subjected to ϕ scan with 2θ fixed at around 56°, as shown in FIG. 12C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 12D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 12E shows a diffraction pattern obtained in such a manner that an electron beam with a probe diameter of 300 nm is incident on the same sample in a direction perpendicular to the sample surface. As shown in FIG. 12E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 12E is considered to be derived from the (010) plane, the (100) plane, and the like of the InGaZnO$_4$ crystal. The second ring in FIG. 12E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 13A:
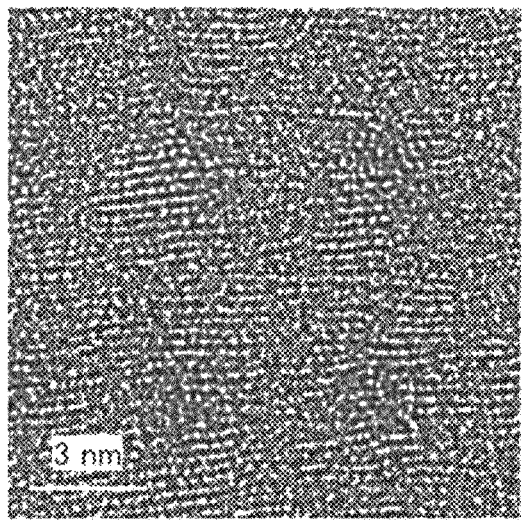
FIGS. 13A to 13E show a cross-sectional TEM image and plan-view TEM images of a CAAC-OS and images obtained through analysis thereof.

FIG. 13A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 13A shows pellets in which metal atoms are arranged in a layered manner. FIG. 13A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 13B:
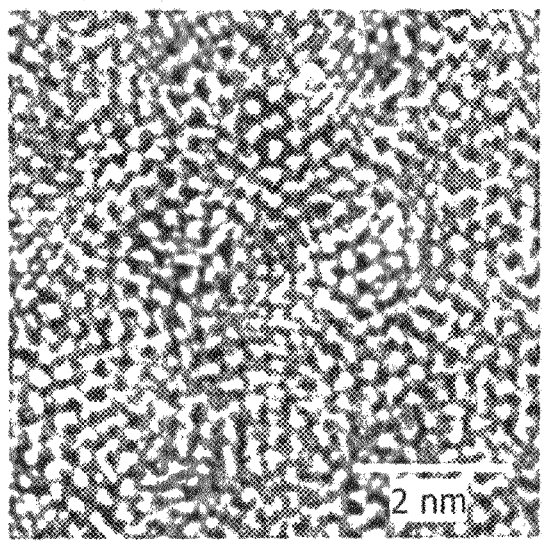
Figure 13C:
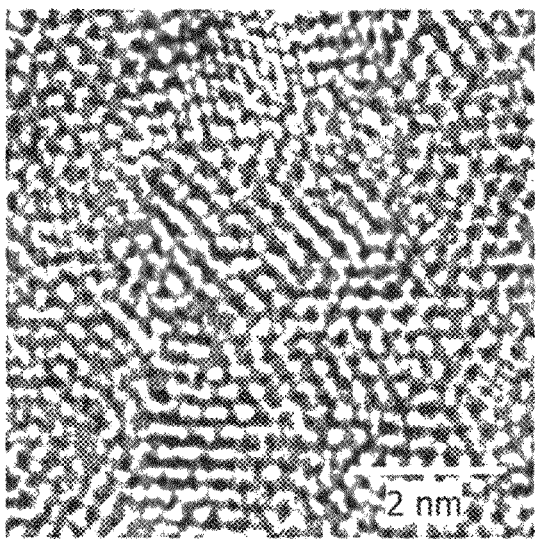
Figure 13D:
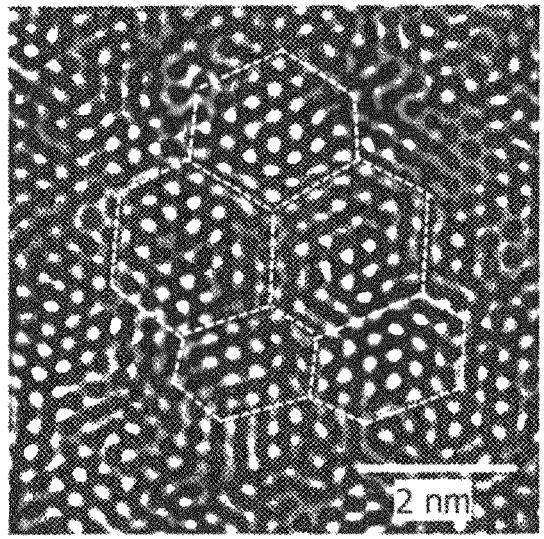
Figure 13E:
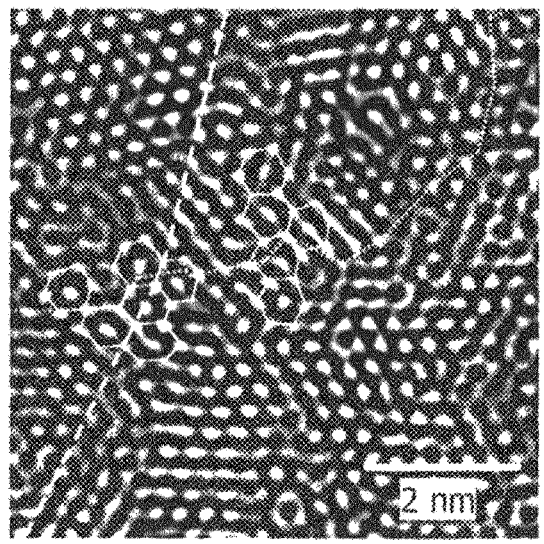

FIGS. 13B and 13C show Cs-corrected high-resolution TEM images of a plane of the CAAC-OS observed from a direction substantially perpendicular to the sample surface. FIGS. 13D and 13E are images obtained through image processing of FIGS. 13B and 13C. The method of image processing is as follows. The image in FIG. 13B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 13D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 13E, a dotted line denotes a portion between a region where a lattice arrangement is well aligned and another region where a lattice arrangement is well aligned, and dashed lines denote the directions of the lattice arrangements. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, an oxygen vacancy in the oxide semiconductor might serve as a carrier trap or serve as a carrier generation source when hydrogen is captured therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, and further preferably lower than $1\times10^{10}/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 14A:
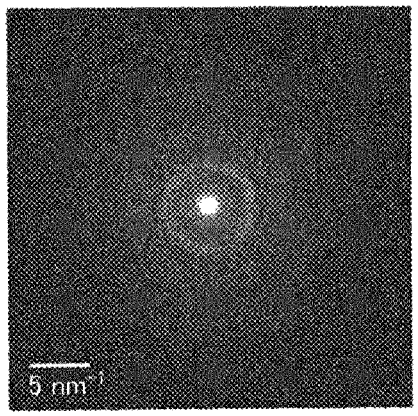
FIGS. 14A to 14D show electron diffraction patterns and a cross-sectional TEM image of an nc-OS.
Figure 14B:
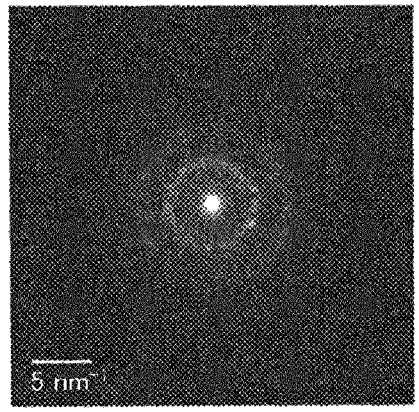

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 14A is observed. FIG. 14B shows a diffraction pattern obtained when an electron beam with a probe diameter of 1 nm is incident on the same sample. As shown in FIG. 14B, a plurality of spots are observed in a ring-like region. In other words, ordering in an nc-OS is not observed with an electron beam with a probe diameter of 50 nm but is observed with an electron beam with a probe diameter of 1 nm.

Figure 14C:
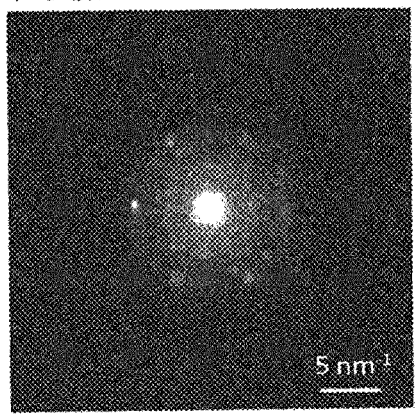

Furthermore, an electron diffraction pattern in which spots are arranged in an approximately hexagonal shape is observed in some cases as shown in FIG. 14C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 14D:
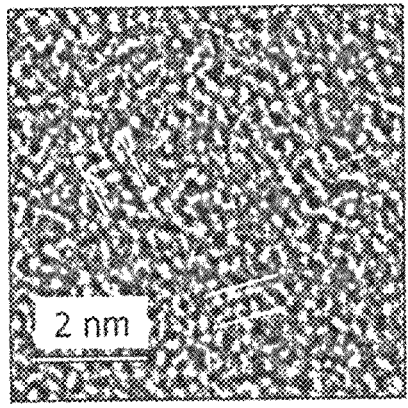

FIG. 14D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 14D, and a region in which a crystal part is not clearly observed. In most cases, the size of a crystal part included in the nc-OS is greater than or equal to 1 nm and less than or equal to 10 nm, in particular, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared to an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

Figure 15A:
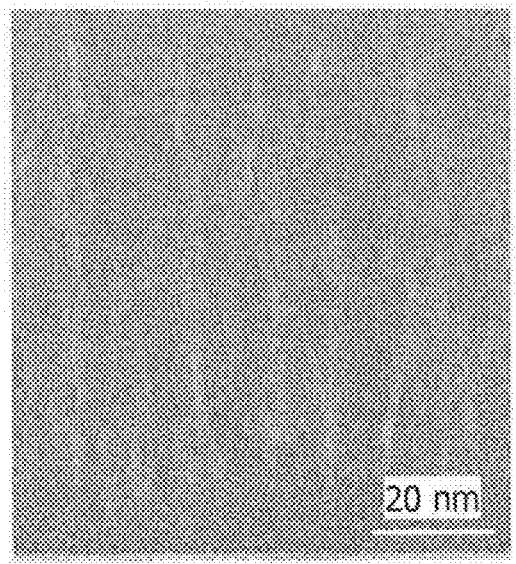
FIGS. 15A and 15B show cross-sectional TEM images of an a-like OS.
Figure 15B:
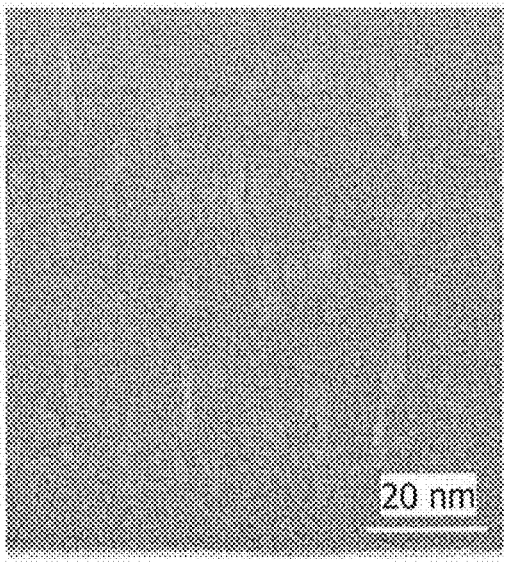

FIGS. 15A and 15B are high-resolution cross-sectional TEM images of an a-like OS. FIG. 15A is the high-resolution cross-sectional TEM image of the a-like OS at the start of the electron irradiation. FIG. 15B is the high-resolution cross-sectional TEM image of a-like OS after the electron (e) irradiation at $4.3 \times 10^8$ e$^-$/nm$^2$. FIGS. 15A and 15B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared to a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 16:
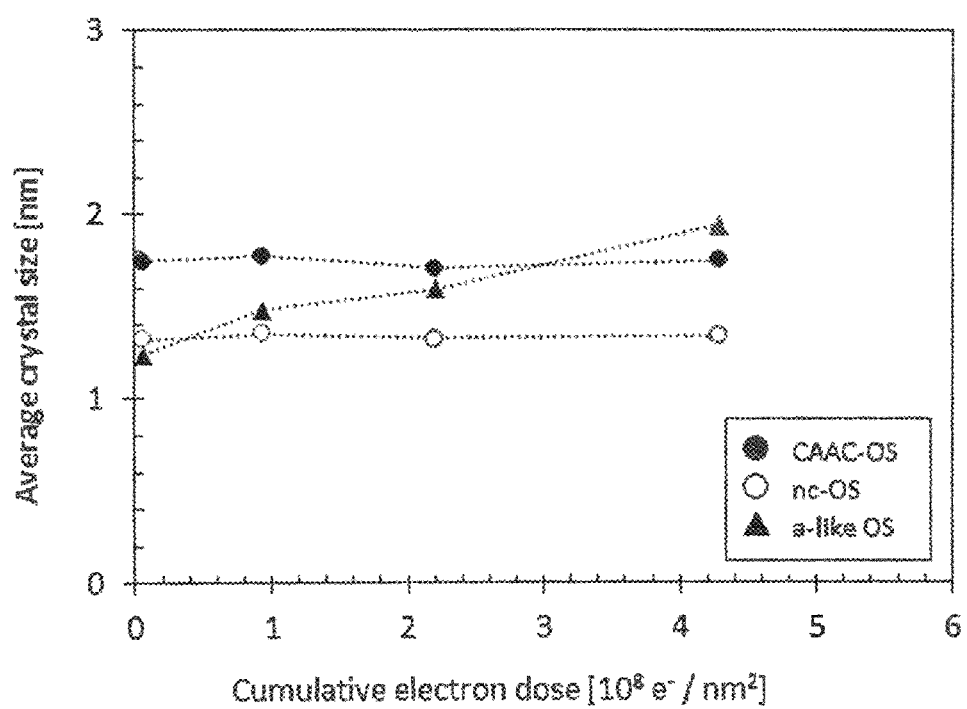
FIG. 16 shows a change in crystal part of an In—Ga—Zn oxide induced by electron irradiation.
Figure 17A:
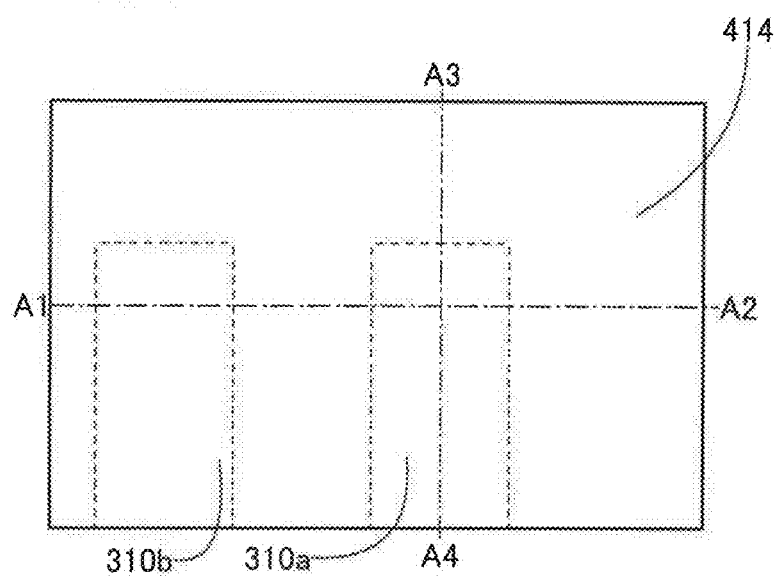
FIGS. 17A to 17C are a top view and cross-sectional views illustrating a method for manufacturing a transistor of one embodiment of the present invention.
Figure 17B:
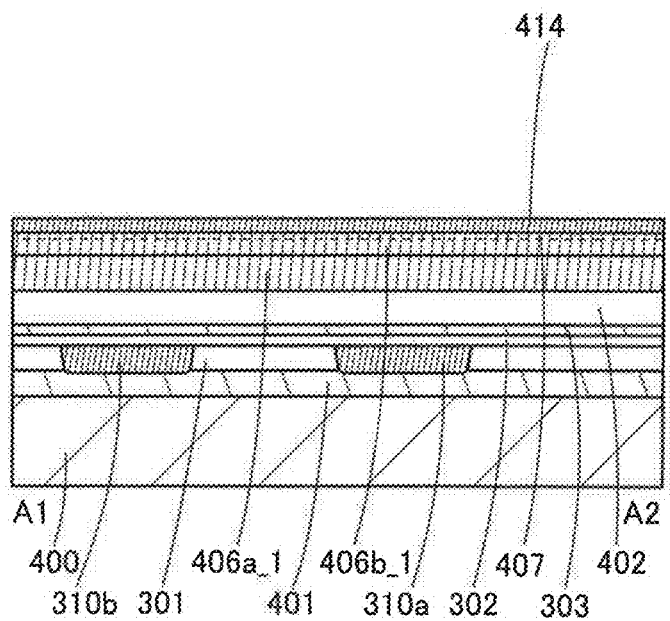
Figure 17C:
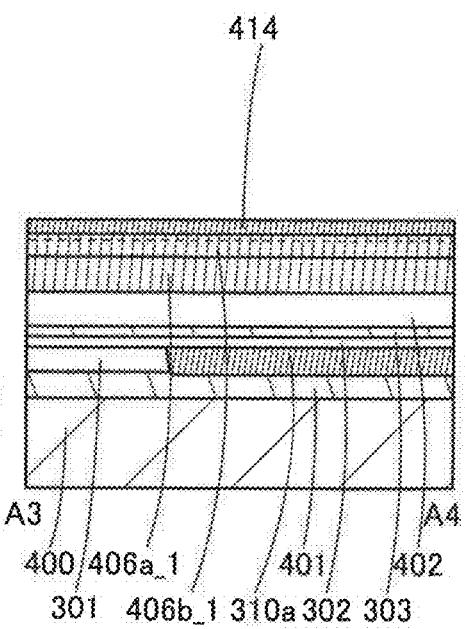

FIG. 16 shows change in the average size of crystal parts (at 22 points to 30 points) in each sample. Note that the crystal part size corresponds to the length of a lattice fringe. FIG. 16 indicates that the crystal part size in the a-like OS increases with an increase in the cumulative electron dose in obtaining TEM images, for example. As shown in FIG. 16, a crystal part of approximately 1.2 nm (also referred to as an initial nucleus) at the start of TEM observation grows to a size of approximately 1.9 nm at a cumulative electron (e$^-$) dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. As shown in FIG. 16, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ e/(nm$^2 \cdot$s); and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared to the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer film including two or more films of an amorphous oxide semiconductor, an a-like OS, an nc-OS, and a CAAC-OS, for example.

Embodiment 3

<Method 1 for Manufacturing Transistor>

A method for manufacturing the transistor in FIGS. 1A to 1C of the present invention is described below with reference to FIGS. 17A to 17C, FIGS. 18A to 18C, FIGS. 19A to 19C, FIGS. 20A to 20C, FIGS. 21A to 21C, FIGS. 22A to 22C, and FIGS. 23A to 23C.

First, the substrate 400 is prepared.

Then, the insulator 401 is formed. The insulator 401 can be formed by a sputtering method, a chemical vapor deposition (CVD) method, a molecular beam epitaxy (MBE) method, a pulsed laser deposition (PLD) method, an atomic layer deposition (ALD) method, or the like.

Note that CVD methods can be classified into a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

In the case of a PECVD method, a high quality film can be obtained at relatively low temperature. Furthermore, a TCVD method does not use plasma and thus causes less plasma damage to an object. For example, a wiring, an electrode, an element (e.g., transistor or capacitor), or the like included in a semiconductor device might be charged up by receiving electric charges from plasma. In that case, accumulated electric charges might break the wiring, electrode, element, or the like included in the semiconductor device. Such plasma damage is not caused in the case of using a TCVD method, and thus the yield of a semiconductor device can be increased. In addition, since plasma damage does not occur in the deposition by a TCVD method, a film with few defects can be obtained.

An ALD method also causes less plasma damage to an object. An ALD method does not cause plasma damage during deposition, so that a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by the CVD method or the ALD method, a film with a desired composition can be formed by adjusting the flow ratio of a source gas. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the deposition can be reduced because time taken for transfer and pressure adjustment is omitted. Thus, semiconductor devices can be manufactured with improved productivity.

Next, the insulator 301 is formed over the insulator 401. The insulator 301 can be formed by a sputtering method, a CVD method, an MBE method, a PLD method, an ALD method, or the like.

Then, a groove is formed in the insulator 301 so as to reach the insulator 401. Examples of the groove include a hole and an opening. In forming the groove, wet etching may be employed; however, dry etching is preferably employed in terms of microfabrication. The insulator 401 is preferably an insulator that functions as an etching stopper film used in forming the groove by etching the insulator 301. For example, in the case where a silicon oxide film is used as the insulator 301 in which the groove is to be formed, the insulator 401 is preferably formed using a silicon nitride film, an aluminum oxide film, or a hafnium oxide film.

After the formation of the groove, a conductor to be the conductors 310a and 310b is formed. The conductor to be the conductors 310a and 310b desirably includes a conductor that is less likely to transmit oxygen. For example, tantalum nitride, tungsten nitride, or titanium nitride can be used. Alternatively, a stacked-layer film formed using the conductor and tantalum, tungsten, titanium, molybdenum, aluminum, copper, or a molybdenum-tungsten alloy can be used. The conductor to be the conductor 310a and 310b can be formed by a sputtering method, a CVD method, an MBE method, a PLD method, an ALD method, or the like.

Next, chemical mechanical polishing (CMP) is performed to remove the conductor to be the conductors 310a and 310b that are located over the insulator 301. Consequently, the conductors 310a and 310b remain only in the groove, whereby a wiring layer with a flat top surface can be formed.

Alternatively, the conductor to be the conductors 310a and 310b may be formed over the insulator 301 and processed by a lithography method or the like to form the conductors 310a and 310b.

Next, the insulator 302 is formed over the insulator 301 and the conductors 310a and 310b. The insulator 302 can be formed by a sputtering method, a CVD method, an MBE method, a PLD method, an ALD method, or the like. The electron trap layer 303 is formed over the insulator 302. It is preferable that the electron trap layer 303 hardly allow impurities such as hydrogen and oxygen to pass therethrough. It is preferable to use, for example, a silicon nitride film, an aluminum oxide film, or a hafnium oxide film. The electron trap layer 303 can be formed by a sputtering method, a CVD method, an MBE method, a PLD method, an ALD method, or the like.

Next, the insulator 402 is formed over the electron trap layer 303. The insulator 402 can be formed by a sputtering method, a CVD method, an MBE method, a PLD method, an ALD method, or the like. Next, treatment to add oxygen to the insulator 402 may be performed. Examples of the treatment for adding oxygen to the insulator 402 include ion implantation and plasma treatment. Note that oxygen added to the insulator 402 becomes excess oxygen.

Next, an insulator 406a_1 is formed over the insulator 402. The insulator 406a_1 can be formed by a sputtering method, a CVD method, an MBE method, a PLD method, an ALD method, or the like.

Next, treatment to add oxygen to the insulator 406a_1 may be performed. Examples of the treatment for adding oxygen to the insulator 406a_1 include ion implantation and plasma treatment. Note that oxygen added to the insulator 406a_1 becomes excess oxygen. Oxygen is preferably added to a layer corresponding to the insulator 406a_1. Next, a semiconductor 406b_1 is formed over the insulator 406a_1.

Next, first heat treatment is preferably performed. The first heat treatment can be performed at a temperature higher than or equal to 250° C. and lower than or equal to 650° C., preferably higher than or equal to 450° C. and lower than or equal to 600° C., and further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, crystallinity of the semiconductor 406b_1 can be increased and impurities such as hydrogen and moisture can be removed, for example. Alternatively, in the first heat treatment, plasma treatment using oxygen may be performed under a reduced pressure. The plasma treatment containing oxygen is preferably performed using an apparatus including a power source for generating high-density plasma using microwaves, for example. Alternatively, a plasma power source for applying a radio frequency (RF) to a substrate side may be provided. The use of high-density plasma enables high-density oxygen radicals to be produced, and application of the RF to the substrate side allows oxygen radicals generated by the high-density plasma to be efficiently introduced into the semiconductor 406b_1. Alternatively, after plasma treatment using an inert gas with the apparatus, plasma treatment using oxygen in order to compensate released oxygen may be performed.

Next, a conductor 414 is formed over a semiconductor to be the semiconductor 406b_1. The conductor 414 can be formed by a sputtering method, a CVD method, an MBE method, a PLD method, an ALD method, or the like (see FIGS. 17A to 17C).

Figure 18A:
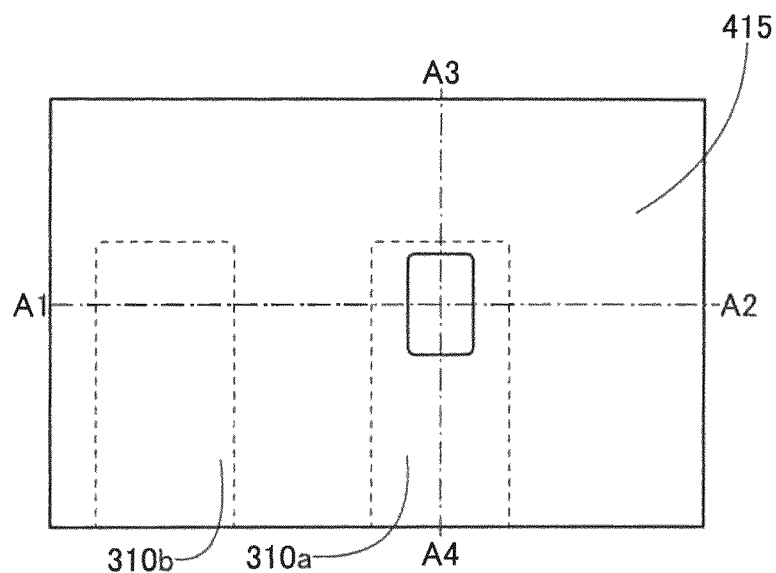
FIGS. 18A to 18C are a top view and cross-sectional views illustrating a method for manufacturing a transistor of one embodiment of the present invention.
Figure 18B:
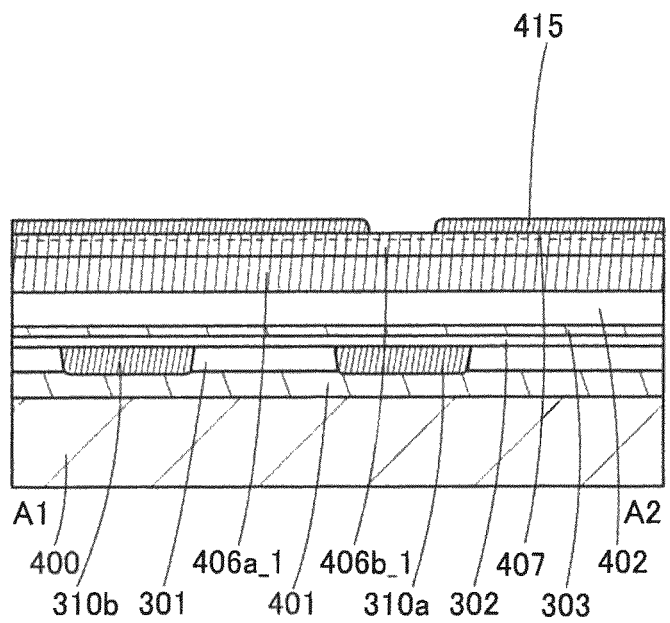
Figure 18C:
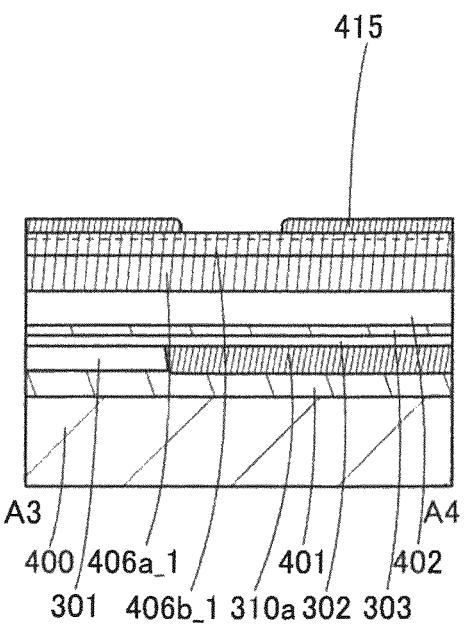
Figure 19A:
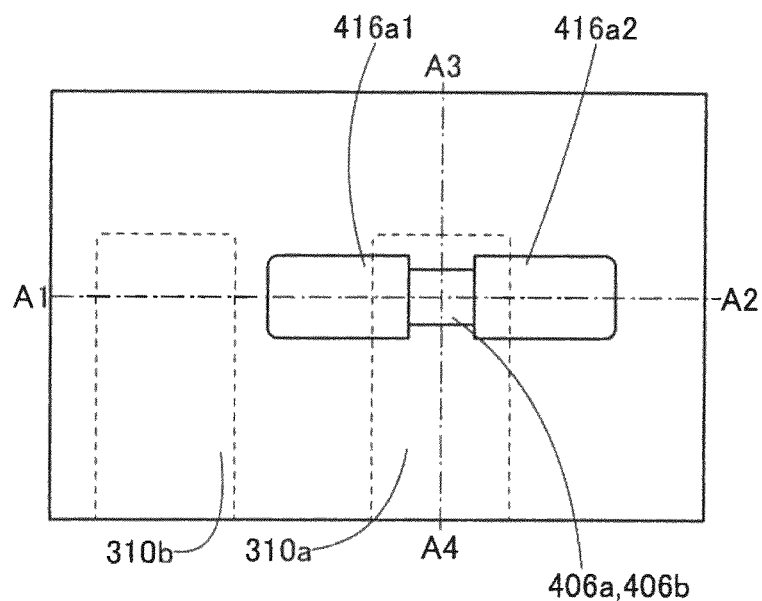
FIGS. 19A to 19C are a top view and cross-sectional views illustrating a method for manufacturing a transistor of one embodiment of the present invention.
Figure 19B:
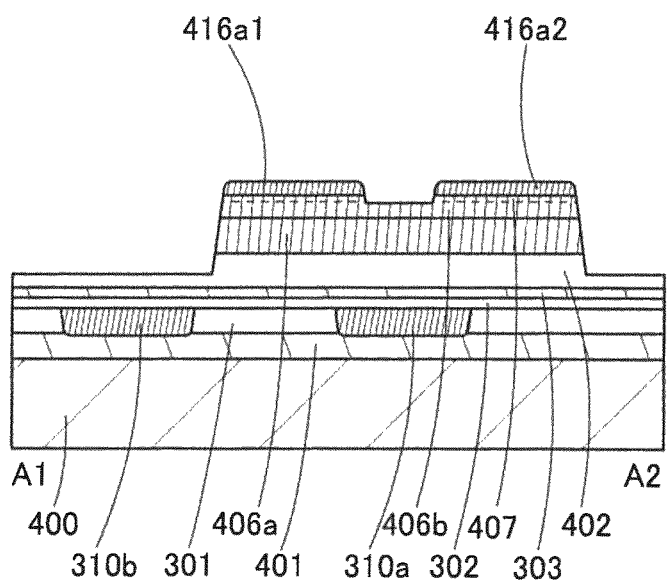
Figure 19C:
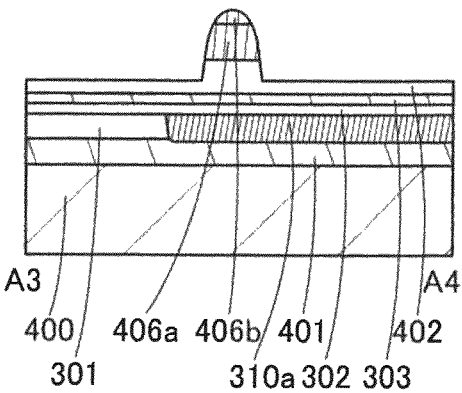
Figure 20A:
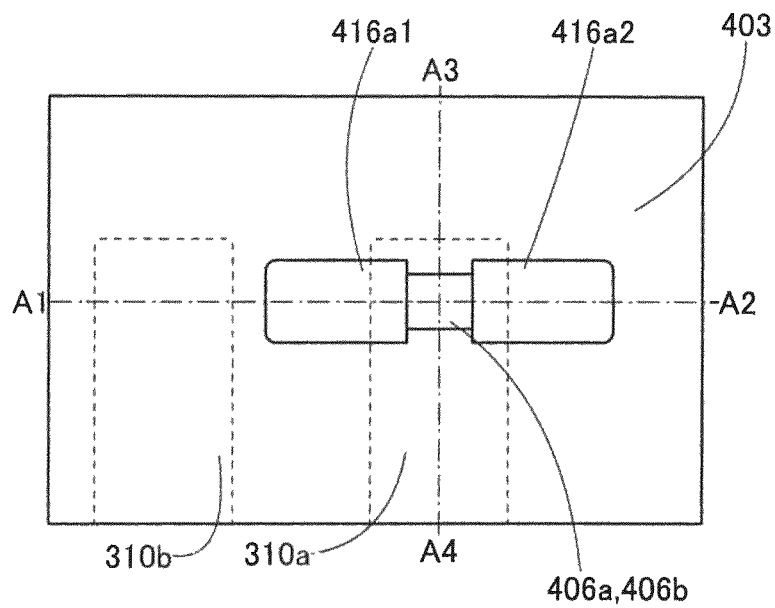
FIGS. 20A to 20C are a top view and cross-sectional views illustrating a method for manufacturing a transistor of one embodiment of the present invention.
Figure 20B:
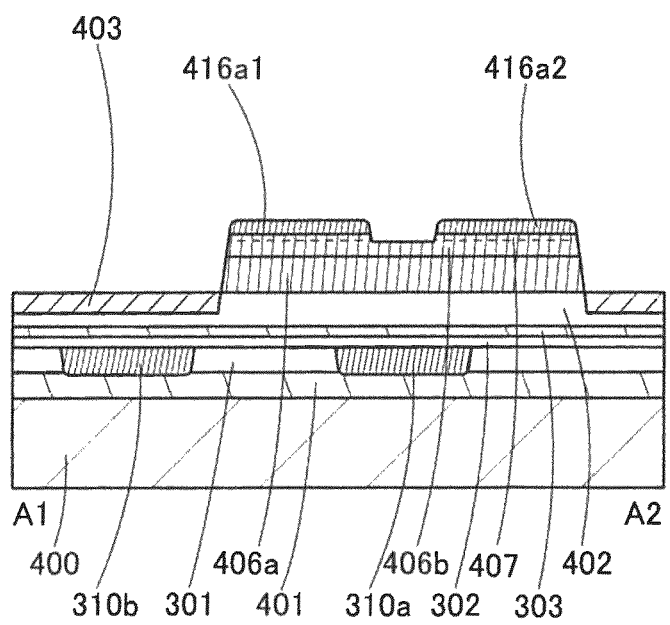
Figure 20C:
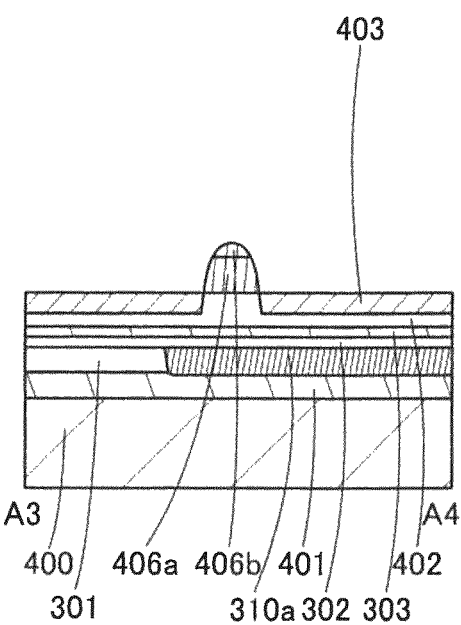
Figure 21A:
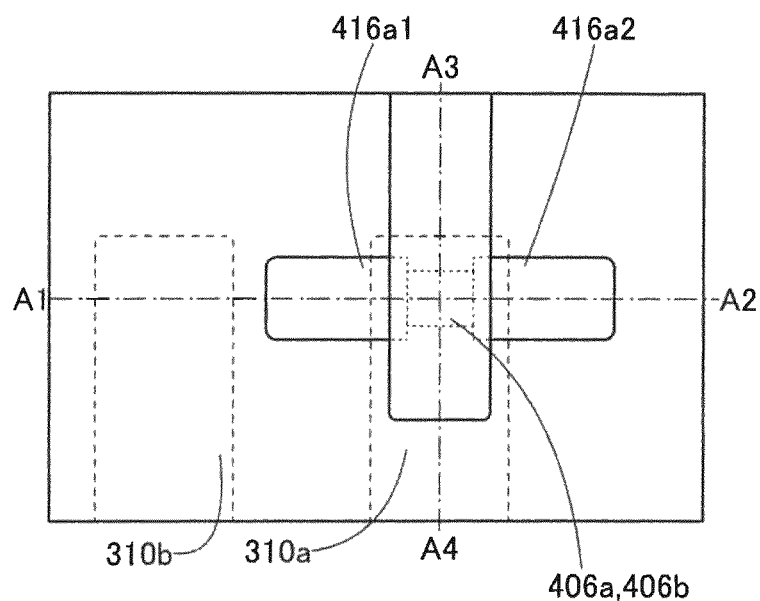
FIGS. 21A to 21C are a top view and cross-sectional views illustrating a method for manufacturing a transistor of one embodiment of the present invention.
Figure 21B:
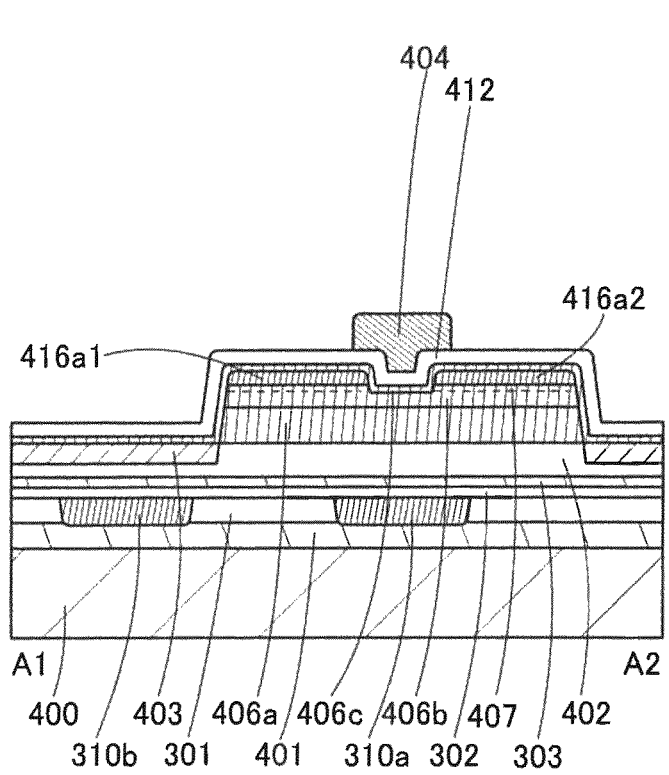
Figure 21C:
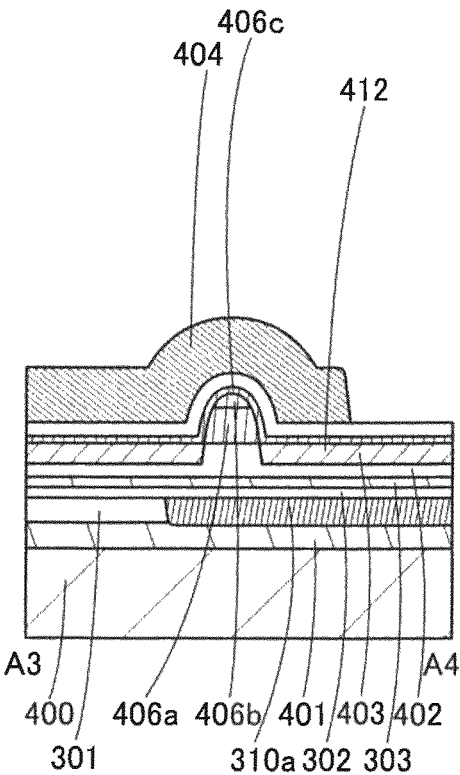
Figure 22A:
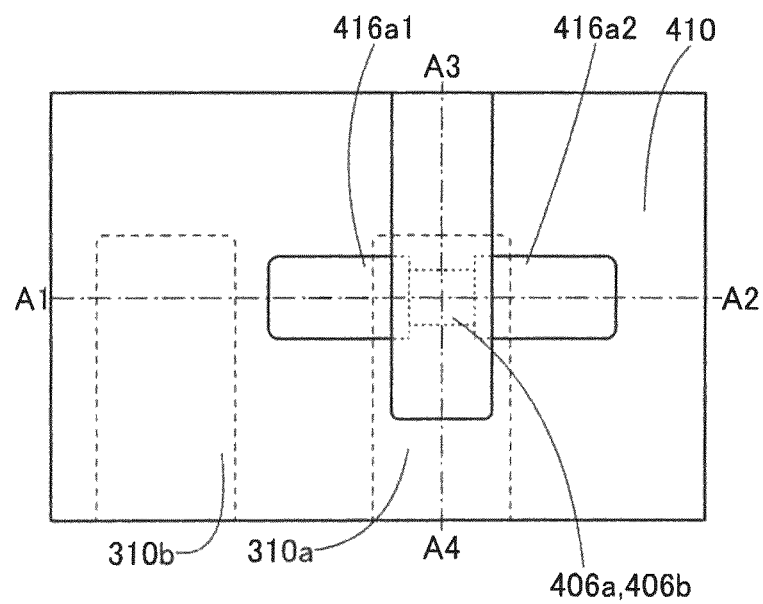
FIGS. 22A to 22C are a top view and cross-sectional views illustrating a method for manufacturing a transistor of one embodiment of the present invention.
Figure 22B:
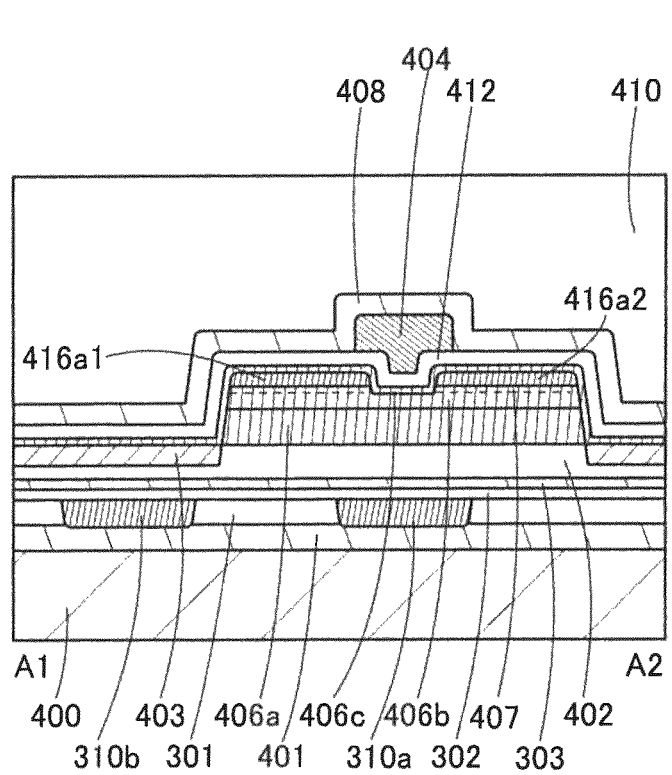
Figure 22C:
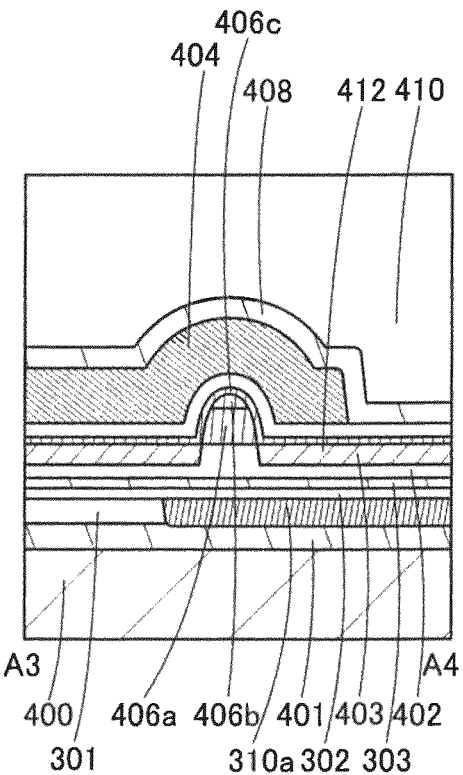
Figure 23A:
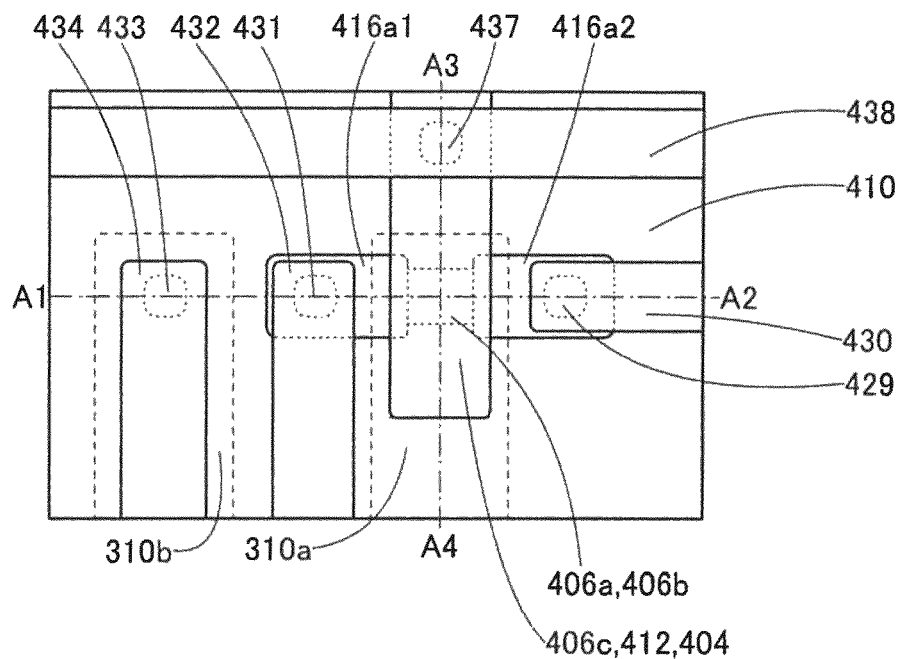
FIGS. 23A to 23C are a top view and cross-sectional views illustrating a method for manufacturing a transistor of one embodiment of the present invention.
Figure 23B:
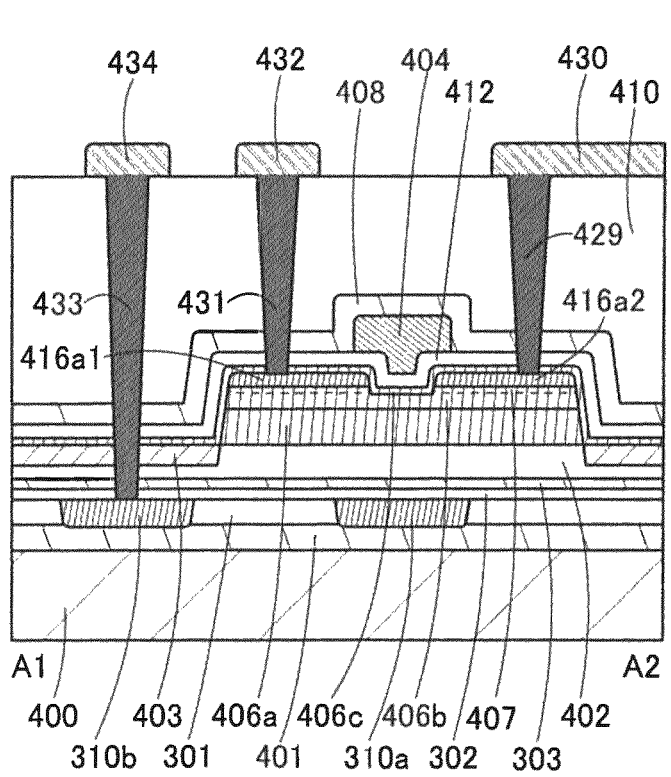
Figure 23C:
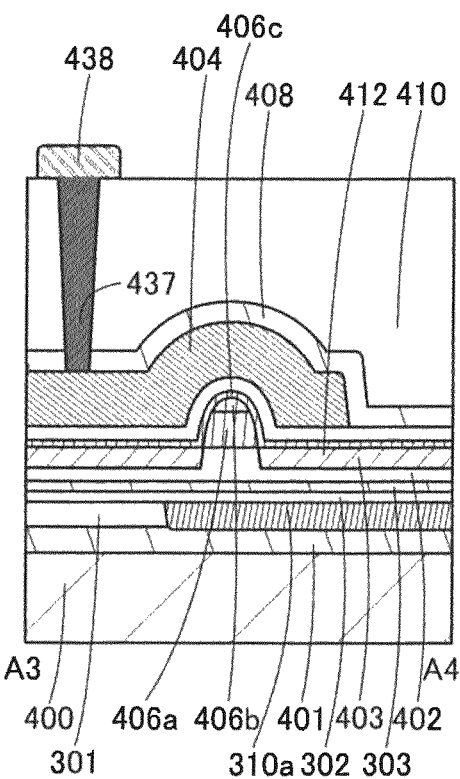

Next, the conductor 414 is processed by a lithography method or the like to form a conductor 415 (see FIGS. 18A to 18C).

Then, the conductor 415 is processed by a lithography method or the like to divide the conductor 415 into the conductors 416a1 and 416a2. Subsequently, the semiconductor 406b_1 is processed into the semiconductor 406b, and then the insulator 406a_1 is processed into the insulator 406a. Here, a top surface of the semiconductor 406b_1 is damaged when the conductor 414 is formed, whereby the region 407 is formed. The region 407 includes a region in which the resistance of the semiconductor 406b_1 is reduced; thus, contact resistance between the conductor 415 and the semiconductor 406b is reduced. Note that when the insulator 406a is formed, the insulator 402 is also subjected etching to have a thinned region in some cases. That is, the insulator 402 may have a protruding portion in a region in contact with the insulator 406a (see FIGS. 19A to 19C).

In the lithography method, first, a resist is exposed to light through a photomask. Next, a region exposed to light is removed or left using a developing solution, so that a resist mask is formed. Then, etching is performed through the resist mask. As a result, the conductor, the semiconductor, the insulator, or the like can be processed into a desired shape.

The resist mask is formed by, for example, exposure of the resist to light using KrF excimer laser light, ArF excimer laser light, extreme ultraviolet (EUV) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a photomask is not necessary in the case of using an electron beam or an ion beam. Note that dry etching treatment such as ashing or wet etching treatment can be used for removal of the resist mask. Alternatively, wet etching treatment is performed after dry etching treatment. Further alternatively, dry etching treatment is performed after wet etching treatment.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power source is applied to one of the parallel plate type electrodes. Alternatively, the capacitively coupled plasma etching apparatus may have a structure in which different high-frequency power sources are applied to one of the parallel plate type electrodes. Alternatively, the capacitively coupled plasma etching apparatus may have a structure in which high-frequency power sources with the same frequency are applied to the parallel plate type electrodes. Alternatively, the capacitively coupled plasma etching apparatus may have a structure in which high-frequency power sources with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

A method for forming the insulator 403 of one embodiment of the present invention is described below.

Although the insulator 403 can be formed by a CVD method, an ALD method, or the like, a CVD method is employed here. For example, it is preferable to use a plasma CVD apparatus. As a deposition gas, a mixed gas of a $SiF_4$ gas, an $N_2O$ gas, and an Ar gas can be used. Alternatively, a $SiH_4$ gas may be added to the above gases. The insulator 403 is formed by setting a gas pressure to 133 Pa and a high-frequency power to 800 W, for example. The temperature of a lower electrode of the CVD apparatus is set so that the substrate temperature is 350° C., for example.

When the insulator 403 is formed under such deposition conditions, the insulator 403 is not formed over the conductors 416a1 and 416a2 and the semiconductor 406b but is selectively formed over the insulator 402.

This phenomenon is due to a difference in how surfaces of the insulator 402, the conductors 416a1 and 416a2, and the semiconductor 406b react to the deposition gas of the insulator 403. The deposition gas of the insulator 403 contains fluorine that serves as etching reaction species and silicon and oxygen that serve as deposition reaction species.

On the surface of the insulator 402, which has a low reactivity with fluorine contained in the deposition gas, a film is formed because deposition reaction by silicon and oxygen occurs mainly rather than etching reaction by fluorine. In contrast, on the surfaces of the conductors 416a1 and 416a2 and the semiconductor 406b, a film is not formed because the etching reaction by fluorine contained in the deposition gas occurs concurrently with the deposition reaction by silicon and oxygen. This is probably a reason why the insulator 403 is selectively formed over the insulator 402 (see FIGS. 20A to 20C).

The insulator 402 is also subjected etching for forming the insulator 406a to have a thinned region in some cases. However, the insulator 403 can be selectively formed over this thinned region; therefore, the thickness of the thinned region can be increased by the insulator 403. Accordingly, steps of the insulator 402 are suppressed and step coverage of a film which will be formed later can be improved, which is preferable. When a potential is applied to the conductor 310a to control the threshold voltage of the transistor, the electric field intensity between the conductor 310a and the conductor 404 can be reduced owing to the insulator 403 between the conductor 310a and the conductor 404, whereby occurrence of element defects such as electrostatic breakdown can be reduced.

Next, the insulator 406c is formed. The insulator 406c can be formed by a sputtering method, a CVD method, an MBE method, a PLD method, an ALD method, or the like. Then, the insulator 412 is formed over the insulator 406c. The insulator 412 can be formed by a sputtering method, a CVD method, an MBE method, a PLD method, an ALD method, or the like.

Next, a conductor to be the conductor 404 is formed. The conductor to be the conductor 404 can be formed by a sputtering method, a CVD method, an MBE method, a PLD method, an ALD method, or the like. Then, the conductor to be the conductor 404 is processed by a lithography method or the like to form the conductor 404 (see FIGS. 21A to 21C).

Next, the insulator 410 is formed. The insulator 410 can be formed by a sputtering method, a CVD method, an MBE method, a PLD method, an ALD method, or the like. Alternatively, the insulator 410 can be formed by a spin coating method, a dipping method, a droplet discharging method (such as an ink-jet method), a printing method (such as screen printing or offset printing), a doctor knife method, a roll coater method, a curtain coater method, or the like.

The insulator 410 may be formed to have a flat top surface. For example, the top surface of the insulator 410 may have flatness immediately after the film formation. Alternatively, for example, the insulator 410 may have flatness by removing the insulator and the like from the top surface after the film formation so that the top surface becomes parallel to a reference surface such as a rear surface of the substrate. Such treatment is referred to as planarization treatment. As the planarization treatment, for example, chemical mechanical polishing (CMP) treatment, dry etching treatment, or the like can be performed. However, the top surface of the insulator 410 is not necessarily flat (see FIGS. 22A to 22C).

Next, the opening reaching the conductor 310b through the insulators 410, 408, 412, 406c, 403, and 402, the electron trap layer 303, and the insulator 302; the opening reaching the conductor 416a1 through the insulators 410, 408, 412, and 406c; the opening reaching the conductor 416a2 through the insulators 410, 408, 412, and 406c; and the opening reaching the conductor 404 through the insulators 410 and 408 are formed by a lithography method or the like. As a method for forming the openings, an insulator or a conductor that functions as a hard mask may be formed over the insulator 410. Note that the hard mask may be a stacked-layer film of the insulator and the conductor.

Next, the conductors 433, 431, 429, and 437 are embedded in the respective openings; and the conductors 434, 432, 430, and 438 in contact with the top surfaces of the conductors 433, 431, 429, and 437, respectively, are formed. The conductors 433, 431, 429, 437, 434, 432, 430, and 438 can be formed by a sputtering method, a CVD method, an MBE method, a PLD method, an ALD method, or the like. Through the above steps, the transistor in FIGS. 1A to 1C can be formed (see FIGS. 23A to 23C).

<Method 2 for Manufacturing Transistor>

Figure 24A:
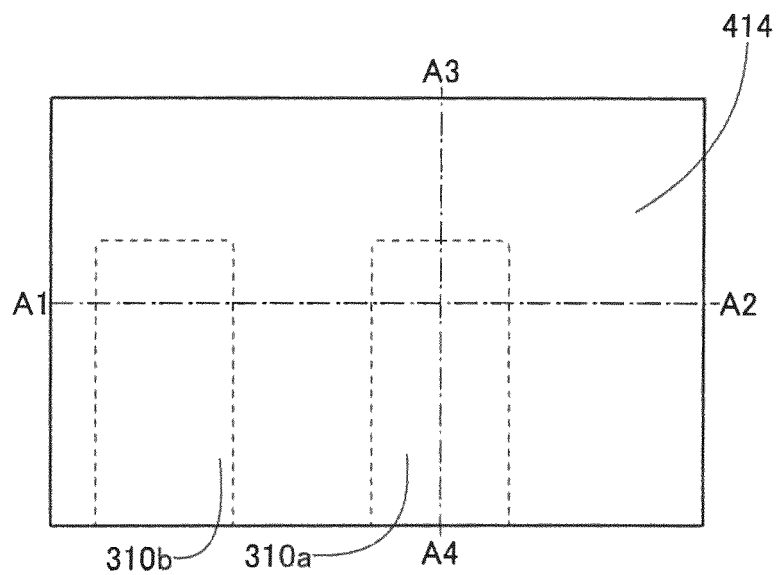
FIGS. 24A to 24C are a top view and cross-sectional views illustrating a method for manufacturing a transistor of one embodiment of the present invention.
Figure 24B:
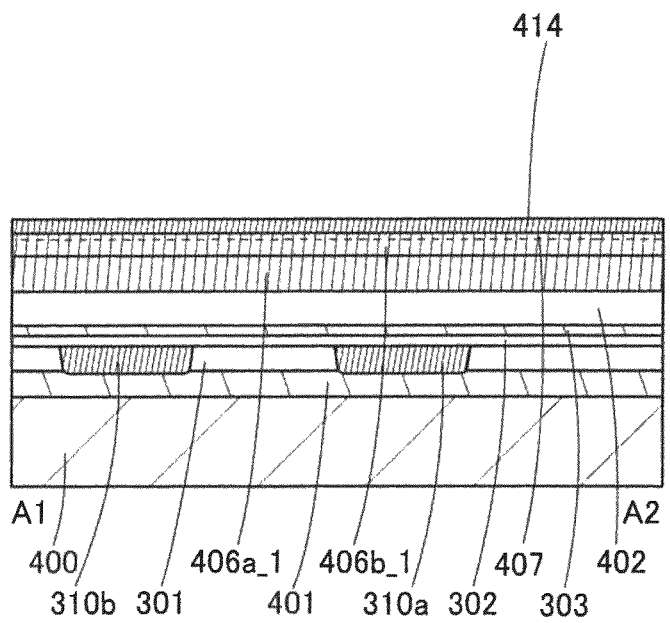
Figure 24C:
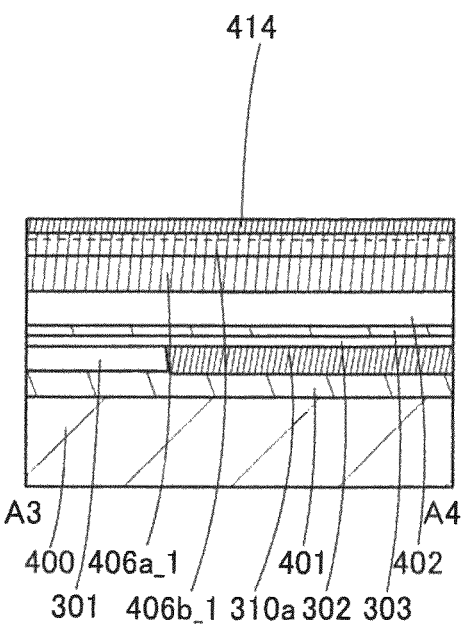
Figure 25A:
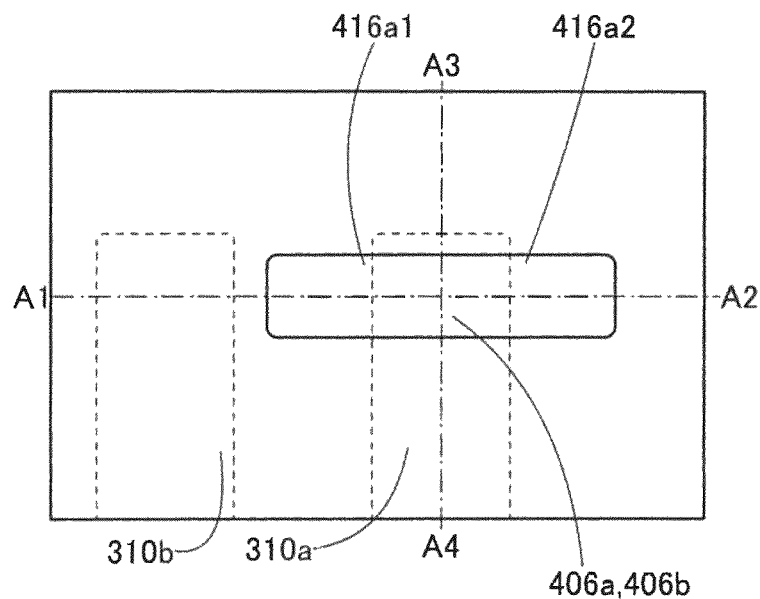
FIGS. 25A to 25C are a top view and cross-sectional views illustrating a method for manufacturing a transistor of one embodiment of the present invention.
Figure 25B:
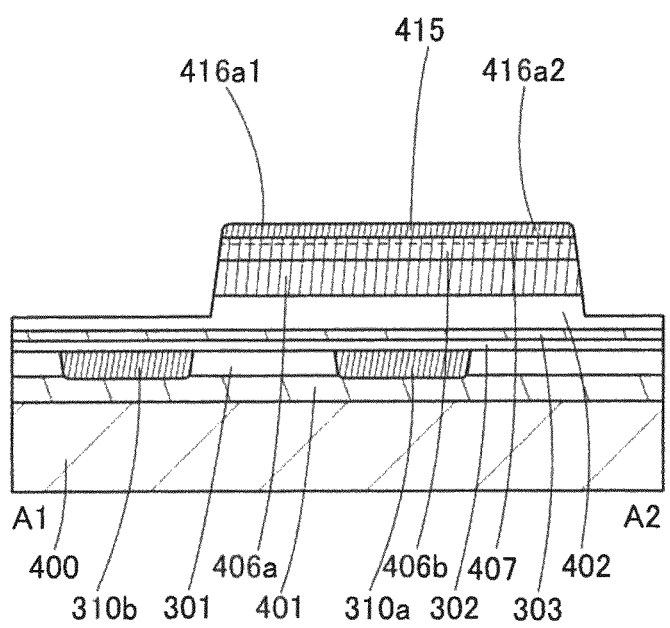
Figure 25C:
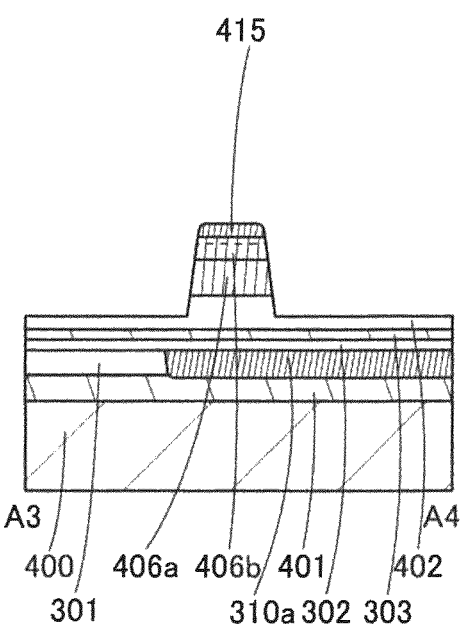
Figure 26A:
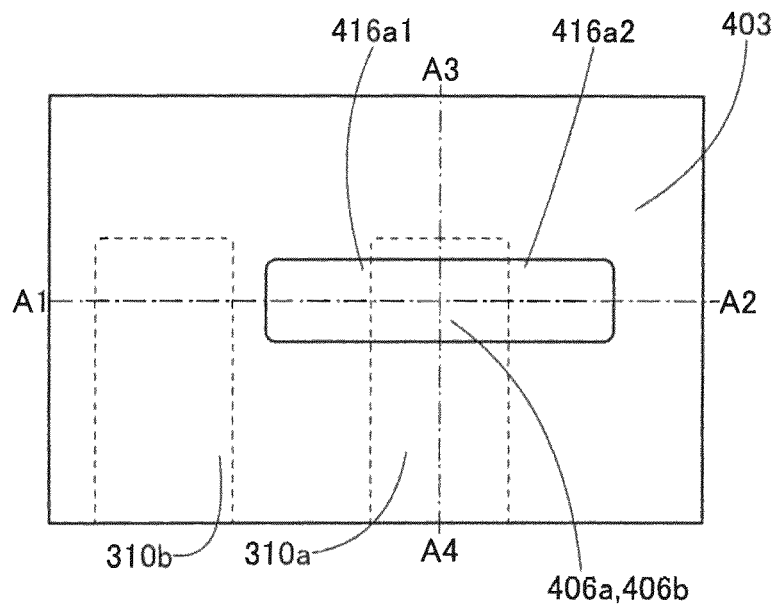
FIGS. 26A to 26C are a top view and cross-sectional views illustrating a method for manufacturing a transistor of one embodiment of the present invention.
Figure 26B:
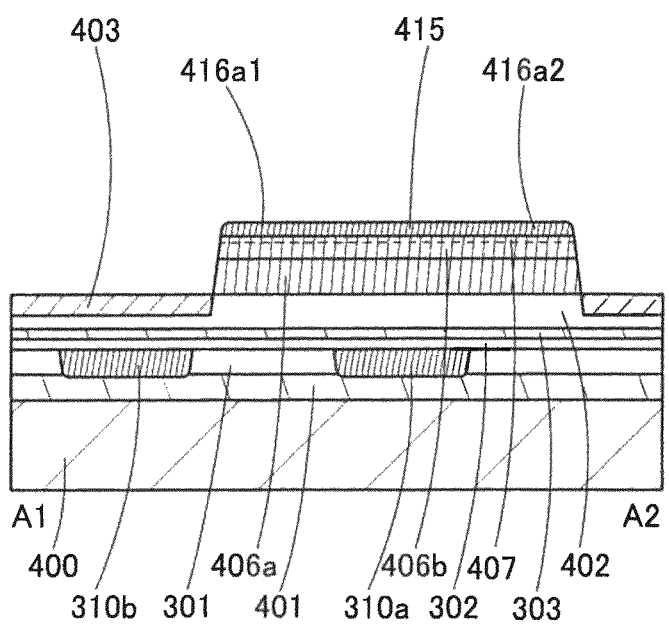
Figure 26C:
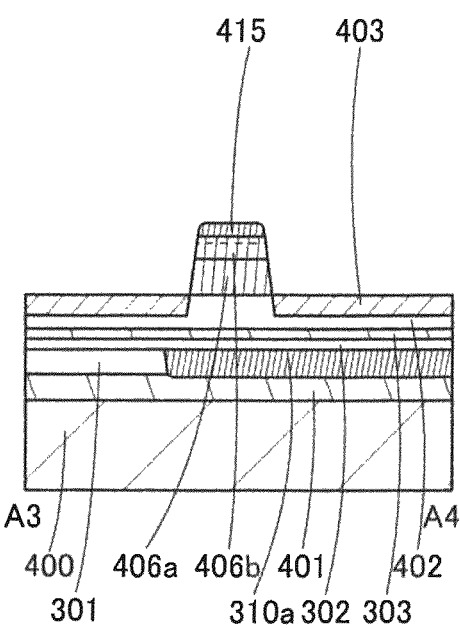
Figure 27A:
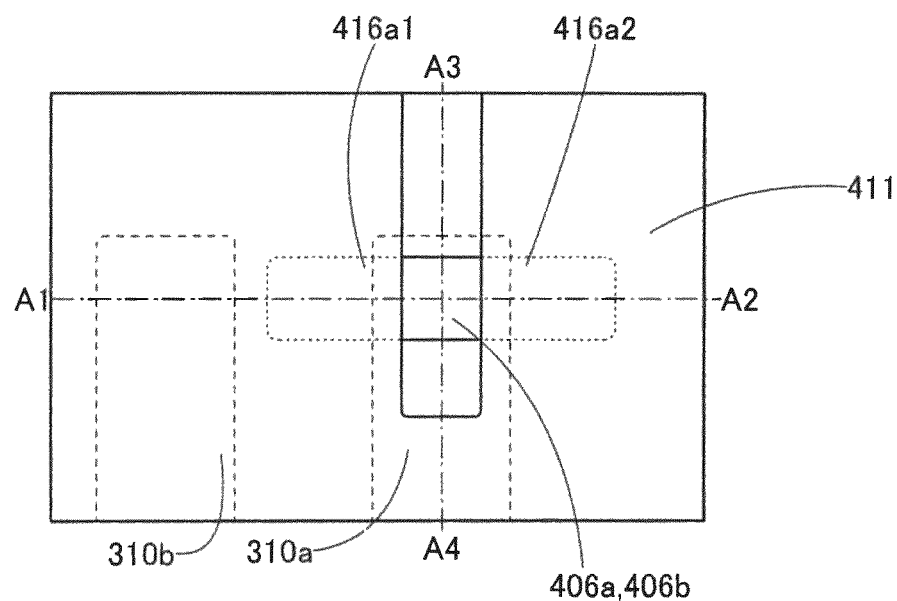
FIGS. 27A to 27C are a top view and cross-sectional views illustrating a method for manufacturing a transistor of one embodiment of the present invention.
Figure 27B:
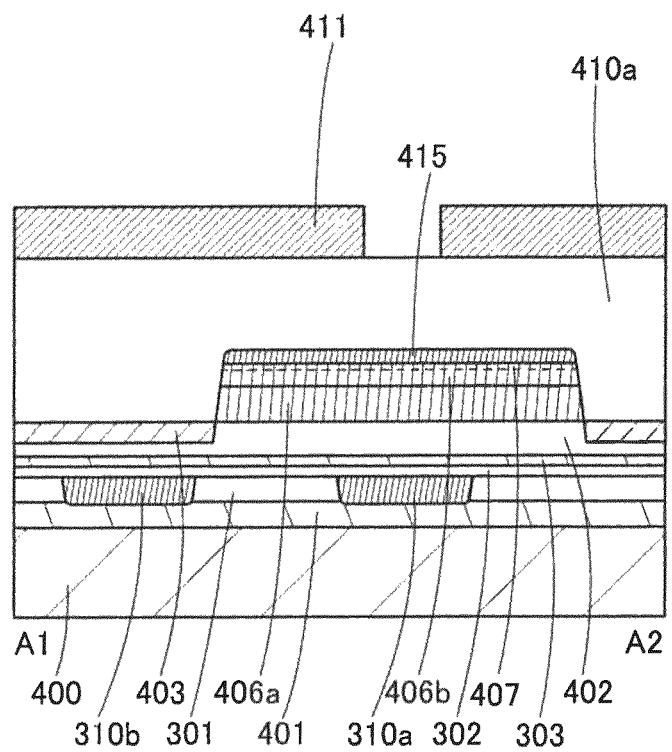
Figure 27C:
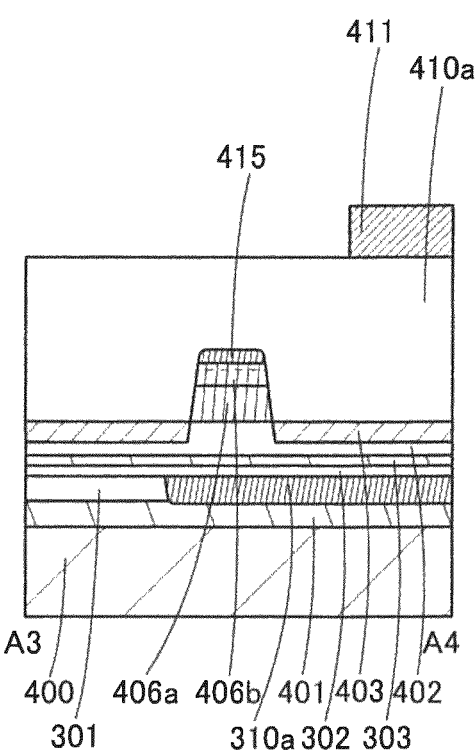
Figure 28A:
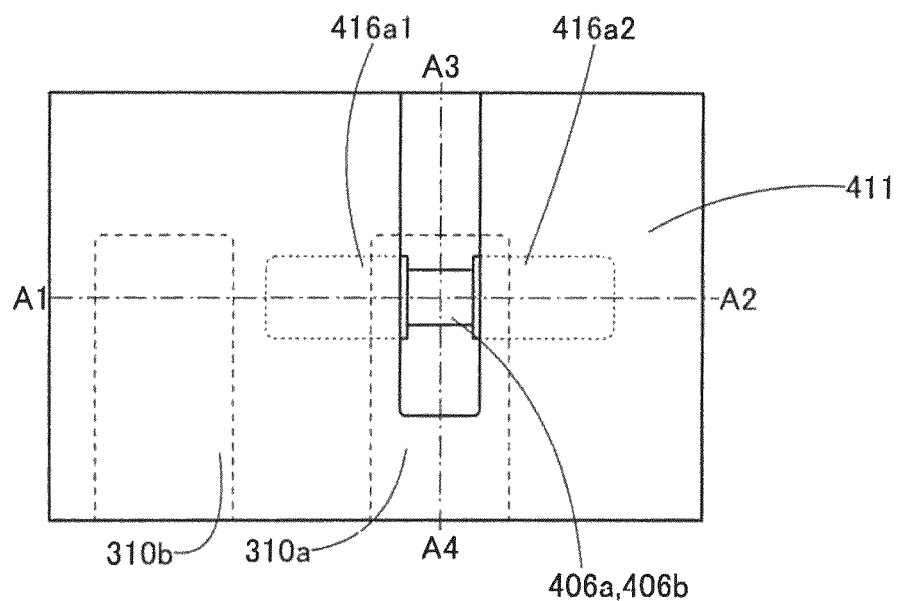
FIGS. 28A to 28C are a top view and cross-sectional views illustrating a method for manufacturing a transistor of one embodiment of the present invention.
Figure 28B:
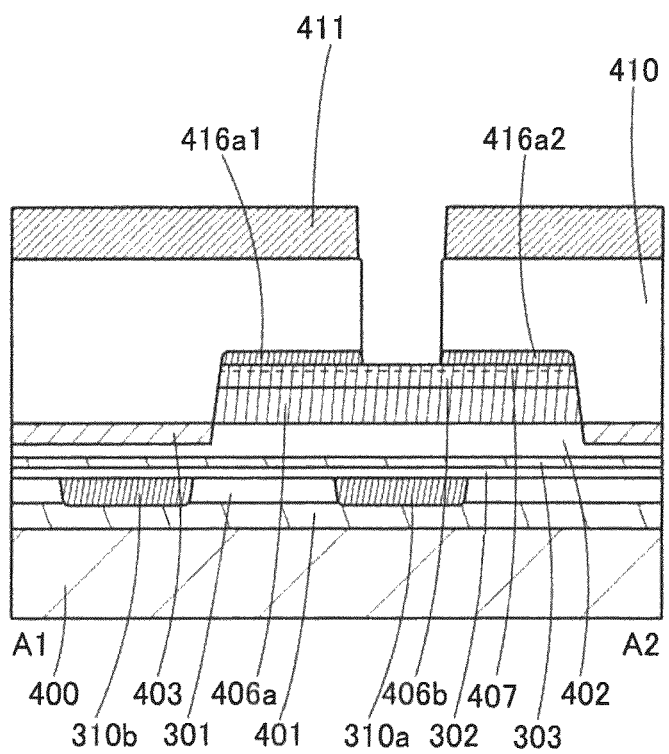
Figure 28C:
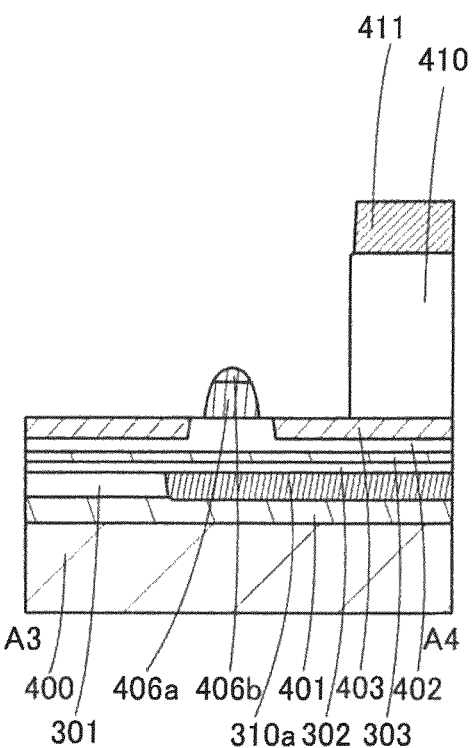
Figure 30A:
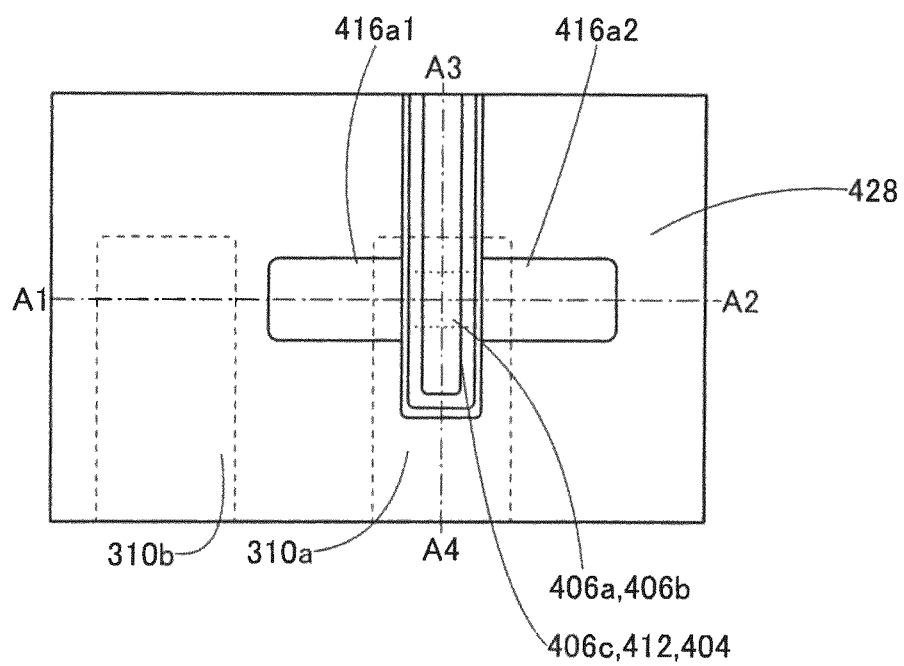
FIGS. 30A to 30C are a top view and cross-sectional views illustrating a method for manufacturing a transistor of one embodiment of the present invention.
Figure 30B:
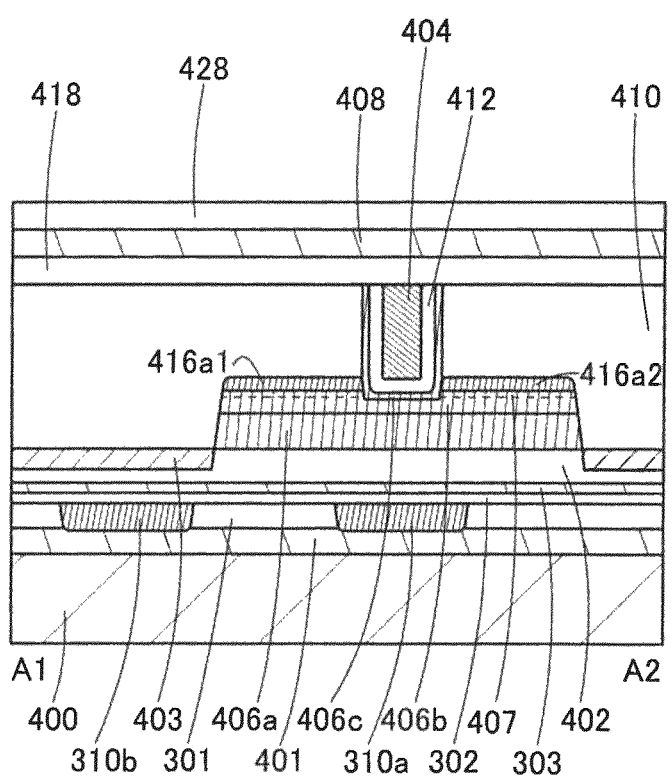
Figure 30C:
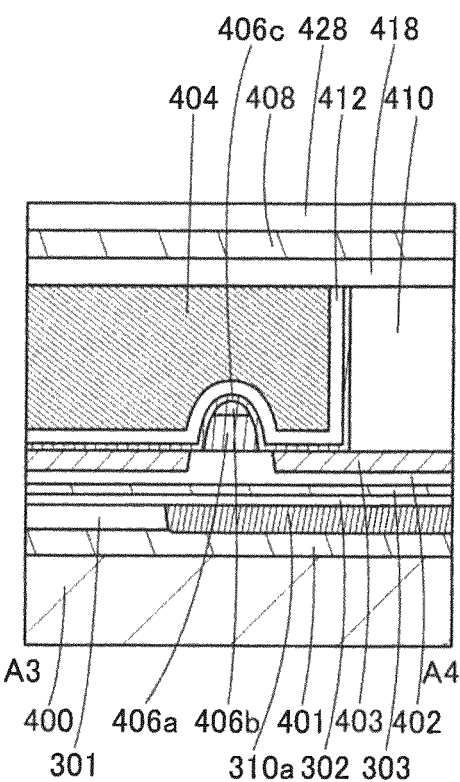
Figure 31A:
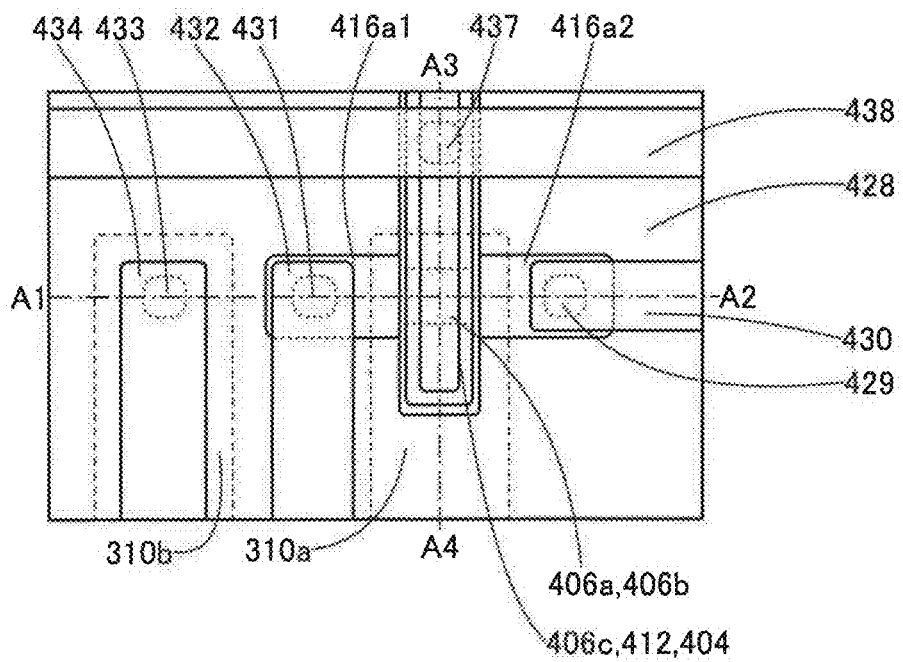
FIGS. 31A to 31C are a top view and cross-sectional views illustrating a method for manufacturing a transistor of one embodiment of the present invention.
Figure 31B:
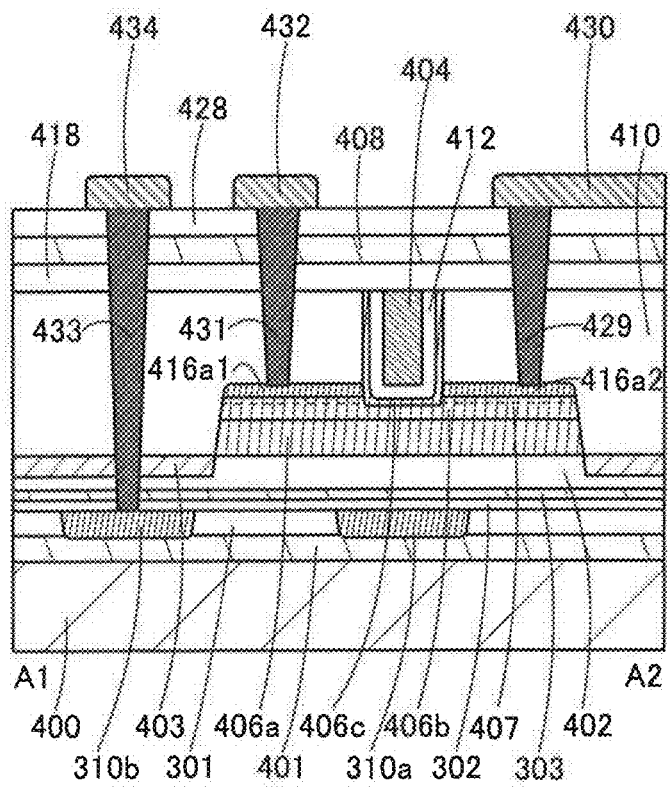
Figure 31C:
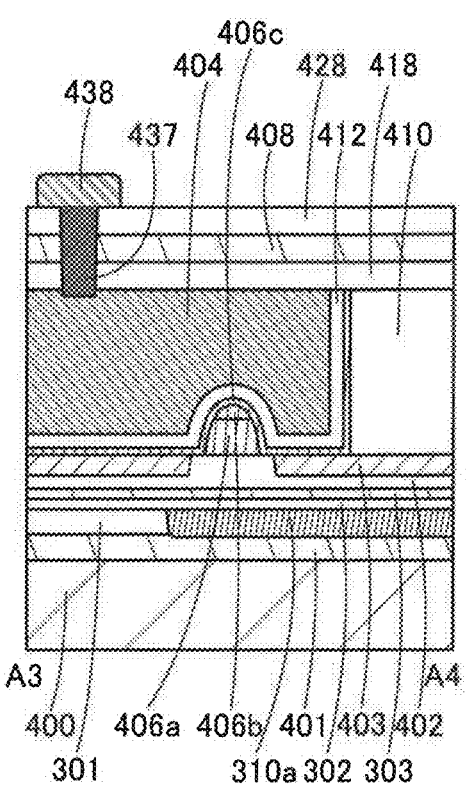

A method for manufacturing the transistor in FIGS. 4A to 4C of the present invention is described below with reference to FIGS. 24A to 24C, FIGS. 25A to 25C, FIGS. 26A to 26C, FIGS. 27A to 27C, FIGS. 28A to 28C, FIGS. 29A to 29C, FIGS. 30A to 30C, and FIGS. 31A to 31C. Note that the process up to the formation of the conductor 414 is the same as that in Method 1 for manufacturing a transistor (see FIGS. 24A to 24C).

Next, the insulator 406a_1, the semiconductor 406b_1, and the conductor 414 are processed by a lithography method or the like, whereby the multilayer film including the insulator 406a, the semiconductor 406b, and the conductor 415 is formed. Here, a top surface of the semiconductor 406b_1 is damaged when the conductor 414 is formed, whereby the region 407 is formed. Since the region 407 includes a region where the resistance of the semiconductor 406b_1 is reduced, the contact resistance between the conductor 415 and the semiconductor 406b is reduced. Note that when the multilayer film is formed, the insulator 402 is also subjected etching to have a thinned region in some cases. That is, the insulator 402 may have a protruding portion in a region in contact with the multilayer film (see FIGS. 25A to 25C).

A method for forming the insulator 403 of one embodiment of the present invention is described below.

Although the insulator 403 can be formed by a CVD method, an ALD method, or the like, a CVD method is employed here. For example, it is preferable to use a plasma CVD apparatus. As a deposition gas, a mixed gas of a $SiF_4$ gas, an $N_2O$ gas, and an Ar gas can be used. Alternatively, a $SiH_4$ gas may be added to the above gases. The insulator 403 is formed by setting a gas pressure to 133 Pa and a high-frequency power to 800 W, for example. The temperature of a lower electrode of the CVD apparatus is set so that the substrate temperature is 350° C., for example.

When the insulator 403 is formed under such deposition conditions, the insulator 403 is not formed over the conductors 416a1 and 416a2 and the semiconductor 406b but is selectively formed over the insulator 402.

This phenomenon is due to a difference in how surfaces of the insulator 402, the conductors 416a1 and 416a2, and the semiconductor 406b react to the deposition gas of the insulator 403. The deposition gas of the insulator 403 contains fluorine that serves as etching reaction species and silicon and oxygen that serve as deposition reaction species. On the surface of the insulator 402, which has a low reactivity with fluorine contained in the deposition gas, a film is formed because deposition reaction by silicon and oxygen occurs mainly rather than etching reaction by fluorine. In contrast, on the surfaces of the conductors 416a1 and 416a2 and the semiconductor 406b, a film is not formed because the etching reaction by fluorine contained in the deposition gas occurs concurrently with the deposition reaction by silicon and oxygen. This is probably a reason why the insulator 403 is selectively formed over the insulator 402 (see FIGS. 26A to 26C).

The insulator 402 is also subjected etching for forming the insulator 406a to have a thinned region in some cases. However, the insulator 403 can be selectively formed over this thinned region; therefore, the thickness of the thinned region can be increased by the insulator 403. Accordingly, steps of the insulator 402 are suppressed and step coverage of a film which will be formed later can be improved, which is preferable. When a potential is applied to the conductor 310a to control the threshold voltage of the transistor, the electric field intensity between the conductor 310a and the conductor 404 can be reduced owing to the insulator 403 between the conductor 310a and the conductor 404, whereby occurrence of element defects such as electrostatic breakdown can be reduced.

Next, an insulator 410a is formed. The insulator 410a can be formed by a sputtering method, a CVD method, an MBE method, a PLD method, an ALD method, or the like. Alternatively, the insulator 410a can be formed by a spin coating method, a dipping method, a droplet discharging method (such as an ink-jet method), a printing method (such as screen printing or offset printing), a doctor knife method, a roll coater method, a curtain coater method, or the like.

The insulator 410a may be formed to have a flat top surface. For example, the top surface of the insulator 410a may have flatness immediately after the film formation.

Alternatively, for example, the insulator 410a may have flatness by removing the insulator and the like from the top surface after the film formation so that the top surface becomes parallel to a reference surface such as a rear surface of the substrate. Such treatment is referred to as planarization treatment. As the planarization treatment, for example, chemical mechanical polishing (CMP) treatment, dry etching treatment, or the like can be performed. However, the top surface of the insulator 410a is not necessarily flat.

Next, a resist mask 411 is formed over the insulator 410a by a lithography method or the like. Here, in order to improve the adhesion between the top surface of the insulator 410a and the resist mask 411, for example, an organic coating film may be provided between the top surface of the insulator 410a and the resist mask 411. Alternatively, a single layer of a conductor or a stacked-layer film of a conductor and an insulator may be formed over the insulator 410a to form a hard mask by a lithography method (see FIGS. 27A to 27C).

Next, the insulator 410a is subjected to first processing by dry etching or the like until the insulator 403 is exposed, whereby the insulator 410 is formed. At this time, the insulator 403 prevents the insulator 402 from being etched, whereby etching is stopped before reaching the electron trap layer 303. When etching reaches the electron trap layer 303, malfunction might be caused at the time of injecting electrons into the electron trap layer 303.

Next, the conductor 415 is subjected to second processing using dry etching or the like so as to be divided into the conductor 416a1 and the conductor 416a2.

At this time, the semiconductor 406b has an exposed region. Here, the exposed region of the semiconductor 406b, which is the region 407, is removed by the second processing in some cases (see FIGS. 28A to 28C).

When the first processing and the second processing are each performed by dry etching, an impurity such as the residual components of the etching gas is attached to the exposed region of the semiconductor 406b in some cases. For example, when a chlorine-based gas is used as an etching gas, chlorine and the like are attached in some cases. Furthermore, when a hydrocarbon-based gas is used as an etching gas, carbon, hydrogen, and the like are attached in some cases. When the substrate is exposed to air after the second processing, the exposed region of the semiconductor 406b and the like corrode in some cases. Thus, plasma treatment using an oxygen gas is preferably performed successively after the second processing because the impurity can be removed and corrosion of the exposed region of the semiconductor 406b and the like can be prevented.

Alternatively, the impurity may be reduced by cleaning treatment using diluted hydrofluoric acid or the like or cleaning treatment using ozone or the like, for example. Note that different types of cleaning treatment may be combined. In such a manner, the exposed region of the semiconductor 406b, i.e., a channel formation region has high resistance.

Meanwhile, in the region 407 where the conductors 416a1 and 416a2 and the top surface of the semiconductor 406b overlap with each other, a value of contact resistance between the conductors 416a1 and 416a2 and the semiconductor 406b is preferably decreased; thus, favorable transistor characteristics can be obtained.

Next, an insulator to be the insulator 406c is formed, and an insulator to be the insulator 412 is formed over the insulator to be the insulator 406c. The insulator to be the insulator 406c and the insulator to be the insulator 412 can be formed by a sputtering method, a CVD method, an MBE method, a PLD method, an ALD method, or the like. The insulator to be the insulator 406c and the insulator to be the insulator 412 are formed to have a uniform thickness along bottom and side surfaces of an opening formed in the insulator 410 and the conductors 416a1 and 416a2. Therefore, the ALD method is preferably used.

Next, the conductor to be the conductor 404 is formed. The conductor to be the conductor 404 can be formed by a sputtering method, a CVD method, an MBE method, a PLD method, an ALD method, or the like. The conductor to be the conductor 404 is formed so as to fill the opening formed in the insulator 410 and the like. Therefore, a CVD method (an MCVD method, in particular) is preferred. A stacked-layer film of a conductor formed by an ALD method or the like and a conductor formed by an MCVD method is preferable in some cases to increase adhesion between the insulator 412 and the conductor formed by a MCVD method. For example, the multilayer film where titanium nitride and tungsten are formed in this order may be used.

Next, the conductor to be the conductor 404, the insulator to be the insulator 412, and the insulator to be the insulator 406c are polished and flattened by CMP or the like from the top surface of the conductor to be the conductor 404 so as to reach the top surface of the insulator 410. Accordingly, the conductor 404 functioning as the gate electrode can be formed in a self-aligned manner without using a lithography method. The conductor 404 functioning as the gate electrode can be formed without considering alignment accuracy of the conductor 404 functioning as the gate electrode and the conductors 416a1 and 416a2 functioning as the source and drain electrodes; as a result, the area of the semiconductor device can be reduced. No damage due to dry etching is caused because the gate electrode can be formed without using a lithography method. Furthermore, because the lithography process is not necessary, improvement in productivity due to simplification of the process is expected (see FIGS. 29A to 29C).

Next, the insulator 418 is formed over the insulators 410, 412, and 406c. The insulator 418 can be formed by a sputtering method, a CVD method, an MBE method, a PLD method, an ALD method, or the like. Then, the insulator 408 is formed over the insulator 418. The insulator 408 can be formed by a sputtering method, a CVD method, an MBE method, a PLD method, an ALD method, or the like. An aluminum oxide film is preferably formed as the insulator 408 using plasma containing oxygen, so that oxygen in the plasma can be added to the top surface of the insulator 418 as excess oxygen.

Second heat treatment may be performed at any time after the formation of the insulator to be the insulator 408. By the second heat treatment, the excess oxygen contained in the insulator 418 is moved to the semiconductor 406b through the insulators 410, 402, and 406a. Furthermore, the excess oxygen contained in the insulator 418 is moved to the semiconductor 406b through the insulator 412 and/or the insulator 406c. Since excess oxygen is moved to the semiconductor 406b by passing two paths as described above, defects (oxygen vacancies) in the semiconductor 406b can be reduced.

Note that the second heat treatment may be performed at a temperature such that excess oxygen (oxygen) in the insulator 418 is diffused to the semiconductor 406b. For example, the description of the first heat treatment may be referred to for the second heat treatment. The second heat treatment is preferably performed at a temperature lower than that of the first heat treatment. The second heat treatment is preferably performed at a temperature lower than that of the first heat treatment by 20° C. or higher and 150° C. or lower, preferably 40° C. or higher and 100° C. or lower. Accordingly, superfluous release of excess oxygen (oxygen) from the insulator 402 can be inhibited. Note that in the case where heating at the time of formation of the layers doubles as the second heat treatment, the second heat treatment is not necessarily performed.

Next, the insulator 428 is formed over the insulator 408. The insulator 428 can be formed by a sputtering method, a CVD method, an MBE method, a PLD method, an ALD method, or the like (see FIGS. 30A to 30C).

Next, the opening reaching the conductor 310b through the insulators 428, 408, 418, 410, 403, and 402, the electron trap layer 303, and the insulator 302; the opening reaching the conductor 416a1 through the insulators 428, 408, 418, and 410; the opening reaching the conductor 416a2 through the insulators 428, 408, 418, and 410; and the opening reaching the conductor 404 through the insulators 428, 408, and 418 are formed by a lithography method or the like. As a method for forming the openings, an insulator or a conductor that functions as a hard mask may be formed over the insulator 428. Note that the hard mask may be a stacked-layer film of the insulator and the conductor.

Next, the conductors 433, 431, 429, and 437 are formed in the respective openings. Then, the conductors 434, 432, 430, and 438 in contact with the top surfaces of the conductors 433, 431, 429, and 437, respectively, are formed. The conductors 433, 431, 429, 437, 434, 432, 430, and 438 can be formed by a sputtering method, a CVD method, an MBE method, a PLD method, an ALD method, or the like. Through the above steps, the transistor in FIGS. 4A to 4C can be formed (see FIGS. 31A to 31C).

At least part of this embodiment can be implemented in combination with any of the other embodiments described in this specification as appropriate.

Embodiment 4

<Memory Device 1>

Figure 32A:
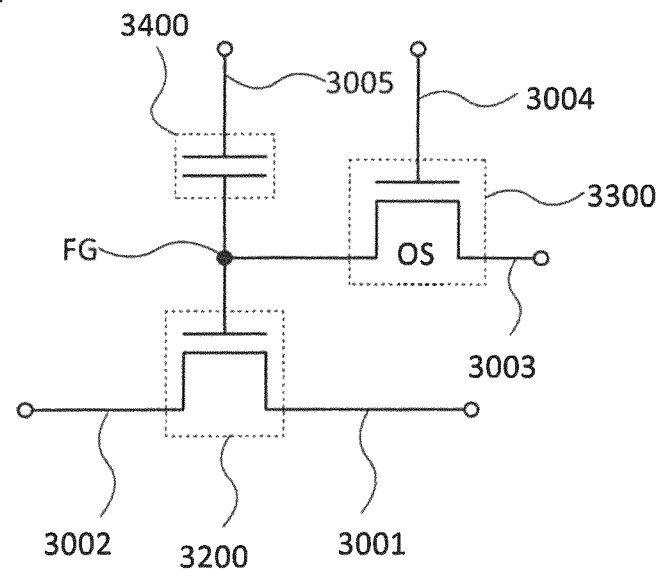
FIGS. 32A and 32B are each a circuit diagram of a memory device of one embodiment of the present invention.
Figure 32B:
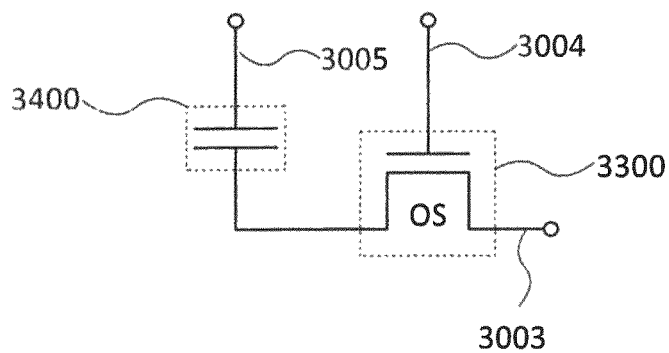

An example of a semiconductor device (memory device) which includes the transistor of one embodiment of the present invention, which can retain stored data even when not powered, and which has an unlimited number of write cycles is shown in FIGS. 32A and 32B.

The semiconductor device illustrated in FIG. 32A includes a transistor 3200 using a first semiconductor, a transistor 3300 using a second semiconductor, and a capacitor 3400. Note that any of the above-described transistors can be used as the transistor 3300.

The transistor 3300 is preferably a transistor with a low off-state current. For example, a transistor using an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 32A, a first wiring 3001 is electrically connected to a source of the transistor 3200. A second wiring 3002 is electrically connected to a drain of the transistor 3200. A third wiring 3003 is electrically connected to one of a source and a drain of the transistor 3300. A fourth wiring 3004 is electrically connected to a gate of the transistor 3300. A gate of the transistor 3200 and the other of the source and drain of the transistor 3300 are electrically connected to one electrode of the capacitor 3400. A fifth wiring 3005 is electrically connected to the other electrode of the capacitor 3400.

The semiconductor device in FIG. 32A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined electric charge is supplied to the gate of the transistor 3200 (writing). Here, one of two kinds of electric charges providing different potential levels (hereinafter referred to as a low-level electric charge and a high-level electric charge) is supplied. After that, the potential of the fourth wiring 3004 is set to a potential at which the transistor 3300 is off, so that the transistor 3300 is turned off. Thus, the electric charge is retained at the node FG (retaining).

Since the off-state current of the transistor 3300 is low, the electric charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of electric charge retained in the node FG. This is because in the case of using an n-channel transistor as the transistor 3200, an apparent threshold voltage $V_{th\_H}$ at the time when the high-level electric charge is given to the gate of the transistor 3200 is lower than an apparent threshold voltage $V_{th\_L}$ at the time when the low-level electric charge is given to the gate of the transistor 3200. Here, an apparent threshold voltage refers to the potential of the fifth wiring 3005 which is needed to make the transistor 3200 be in "on state." Thus, the potential of the fifth wiring 3005 is set to a potential $V_0$ which is between $V_{th\_H}$ and $V_{th\_L}$, whereby electric charge supplied to the node FG can be determined. For example, in the case where the high-level electric charge is supplied to the node FG in writing and the potential of the fifth wiring 3005 is $V_0$ (>$V_{th\_H}$), the transistor 3200 is brought into "on state." In the case where the low-level electric charge is supplied to the node FG in writing, even when the potential of the fifth wiring 3005 is $V_0$ (<$V_{th\_L}$), the transistor 3200 still remains in "off state." Thus, the data retained in the node FG can be read by determining the potential of the second wiring 3002.

Note that in the case where memory cells are arrayed, it is necessary that data of a desired memory cell be read in read operation. For example, the fifth wiring 3005 of memory cells from which data is not read may be supplied with a potential at which the transistor 3200 is brought into "an off state" regardless of the potential supplied to the node FG, that is, a potential lower than $V_{th\_H}$, whereby only data of a desired memory cell can be read. Alternatively, the fifth wiring 3005 of the memory cells from which data is not read may be supplied with a potential at which the transistor 3200 is brought into "on state" regardless of the potential supplied to the node FG, that is, a potential higher than $V_{th\_L}$, whereby only data of a desired memory cell can be read.

<Structure 1 of Semiconductor Device>

Figure 33:
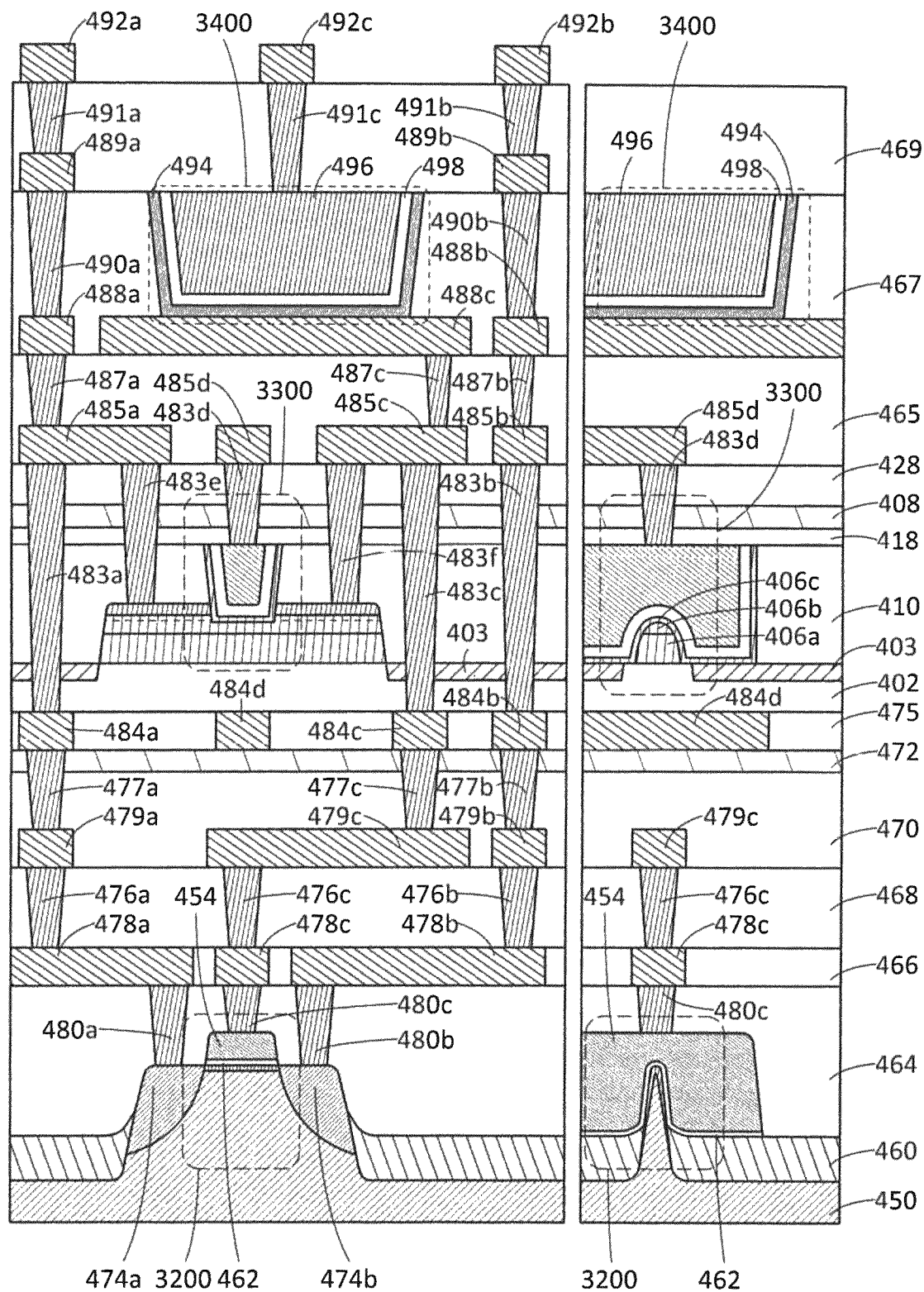
FIG. 33 is a cross-sectional view of a semiconductor device of one embodiment of the present invention.

FIG. 33 is a cross-sectional view of the semiconductor device in FIG. 32A. The semiconductor device illustrated in FIG. 33 includes the transistors 3200 and 3300 and the capacitor 3400. The transistor 3300 and the capacitor 3400 are provided over the transistor 3200. Although an example where the transistor illustrated in FIGS. 1A to 1C is used as the transistor 3300 is shown, a semiconductor device of one embodiment of the present invention is not limited thereto. The description of the above transistor is referred to as appropriate.

The transistor 3200 illustrated in FIG. 33 is a transistor using a semiconductor substrate 450. The transistor 3200 includes a region 474a in the semiconductor substrate 450, a region 474b in the semiconductor substrate 450, an insulator 462, and a conductor 454.

In the transistor 3200, the regions 474a and 474b function as source and drain regions. The insulator 462 functions as a gate insulator. The conductor 454 functions as a gate electrode. Therefore, resistance of a channel formation region can be controlled by a potential applied to the conductor 454. In other words, conduction or non-conduction between the region 474a and the region 474b can be controlled by the potential applied to the conductor 454.

The transistor 3200 in FIG. 33 is a FIN transistor. The effective channel width is increased in the FIN transistor 3200, whereby the on-state characteristics of the transistor 3200 can be improved. In addition, since contribution of the electric field of the gate electrode can be increased, the off-state characteristics of the transistor 3200 can be improved.

For the semiconductor substrate 450, a single-material semiconductor substrate of silicon, germanium, or the like or a compound semiconductor substrate of silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting the n-type conductivity may be provided in a region where the transistor 3200 is formed. Alternatively, the semiconductor substrate 450 may be an i-type semiconductor substrate.

The top surface of the semiconductor substrate 450 preferably has a (110) plane. Thus, on-state characteristics of the transistor 3200 can be improved.

The regions 474a and 474b are regions including impurities imparting the p-type conductivity. Accordingly, the transistor 3200 has a structure of a p-channel transistor.

Note that although the transistor 3200 is illustrated as a p-channel transistor, the transistor 3200 may be an n-channel transistor.

Note that the transistor 3200 is separated from an adjacent transistor by the region 460 and the like. The region 460 is an insulating region.

The semiconductor device illustrated in FIG. 33 includes an insulator 464, an insulator 466, an insulator 468, an insulator 470, an insulator 472, an insulator 475, the insulator 402, the insulator 403, the insulator 410, the insulator 418, the insulator 408, the insulator 428, an insulator 465, an insulator 467, an insulator 469, an insulator 498, a conductor 480a, a conductor 480b, a conductor 480c, a conductor 478a, a conductor 478b, a conductor 478c, a conductor 476a, a conductor 476b, a conductor 476c, a conductor 479a, a conductor 479b, a conductor 479c, a conductor 477a, a conductor 477b, a conductor 477c, a conductor 484a, a conductor 484b, a conductor 484c, a conductor 484d, a conductor 483a, a conductor 483b, a conductor 483c, a conductor 483d, a conductor 483e, a conductor 483f, a conductor 485a, a conductor 485b, a conductor 485c, a conductor 485d, a conductor 487a, a conductor 487b, a conductor 487c, a conductor 488a, a conductor 488b, a conductor 488c, a conductor 490a, a conductor 490b, a conductor 489a, a conductor 489b, a conductor 491a, a conductor 491b, a conductor 491c, a conductor 492a, a conductor 492b, a conductor 492c, a conductor 494, a conductor 496, the insulator 406a, the semiconductor 406b, and the insulator 406c.

The insulator 464 is over the transistor 3200. The insulator 466 is over the insulator 464. The insulator 468 is over the insulator 466. The insulator 470 is over the insulator 468. The insulator 472 is over the insulator 470. The insulator 475 is over the insulator 472. The transistor 3300 is provided over the insulator 475. The insulator 418 is over the transistor 3300. The insulator 408 is over the insulator 418. The insulator 428 is over the insulator 408. The insulator 465 is over the insulator 428. The capacitor 3400 is over the insulator 465. The insulator 469 is over the capacitor 3400.

The insulator 464 includes an opening reaching the region 474a, an opening reaching the region 474b, and an opening reaching the conductor 454, in which the conductor 480a, the conductor 480b, and the conductor 480c are embedded, respectively.

In addition, the insulator 466 includes an opening reaching the conductor 480a, an opening reaching the conductor 480b, and an opening reaching the conductor 480c, in which the conductor 478a, the conductor 478b, and the conductor 478c are embedded, respectively.

In addition, the insulator 468 includes an opening reaching the conductor 478a, an opening reaching the conductor 478b, and an opening reaching the conductor 478c, in which the conductor 476a, the conductor 476b, and the conductor 476c are embedded, respectively.

The conductor 479a in contact with the conductor 476a, the conductor 479b in contact with the conductor 476b, and the conductor 479c in contact with the conductor 476c are over the insulator 468. The insulator 472 includes an opening reaching the conductor 479a through the insulator 470, an opening reaching the conductor 479b through the insulator 470, and an opening reaching the conductor 479c through the insulator 470, in which the conductor 477a, the conductor 477b, and the conductor 477c are embedded, respectively.

The insulator 475 includes an opening overlapping with the channel formation region of the transistor 3300, an opening reaching the conductor 477a, an opening reaching the conductor 477b, an opening reaching the conductor 477c, and an opening reaching the insulator 472, in which the conductor 484d, the conductor 484a, the conductor 484b, the conductor 484c, and the conductor 484d are embedded, respectively.

The conductor 484d may function as a bottom gate electrode of the transistor 3300. Alternatively, for example, electrical characteristics such as the threshold voltage of the transistor 3300 may be controlled by application of a constant potential to the conductor 484*d*. Further alternatively, for example, the conductor 484*d* and the top gate electrode of the transistor 3300 may be electrically connected to each other. Thus, the on-state current of the transistor 3300 can be increased. A punch-through phenomenon can be suppressed; thus, stable electrical characteristics in the saturation region of the transistor 3300 can be obtained.

The insulator 428 includes an opening reaching the conductor 484*a* through the insulators 408, 418, 410, 403, and 402, an opening reaching the conductor 484*b* through the insulators 408, 418, 410, 403, and 402, an opening reaching the conductor 484*c* through the insulators 408, 418, 410, 403, and 402, two openings reaching the respective conductors serving as the source and drain electrodes of the transistor 3300 through the insulators 408, 418, and 410, and an opening reaching a conductor of the gate electrode of the transistor 3300 through the insulators 408 and 418. In the openings, the conductors 483*a*, 483*b*, 483*c*, 483*e*, 483*f*, and 483*d* are embedded.

The conductor 485*a* in contact with the conductors 483*a* and 483*e*, the conductor 485*b* in contact with the conductor 483*b*, the conductor 485*c* in contact with the conductor 483*c* and the conductor 483*f*, and the conductor 485*d* in contact with the conductor 483*d* are over the insulator 428. The insulator 465 has an opening reaching the conductor 485*a*, an opening reaching the conductor 485*b*, and an opening reaching the conductor 485*c*, in which the conductor 487*a*, the conductor 487*b*, and the conductor 487*c* are embedded, respectively.

The conductor 488*a* in contact with the conductor 487*a*, the conductor 488*b* in contact with the conductor 487*b*, and the conductor 488*c* in contact with the conductor 487*c* are over the insulator 465. In addition, the insulator 467 includes an opening reaching the conductor 488*a* and an opening reaching the conductor 488*b*, in which the conductor 490*a* and the conductor 490*b* are embedded, respectively. The conductor 488*c* is in contact with the conductor 494 which is one of the electrodes of the capacitor 3400.

The conductor 489*a* in contact with the conductor 490*a* and the conductor 489*b* in contact with the conductor 490*b* are over the insulator 467. The insulator 469 includes an opening reaching the conductor 489*a*, an opening reaching the conductor 489*b*, and an opening reaching the conductor 496 which is the other of the electrodes of the capacitor 3400, in which the conductor 491*a*, the conductor 491*b*, and the conductor 491*c* are embedded, respectively.

The conductor 492*a* in contact with the conductor 491*a*, the conductor 492*b* in contact with the conductor 491*b*, and the conductor 492*c* in contact with the conductor 491*c* are over the insulator 469.

The insulators 464, 466, 468, 470, 472, 475, 402, 403, 410, 418, 408, 428, 465, 467, 469, and 498 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 401 may be formed of, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator that has a function of blocking oxygen and impurities such as hydrogen is preferably included in at least one of the insulators 464, 466, 468, 470, 472, 475, 402, 403, 410, 418, 408, 428, 465, 467, 469, and 498. When an insulator that has a function of blocking oxygen and impurities such as hydrogen is placed near the transistor 3300, the electrical characteristics of the transistor 3300 can be stable.

An insulator with a function of blocking oxygen and impurities such as hydrogen may have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Each of the conductors 480*a*, 480*b*, 480*c*, 478*a*, 478*b*, 478*c*, 476*a*, 476*b*, 476*c*, 479*a*, 479*b*, 479*c*, 477*a*, 477*b*, 477*c*, 484*a*, 484*b*, 484*c*, 484*d*, 483*a*, 483*b*, 483*c*, 483*d*, 483*e*, 483*f*, 485*a*, 485*b*, 485*c*, 485*d*, 487*a*, 487*b*, 487*c*, 488*a*, 488*b*, 488*c*, 490*a*, 490*b*, 489*a*, 489*b*, 491*a*, 491*b*, 491*c*, 492*a*, 492*b*, 492*c*, 494, and 496 may have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound may be used, for example, and a conductor containing aluminum, a conductor containing copper and titanium, a conductor containing copper and manganese, a conductor containing indium, tin, and oxygen, a conductor containing titanium and nitrogen, or the like may be used.

An oxide semiconductor is preferably used as the semiconductor 406*b*. However, silicon (including strained silicon), germanium, silicon germanium, silicon carbide, gallium arsenide, aluminum gallium arsenide, indium phosphide, gallium nitride, an organic semiconductor, or the like can be used in some cases.

As the insulators 406*a* and 406*c*, oxides containing one or more or two or more elements other than oxygen included in the semiconductor 406*b* are preferably used. However, silicon (including strained silicon), germanium, silicon germanium, silicon carbide, gallium arsenide, aluminum gallium arsenide, indium phosphide, gallium nitride, an organic semiconductor, or the like can be used in some cases.

The source or drain of the transistor 3200 is electrically connected to the conductor that is one of the source and drain electrodes of the transistor 3300 through the conductors 480*a*, 478*a*, 476*a*, 479*a*, 477*a*, 484*a*, 483*a*, 485*a*, and 483*e*. The conductor 454 that is the gate electrode of the transistor 3200 is electrically connected to the conductor that is the other of the source and drain electrodes of the transistor 3300 through the conductors 480*c*, 478*c*, 476*c*, 479*c*, 477*c*, 484*c*, 483*c*, 485*c*, and 483*f*.

The capacitor 3400 includes one of the source and drain electrodes of the transistor 3300, the conductor 494 electrically connected to one of the electrodes of the capacitor 3400 through the conductors 483*c*, 485*c*, 487*c*, and 488*c*, the insulator 498, and the conductor 496 that is the other of the electrodes of the capacitor 3400. The capacitor 3400 is preferably formed above or below the transistor 3300 because the semiconductor device can be reduced in size.

For the structures of other components, the description of FIGS. 4A to 4C and the like can be referred to as appropriate.

Figure 34:
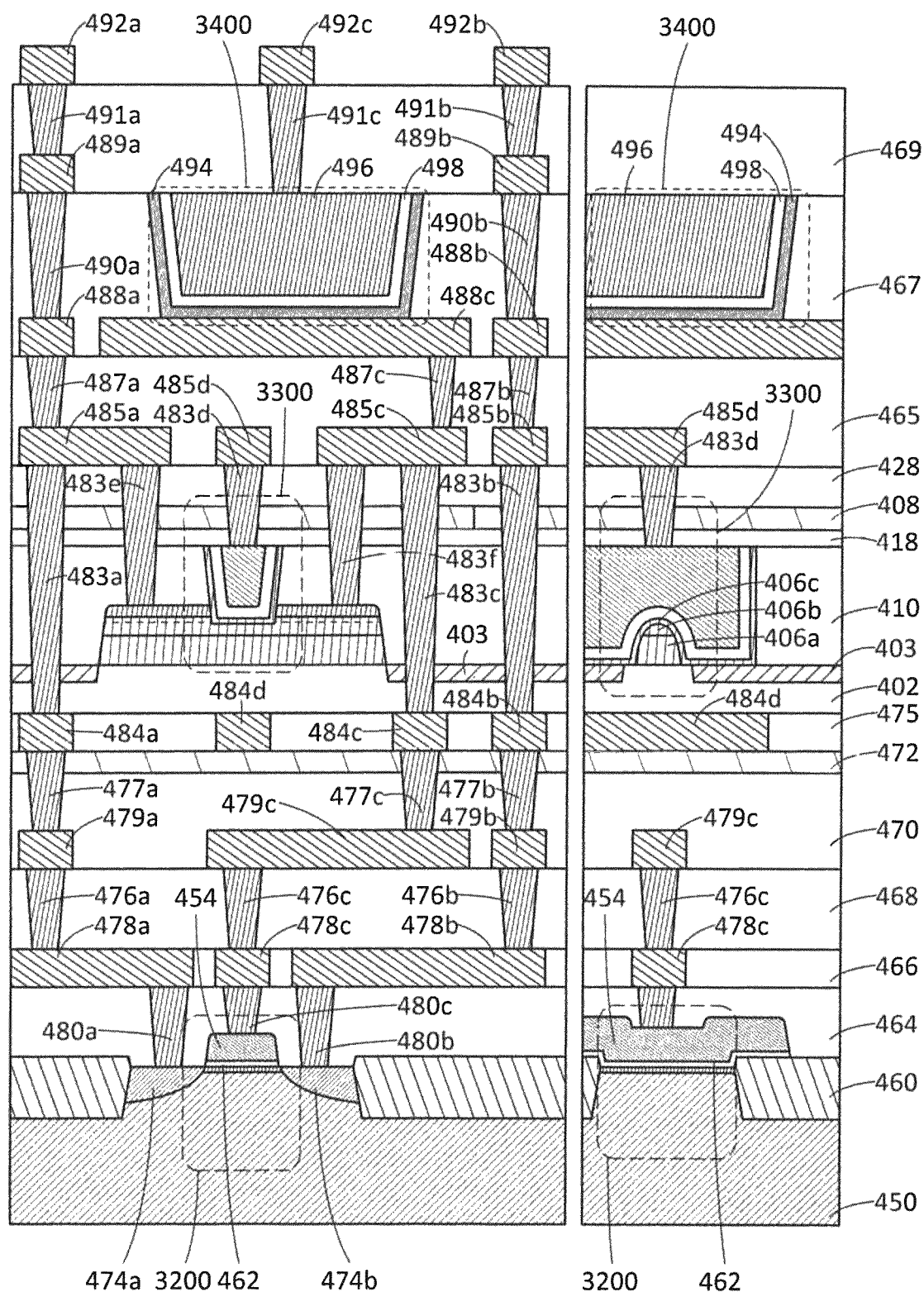
FIG. 34 is a cross-sectional view of a semiconductor device of one embodiment of the present invention.

A semiconductor device in FIG. 34 is the same as the semiconductor device in FIG. 33 except the structure of the transistor 3200. Therefore, the description of the semiconductor device in FIG. 33 is referred to for the semiconductor device in FIG. 34. Specifically, in the semiconductor device in FIG. 34, the transistor 3200 is a planar type transistor. Note that the transistor 3200 may be a p-channel transistor or an n-channel transistor.

Although an example in which the transistor 3300 is over the transistor 3200 and the capacitor 3400 is over the transistor 3300 is shown in Embodiment 4, one or more transistors including a semiconductor similar to that included in the transistor 3300 may be provided over the transistor 3200. With such a structure, the degree of integration of the semiconductor device can be further increased.

<Memory Device 2>

The semiconductor device in FIG. 32B is different from the semiconductor device in FIG. 32A in that the transistor 3200 is not provided. Also in this case, data can be written and retained in a manner similar to that of the semiconductor device in FIG. 32A.

Reading of data in the semiconductor device in FIG. 32B is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the one of the electrodes of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one of the electrodes of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one of the electrodes of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having a low off-state current, the semiconductor device described above can retain stored data for a long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Further, in the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be achieved. At least part of this embodiment can be implemented in combination with any of the other embodiments described in this specification as appropriate.

Embodiment 5

<Structure 2 of Semiconductor Device>

In Embodiment 5, an example of a circuit including the transistor of one embodiment of the present invention is described with reference to drawings.

<Cross-Sectional Structure>

Figure 35A:
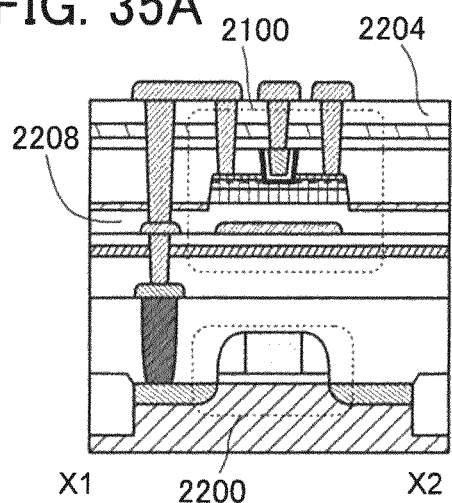
FIGS. 35A to 35F are cross sectional views and circuit diagrams of a semiconductor device of one embodiment of the present invention.
Figure 35B:
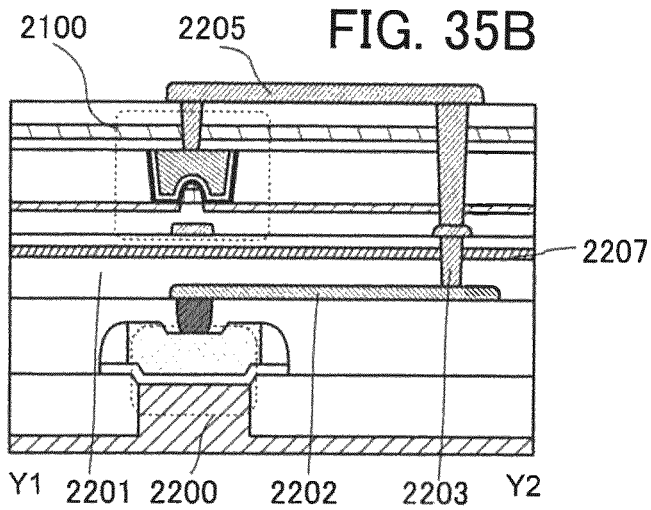

FIGS. 35A and 35B are cross-sectional views of a semiconductor device of one embodiment of the present invention. In FIG. 35A, X1-X2 direction represents a channel length direction, and in FIG. 35B, Y1-Y2 direction represents a channel width direction. The semiconductor device illustrated in FIGS. 35A and 35B includes a transistor 2200 containing a first semiconductor material in a lower portion and a transistor 2100 containing a second semiconductor material in an upper portion. In FIGS. 35A and 35B, an example is illustrated in which the transistor illustrated in FIGS. 4A to 4C is used as the transistor 2100 containing the second semiconductor material.

Here, the first semiconductor material and the second semiconductor material are preferably materials having different band gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at high speed easily. In contrast, a transistor using an oxide semiconductor and described in the above embodiment as an example has excellent sub-threshold characteristics and a minute structure. Furthermore, the transistor can operate at high speed because of its high switching speed and has low leakage current because of its low off-state current.

The transistor 2200 may be either an n-channel transistor or a p-channel transistor, and an appropriate transistor may be used in accordance with a circuit. Furthermore, the specific structure of the semiconductor device, such as the material or the structure used for the semiconductor device, is not necessarily limited to those described here except for the use of the transistor of one embodiment of the present invention which uses an oxide semiconductor.

FIGS. 35A and 35B illustrate a structure in which the transistor 2100 is provided over the transistor 2200 with an insulator 2201, an insulator 2207, and an insulator 2208 provided therebetween. A plurality of wirings 2202 are provided between the transistor 2200 and the transistor 2100. Furthermore, wirings and electrodes provided over and under the insulators are electrically connected to each other through a plurality of plugs 2203 embedded in the insulators. An insulator 2204 covering the transistor 2100 and a wiring 2205 over the insulator 2204 are provided.

The stack of the two kinds of transistors reduces the area occupied by the circuit, allowing a plurality of circuits to be highly integrated.

Here, in the case where a silicon-based semiconductor material is used for the transistor 2200 provided in a lower portion, hydrogen in an insulator provided in the vicinity of a semiconductor film of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulator provided in the vicinity of a semiconductor film of the transistor 2100 becomes a factor of generating carriers in the oxide semiconductor; thus, the reliability of the transistor 2100 might be decreased. Therefore, in the case where the transistor 2100 using an oxide semiconductor is provided over the transistor 2200 using a silicon-based semiconductor material, it is particularly effective that the insulator 2207 having a function of preventing diffusion of hydrogen is provided between the transistors 2100 and 2200. The insulator 2207 makes hydrogen remain in the lower portion, thereby improving the reliability of the transistor 2200. In addition, since the insulator 2207 suppresses diffusion of hydrogen from the lower portion to the upper portion, the reliability of the transistor 2100 can also be improved.

The insulator 2207 can be formed using, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, a blocking film having a function of preventing diffusion of hydrogen is preferably formed over the transistor 2100 including an oxide semiconductor film to cover the transistor 2100. For the blocking film, a material that is similar to that of the insulator 2207 can be used, and in particular, an aluminum oxide film is preferably used. Using the aluminum oxide film, excess oxygen can be added to the insulator under the aluminum oxide film in the deposition, and the excess oxygen moves to the oxide semiconductor layer of the transistor 2100 by heat treatment, which has an effect of repairing a defect in the oxide semiconductor layer. The aluminum oxide film has a high shielding (blocking) effect of preventing transmission of both oxygen and impurities such as hydrogen and moisture. Thus, by using the aluminum oxide film as the blocking film covering the transistor 2100, release of oxygen from the oxide semiconductor film included in the transistor 2100 and entry of water and hydrogen into the oxide semiconductor film can be prevented. Note that as the block film, the insulator 2204 having a stacked-layer structure may be used or the block film may be provided under the insulator 2204.

Note that the transistor 2200 can be a transistor of various types without being limited to a planar type transistor. For example, the transistor 2200 can be a FIN transistor, a TRI-GATE transistor, or the like. An example of a cross-sectional view in this case is shown in FIGS. 35E and 35F. An insulator 2212 is provided over a semiconductor substrate 2211. The semiconductor substrate 2211 includes a projecting portion with a thin tip (also referred to a fin). Note that an insulator may be provided over the projecting portion. The insulator functions as a mask for preventing the semiconductor substrate 2211 from being etched when the projecting portion is formed. The projecting portion does not necessarily have the thin tip; a projecting portion with a cuboid-like projecting portion and a projecting portion with a thick tip are permitted, for example. A gate insulator 2214 is provided over the projecting portion of the semiconductor substrate 2211, and a gate electrode 2213 is provided over the gate insulator 2214. Source and drain regions 2215 are formed in the semiconductor substrate 2211. Note that here is shown an example in which the semiconductor substrate 2211 includes the projecting portion; however, a semiconductor device of one embodiment of the present invention is not limited thereto. For example, a semiconductor region having a projecting portion may be formed by processing an SOI substrate.

At least part of this embodiment can be implemented in combination with any of the other embodiments described in this specification as appropriate.

Embodiment 6

[CMOS Circuit]

Figure 35C:
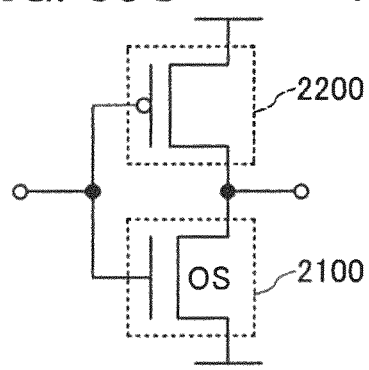

A circuit diagram in FIG. 35C shows a configuration of a so-called CMOS circuit in which a p-channel transistor 2200 and an n-channel transistor 2100 are connected to each other in series and in which gates of them are connected to each other.

[Analog Switch]

Figure 35D:
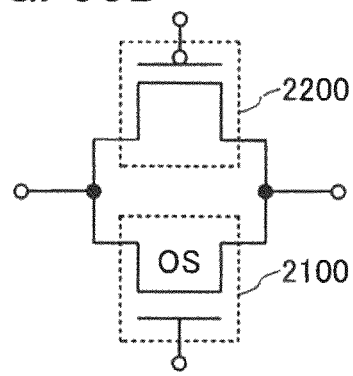
Figure 35E:
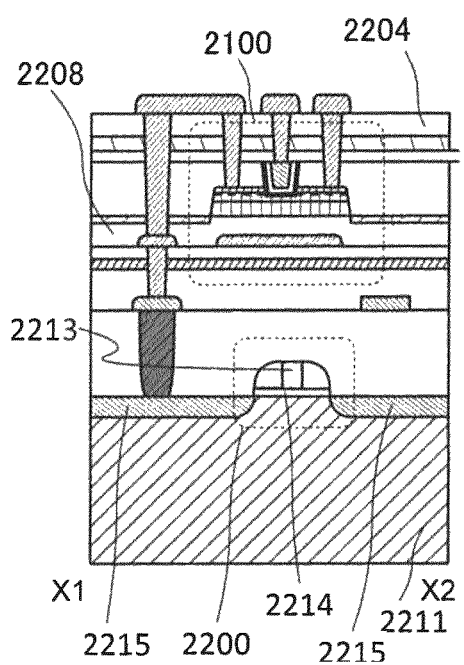
Figure 35F:
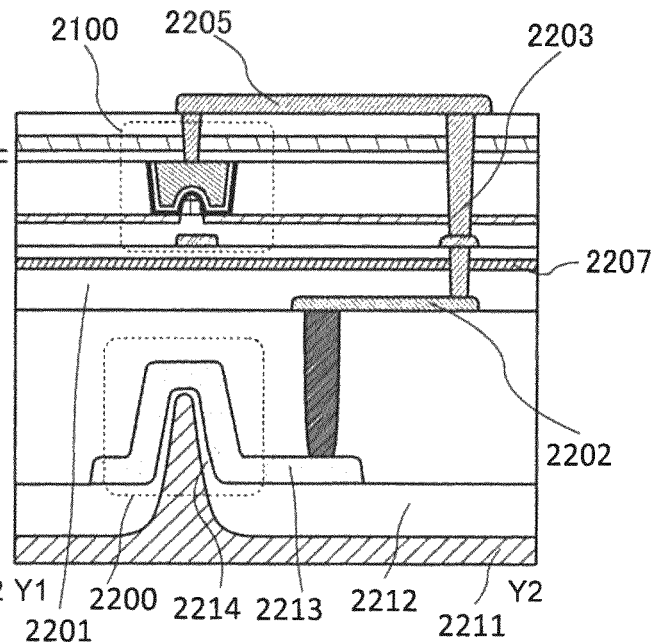

A circuit diagram in FIG. 35D shows a configuration in which sources of the transistors 2100 and 2200 are connected to each other and drains of the transistors 2100 and 2200 are connected to each other. With such a configuration, the transistors can function as a so-called analog switch. At least part of this embodiment can be implemented in combination with any of the other embodiments described in this specification as appropriate.

Embodiment 7

<CPU>

A CPU including a semiconductor device such as any of the above-described transistors or the above-described memory device is described below.

Figure 36:
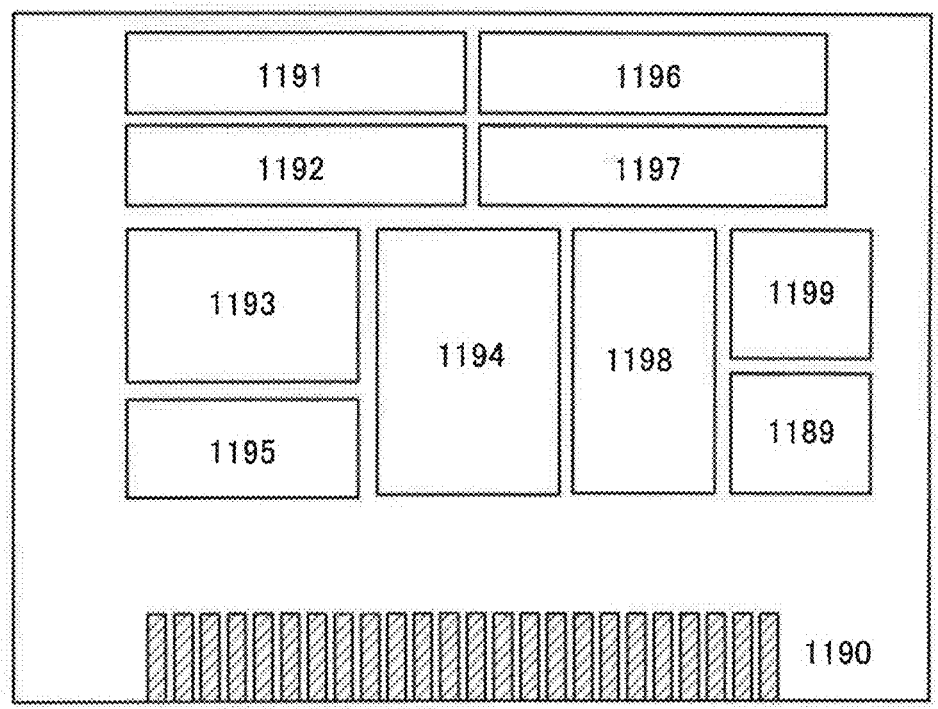
FIG. 36 is a block diagram of a CPU of one embodiment of the present invention.

FIG. 36 is a block diagram illustrating a configuration example of a CPU including any of the above-described transistors as a component.

The CPU illustrated in FIG. 36 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and an ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 36 is just an example of a simplified structure, and an actual CPU may have a variety of structures depending on the application. For example, the CPU may have the following configuration: a structure including the CPU illustrated in FIG. 36 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

In the CPU illustrated in FIG. 36, a memory cell is provided in the register 1196. For the memory cell of the register 1196, any of the above-described transistors, the above-described memory device, or the like can be used.

In the CPU illustrated in FIG. 36, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of the power supply voltage to the memory cell in the register 1196 can be stopped.

Figure 37:
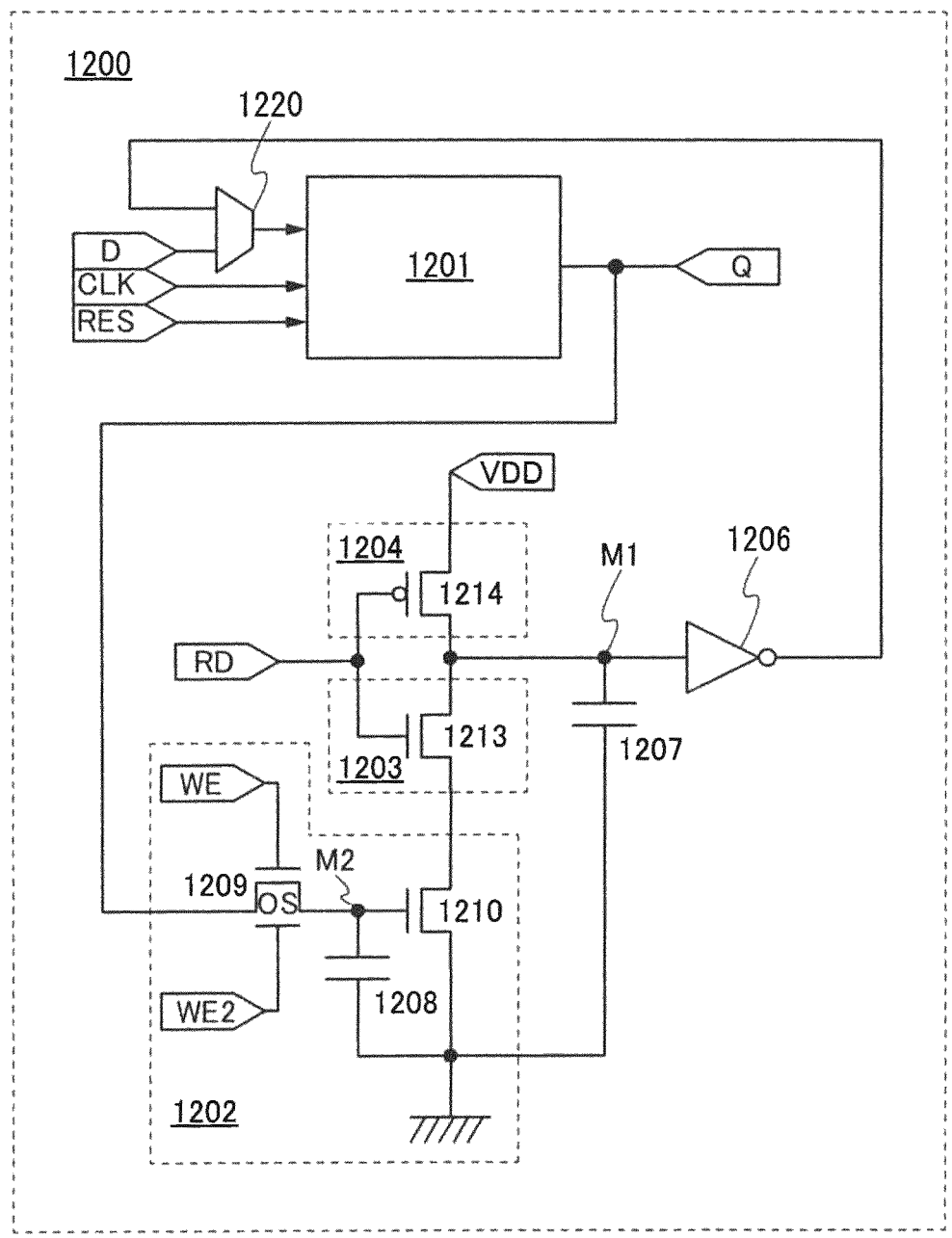
FIG. 37 is a circuit diagram of a memory element of one embodiment of the present invention.

FIG. 37 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the line which can supply a low power supply potential (e.g., a GND line).

The capacitors 1207 and 1208 are not necessarily provided as long as the parasitic capacitance of the transistor, the line, or the like is actively utilized.

A control signal WE is input to a first gate (first gate electrode) of the transistor 1209. As for each of the switches 1203 and 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and drain of the transistor 1209. FIG. 37 illustrates an example in which a signal output from the circuit 1201 is input to the other of the source and drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 37, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 37, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor can be included besides the transistor 1209, and a transistor in which a channel is formed in the substrate 1190 or in a layer including a semiconductor other than an oxide semiconductor can be used for the rest of the transistors.

As the circuit 1201 in FIG. 37, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal retained in the capacitor 1208 for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switches 1203 and 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after a supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By using the above-described memory element 1200 for a memory device such as a register or a cache memory included in a processor, data in the memory device can be prevented from being lost owing to the stop of the supply of the power supply voltage. Further, shortly after the supply of the power supply voltage is restarted, the memory element can be returned to the same state as that before the power supply is stopped. Therefore, the power supply can be stopped even for a short time in the processor or one or a plurality of logic circuits included in the processor. Accordingly, power consumption can be suppressed.

Although the memory element 1200 is used in a CPU in Embodiment 7, the memory element 1200 can also be used in an LSI such as a digital signal processor (DSP), a custom LSI, or a programmable logic device (PLD), and a radio frequency (RF) tag.

At least part of this embodiment can be implemented in combination with any of the other embodiments described in this specification as appropriate.

Embodiment 8

<Imaging Device>

Figure 38A:
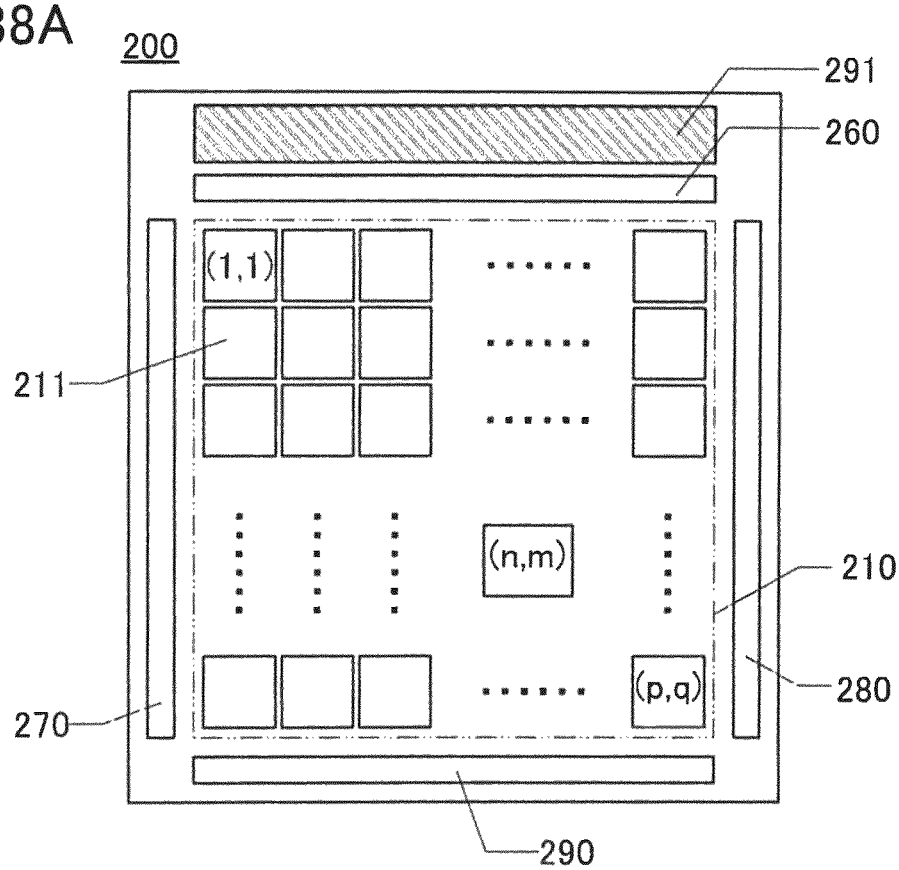
FIGS. 38A and 38B are plan views of an imaging device.

FIG. 38A is a top view illustrating an example of an imaging device 200 of one embodiment of the present invention. The imaging device 200 includes a pixel portion 210 and peripheral circuits for driving the pixel portion 210 (a peripheral circuit 260, a peripheral circuit 270, a peripheral circuit 280, and a peripheral circuit 290). The pixel portion 210 includes a plurality of pixels 211 arranged in a matrix with p rows and q columns (p and q are each a natural number greater than or equal to 2). The peripheral circuits 260, 270, 280, and 290 are each connected to a plurality of pixels 211, and a signal for driving the plurality of pixels 211 is supplied. In this specification and the like, in some cases, a "peripheral circuit" or a "driver circuit" indicates all of the peripheral circuits 260, 270, 280, and 290. For example, the peripheral circuit 260 can be regarded as part of the peripheral circuit.

The imaging device 200 preferably includes a light source 291. The light source 291 can emit detection light P1.

The peripheral circuit includes at least one of a logic circuit, a switch, a buffer, an amplifier circuit, and a converter circuit. The peripheral circuit may be formed over a substrate where the pixel portion 210 is formed. Alternatively, a semiconductor device such as an IC chip may be used as part or the whole of the peripheral circuit. Note that as the peripheral circuit, one or more of the peripheral circuits 260, 270, 280, and 290 may be omitted.

Figure 38B:
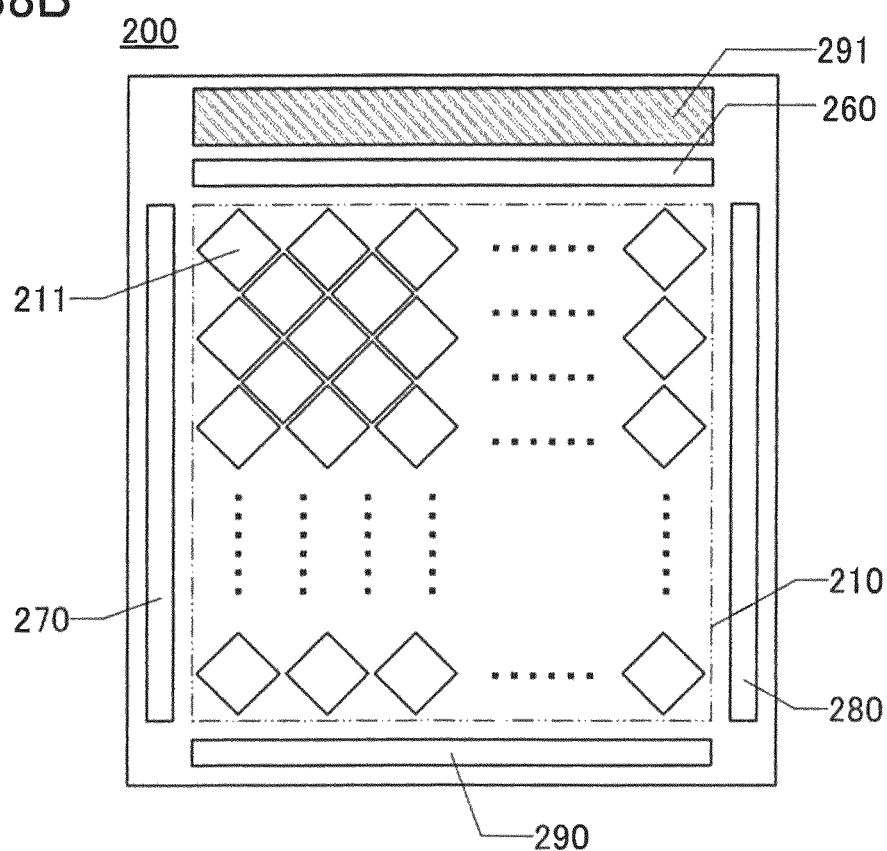

As illustrated in FIG. 38B, the pixels 211 may be provided to be inclined in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.

<Configuration Example 1 of Pixel>

The pixel 211 included in the imaging device 200 is formed with a plurality of subpixels 212, and each subpixel 212 is combined with a filter which transmits light with a specific wavelength band (color filter), whereby data for achieving color image display can be obtained.

Figure 39A:
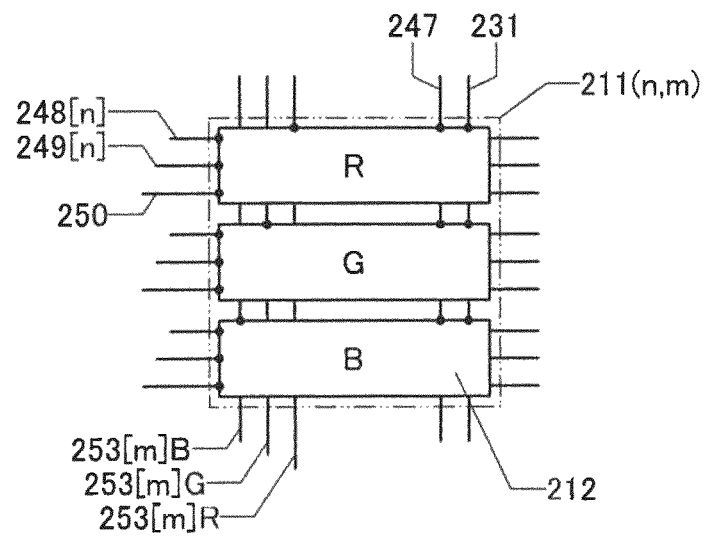
FIGS. 39A and 39B are plan views of pixels of an imaging device.

FIG. 39A is a top view showing an example of the pixel 211 with which a color image is obtained. The pixel 211 illustrated in FIG. 39A includes the subpixel 212 provided with a color filter that transmits light with a red (R) wavelength band (also referred to as a subpixel 212R), a subpixel 212 provided with a color filter that transmits light with a green (G) wavelength band (also referred to as a subpixel 212G), and a subpixel 212 provided with a color filter that transmits light with a blue (B) wavelength band (also referred to as a subpixel 212B). The subpixel 212 can function as a photosensor.

The subpixel 212 (the subpixels 212R, 212G, and 212B) is electrically connected to a wiring 231, a wiring 247, a wiring 248, a wiring 249, and a wiring 250. In addition, the subpixels 212R, 212G, and 212B are connected to respective wirings 253 which are independent from one another. In this specification and the like, for example, the wiring 248 and the wiring 249 that are connected to the pixel 211 in the n-th row are referred to as a wiring 248[$n$] and a wiring 249[$n$], respectively. For example, the wiring 253 connected to the pixel 211 in the m-th column is referred to as a wiring 253[$m$]. Note that in FIG. 39A, the wirings 253 connected to the subpixel 212R, the subpixel 212G, and the subpixel 212B in the pixel 211 in the m-th column are referred to as a wiring 253[$m$]R, a wiring 253[$m$]G, and a wiring 253[$m$]B. The subpixels 212 are electrically connected to the peripheral circuit through the above wirings.

Figure 39B:
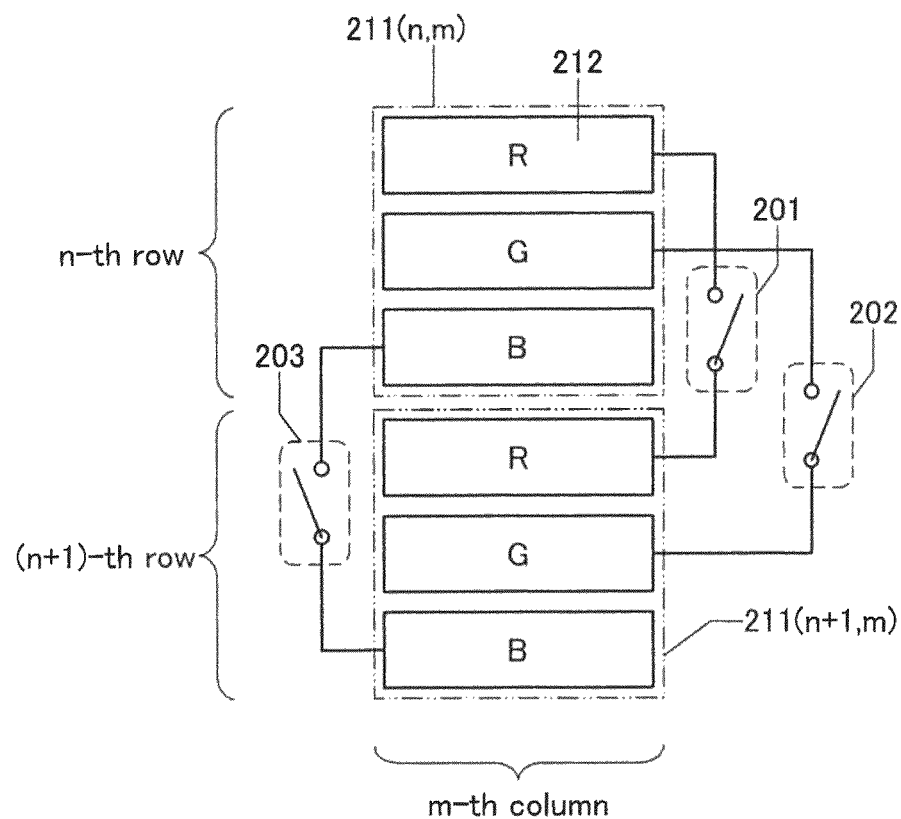

The imaging device 200 has a structure in which the subpixel 212 is electrically connected to the subpixel 212 in an adjacent pixel 211 that is provided with a color filter that transmits light with the same wavelength band as the subpixel 212, via a switch. FIG. 39B shows a connection example of the subpixels 212: the subpixel 212 in the pixel 211 arranged in an n-th (n is an integer greater than or equal to 1 and less than or equal to p) row and an m-th (m is an integer greater than or equal to 1 and less than or equal to q) column and the subpixel 212 in the adjacent pixel 211 arranged in an (n+1)-th row and the m-th column. In FIG. 39B, the subpixel 212R arranged in the n-th row and the m-th column and the subpixel 212R arranged in the (n+1)-th row and the m-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the (n+1)-th row and the m-th column are connected to each other via a switch 203.

The color filter used in the subpixel 212 is not limited to red (R), green (G), and blue (B) color filters, and color filters that transmit light of cyan (C), yellow (Y), and magenta (M) may be used. By provision of the subpixels 212 that sense light with three different wavelength bands in one pixel 211, a full-color image can be obtained.

The pixel 211 including the subpixel 212 provided with a color filter transmitting yellow (Y) light may be provided, in addition to the subpixels 212 provided with the color filters transmitting red (R), green (G), and blue (B) light. The pixel 211 including the subpixel 212 provided with a color filter transmitting blue (B) light may be provided, in addition to the subpixels 212 provided with the color filters transmitting cyan (C), yellow (Y), and magenta (M) light. When the subpixels 212 sensing light with four different wavelength bands are provided in one pixel 211, the reproducibility of colors of an obtained image can be increased.

For example, in FIG. 39A, in regard to the subpixel 212 sensing light in a red wavelength band, the subpixel 212 sensing light in a green wavelength band, and the subpixel 212 sensing light in a blue wavelength band, the pixel number ratio (or the light receiving area ratio) thereof is not necessarily 1:1:1. For example, it is possible to employ the Bayer arrangement, in which the ratio of the number of pixels (the ratio of light-receiving areas) of red to green and blue is 1:2:1. Alternatively, the pixel number ratio (the ratio of light receiving area) of red to green and blue may be 1:6:1.

Although the number of subpixels 212 provided in the pixel 211 may be one, two or more subpixels are preferably provided. For example, when two or more subpixels 212 sensing light in the same wavelength band are provided, the redundancy is increased, and the reliability of the imaging device 200 can be increased.

When an infrared (IR) filter that transmits infrared light and absorbs or reflects visible light is used as the filter, the imaging device 200 that senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 211 may be provided with a lens. An arrangement example of the pixel 211, a filter 254, and a lens 255 is described with cross-sectional views in FIGS. 40A and 40B. With the lens 255, the photoelectric conversion element can receive incident light efficiently. Specifically, as illustrated in FIG. 40A, light 256 enters a photoelectric conversion element 220 through the lens 255, the filter 254 (a filter 254R, a filter 254G, and a filter 254B), a pixel circuit 230, and the like which are provided in the pixel 211.

However, part of the light 256 indicated by arrows might be blocked by some wirings 257 as indicated by a region surrounded with dashed-dotted lines. Thus, a preferable structure is such that the lens 255 and the filter 254 are provided on the photoelectric conversion element 220 side as illustrated in FIG. 40B, whereby the photoelectric conversion element 220 can efficiently receive the light 256. When the light 256 enters the photoelectric conversion element 220 from the photoelectric conversion element 220 side, the imaging device 200 with high sensitivity can be provided.

Figure 40A:
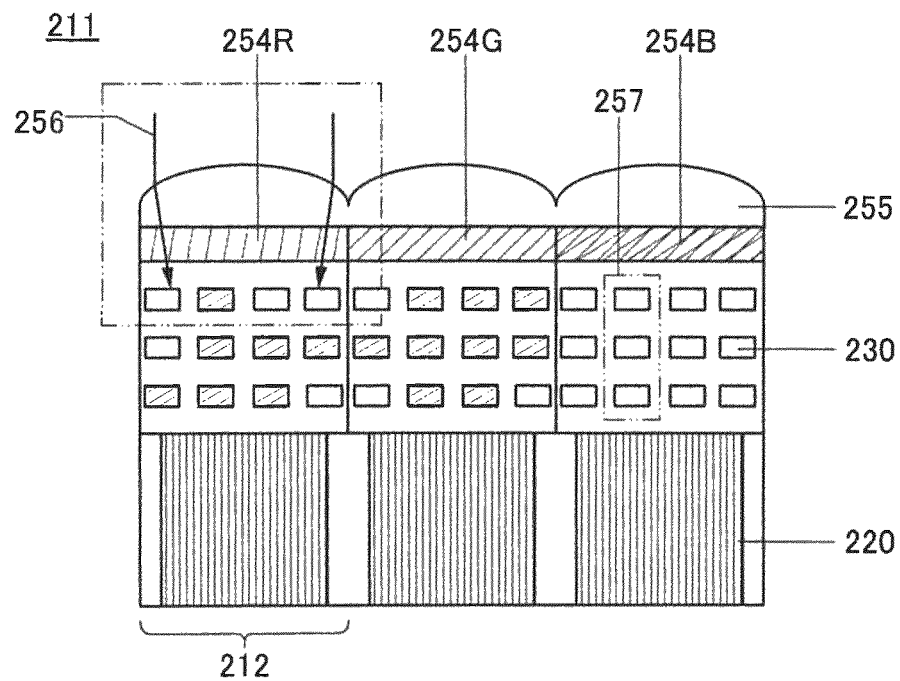
FIGS. 40A and 40B are cross-sectional views of an imaging device.
Figure 40B:
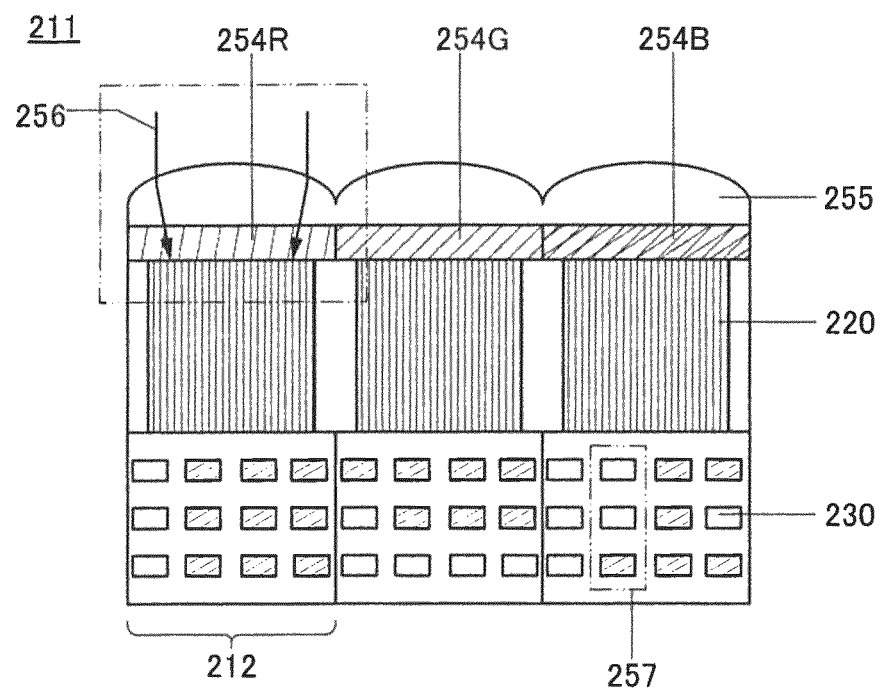

As the photoelectric conversion element 220 illustrated in FIGS. 40A and 40B, a photoelectric conversion element in which a p-n junction or a p-i-n junction is formed may be used.

The photoelectric conversion element 220 may be formed using a substance that has a function of absorbing a radiation and generating electric charges. Examples of the substance that has a function of absorbing a radiation and generating electric charges include selenium, lead iodide, mercury iodide, gallium arsenide, cadmium telluride, and cadmium zinc alloy.

For example, when selenium is used for the photoelectric conversion element 220, the photoelectric conversion element 220 can have a light absorption coefficient in a wide wavelength range, such as visible light, ultraviolet light, infrared light, X-rays, and gamma rays.

One pixel 211 included in the imaging device 200 may include the subpixel 212 with a first filter in addition to the subpixel 212 illustrated in FIGS. 40A and 40B.

<Configuration Example 2 of Pixel>

An example of a pixel including a transistor using silicon and a transistor using an oxide semiconductor of one embodiment of the present invention is described below.

Figure 41A:
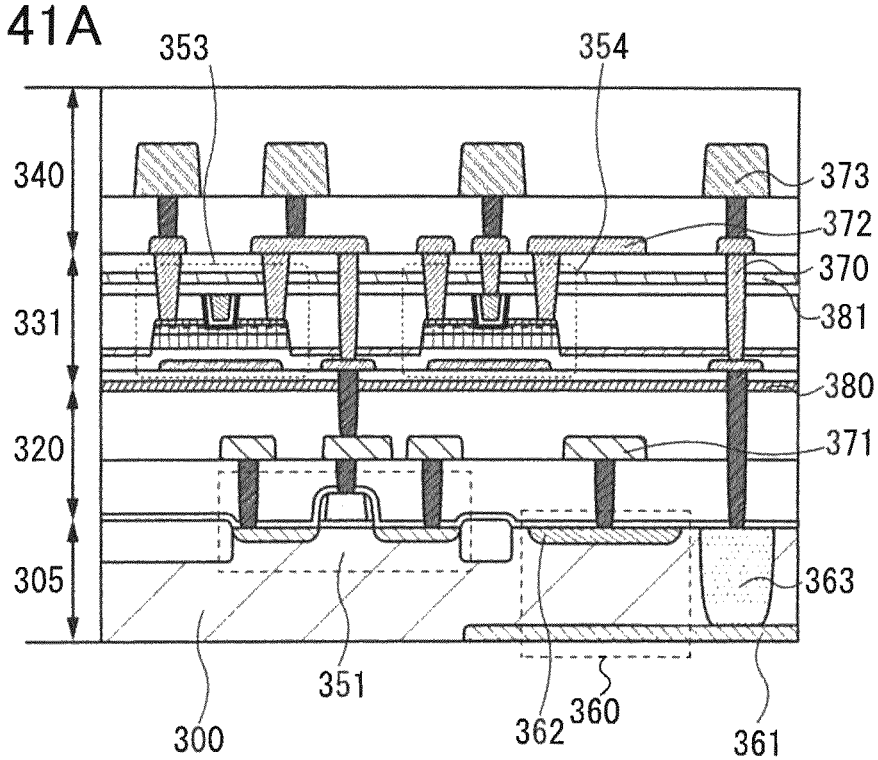
FIGS. 41A and 41B are cross-sectional views of an imaging device.
Figure 41B:
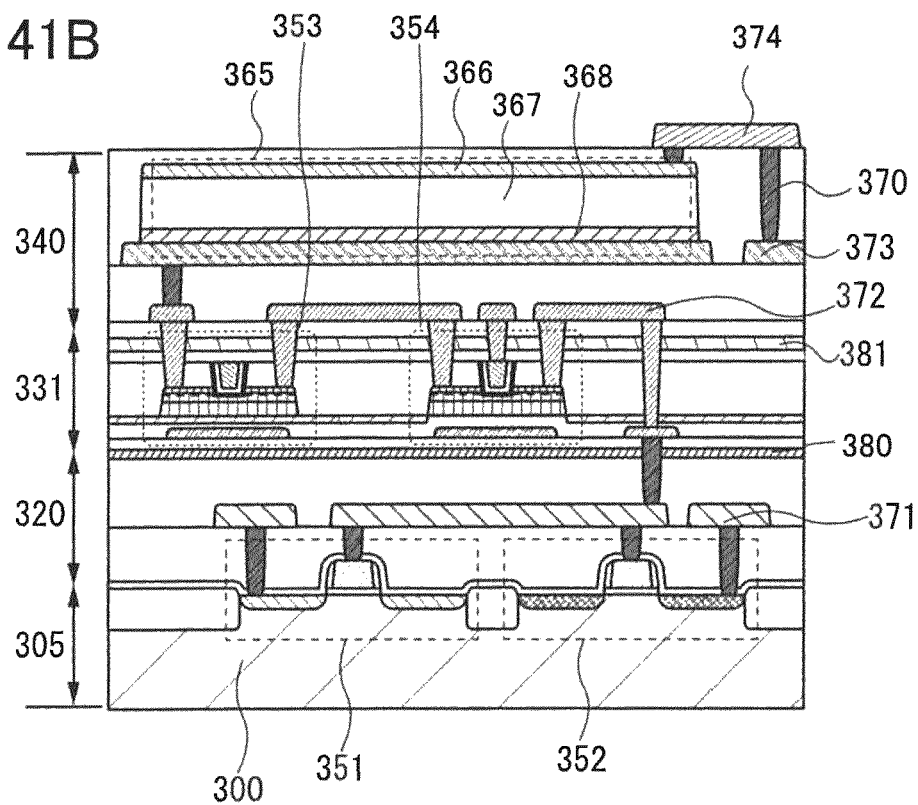

FIGS. 41A and 41B are each a cross-sectional view of an element included in an imaging device.

The imaging device illustrated in FIG. 41A includes a transistor 351 including silicon over a silicon substrate 300, transistors 353 and 354 which include an oxide semiconductor and are stacked over the transistor 351, and a photodiode 360 provided in the silicon substrate 300 and including an anode 361 and a cathode 362. The transistors and the photodiode 360 are electrically connected to various plugs 370 and wirings 371. In addition, the anode 361 of the photodiode 360 is electrically connected to the plug 370 through a low-resistance region 363.

The imaging device includes a layer 305 including the transistor 351 provided on the silicon substrate 300 and the photodiode 360 provided in the silicon substrate 300, a layer 320 which is in contact with the layer 305 and includes the wirings 371, a layer 331 which is in contact with the layer 320 and includes the transistors 353 and 354, and a layer 340 which is in contact with the layer 331 and includes a wiring 372 and a wiring 373.

Note that in the example of the cross-sectional view in FIG. 41A, a light-receiving surface of the photodiode 360 is provided on the side opposite to a surface of the silicon substrate 300 where the transistor 351 is formed. With the structure, an optical path can be obtained without the influence by the transistors or wirings, and therefore, a pixel with a high aperture ratio can be formed. Note that the light-receiving surface of the photodiode 360 can be the same as the surface where the transistor 351 is formed.

In the case where a pixel is formed with the use of transistors using an oxide semiconductor, the layer 305 may include the transistor using an oxide semiconductor. Alternatively, the layer 305 may be omitted, and the pixel may include only transistors using an oxide semiconductor.

In addition, in the cross-sectional view in FIG. 41A, the photodiode 360 in the layer 305 and the transistor in the layer 331 can be formed so as to overlap with each other. Thus, the degree of integration of pixels can be increased. In other words, the resolution of the imaging device can be increased.

An imaging device illustrated in FIG. 41B includes a photodiode 365 in the layer 340 and over the transistors. In FIG. 41B, the layer 305 includes the transistor 351 and a transistor 352 using silicon, the layer 320 includes the wiring 371, the layer 331 includes the transistors 353 and 354 using an oxide semiconductor layer, the layer 340 includes the photodiode 365. The photodiode 365 includes a semiconductor layer 366, a semiconductor layer 367, and a semiconductor layer 368, and is electrically connected to the wiring 373, and a wiring 374 through the plug 370.

The element structure illustrated in FIG. 41B can increase the aperture ratio.

Alternatively, a PIN diode element formed using an amorphous silicon film, a microcrystalline silicon film, or the like may be used as the photodiode 365. In the photodiode 365, an n-type semiconductor layer 368, an i-type semiconductor layer 367, and a p-type semiconductor layer 366 are stacked in this order. The i-type semiconductor layer 367 is preferably formed using amorphous silicon. The p-type semiconductor layer 366 and the n-type semiconductor layer 368 can each be formed using amorphous silicon, microcrystalline silicon, or the like which includes a dopant imparting the corresponding conductivity type. The photodiode 365 in which a photoelectric conversion layer is formed using amorphous silicon has high sensitivity in a visible light wavelength region, and therefore can easily sense weak visible light.

Here, an insulator 380 is provided between the layer 305 including the transistor 351 and the photodiode 360 and the layer 331 including the transistors 353 and 354. However, there is no limitation on the position of the insulator 380.

Hydrogen in an insulator provided in the vicinity of a channel formation region of the transistor 351 terminates dangling bonds of silicon; accordingly, the reliability of the transistor 351 can be improved. In contrast, hydrogen in the insulator provided in the vicinity of the transistors 353 and 354 and the like becomes one of factors generating a carrier in the oxide semiconductor. Thus, the hydrogen may cause a reduction of the reliability of the transistor 354, the transistor 354, and the like. Therefore, in the case where the transistor using an oxide semiconductor is provided over the transistor using a silicon-based semiconductor, it is preferable that the insulator 380 having a function of blocking hydrogen be provided between the transistors. When the hydrogen is confined below the insulator 380, the reliability of the transistor 351 can be improved. In addition, the hydrogen can be prevented from being diffused from a part below the insulator 380 to a part above the insulator 380; thus, the reliability of the transistors 353 and 354 and the like can be increased. It is preferable to form the insulator 381 over the transistors 353 and 354 because oxygen diffusion can be prevented in the oxide semiconductor.

At least part of this embodiment can be implemented in combination with any of the other embodiments described in this specification as appropriate.

Embodiment 9

<RF Tag>

In Embodiment 9, an RF tag that includes the transistor described in the above embodiments or the memory device described in the above embodiment is described with reference to FIG. 42.

The RF tag of this embodiment includes a memory circuit, stores necessary data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have extremely high reliability in order to be used for this purpose.

A configuration of the RF tag will be described with reference to FIG. 42. FIG. 42 is a block diagram illustrating a configuration example of an RF tag.

Figure 42:
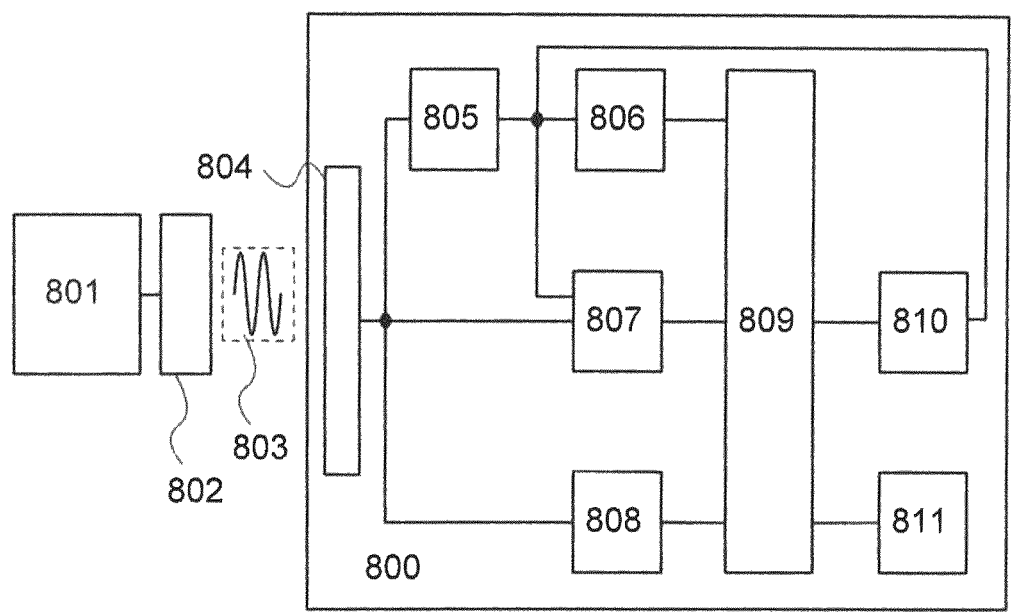
FIG. 42 illustrates a configuration example of an RF tag.

As shown in FIG. 42, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800 described in this embodiment.

Next, a structure of each circuit is described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Further, the ROM 811 stores an identification number (ID) or the like and outputs it in accordance with processing.

Note that the decision whether each circuit described above is provided or not can be made as appropriate as needed.

Here, the memory circuit described in the above embodiment can be used as the memory circuit 810. Since the memory circuit of one embodiment of the present invention can retain data even when not powered, the memory circuit can be favorably used for an RF tag. Furthermore, the memory circuit of one embodiment of the present invention needs power (voltage) needed for data writing significantly lower than that needed in a conventional nonvolatile memory; thus, it is possible to prevent a difference between the maximum communication range in data reading and that in data writing. Furthermore, it is possible to suppress malfunction or incorrect writing which is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management corresponding to the shipped products is easily performed.

This embodiment can be combined as appropriate with any of the other embodiments in this specification.

Embodiment 10

<Display Device>

A display device of one embodiment of the present invention is described below with reference to FIGS. 43A to 43C and FIGS. 44A and 44B.

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

Figure 43A:
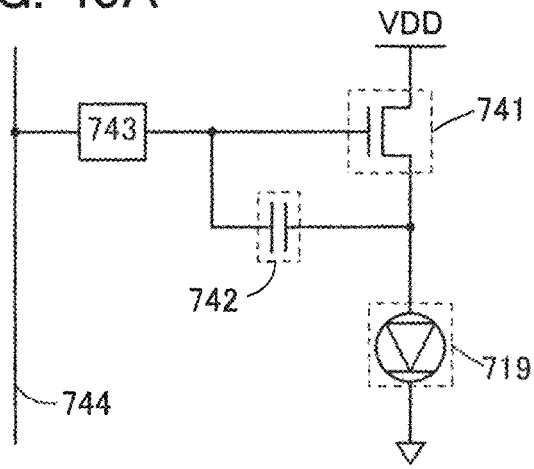
FIGS. 43A to 43C are a circuit diagram, a top view, and a cross-sectional view of a semiconductor device of one embodiment of the present invention.
Figure 43B:
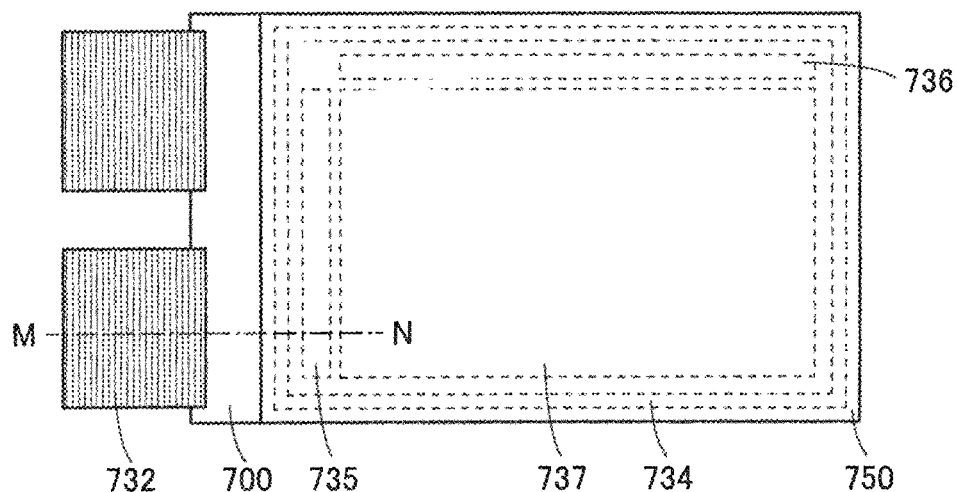
Figure 43C:
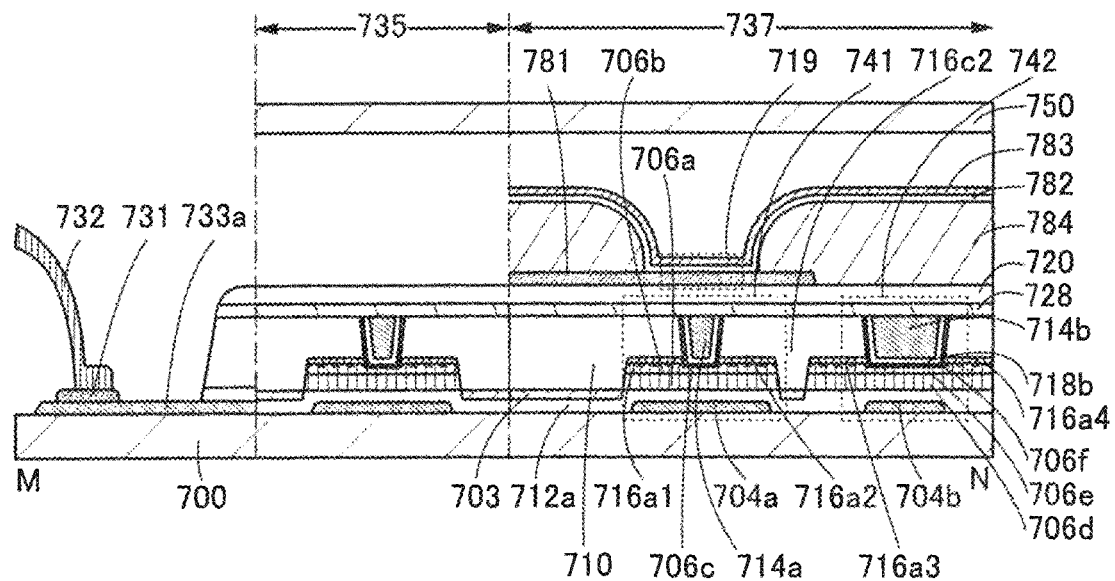

FIGS. 43A to 43C illustrate an example of an EL display device of one embodiment of the present invention. FIG. 43A is a circuit diagram of a pixel in an EL display device. FIG. 43B is a top view showing the whole of the EL display device. FIG. 43C is a cross-sectional view taken along part of dashed-dotted line M-N in FIG. 43B.

FIG. 43A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Further, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 43A includes a switching element 743, a transistor 741, a capacitor 742, and a light-emitting element 719.

Note that FIG. 43A and the like each illustrate an example of a circuit configuration; therefore, a transistor can be provided additionally. In contrast, for each node in FIG. 43A and the like, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A power supply potential VDD is supplied to a drain of the transistor 741. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same steps as the transistor 741 can be used, so that EL display devices can be manufactured with high productivity. Note that as the transistor 741 and/or the switching element 743, the transistor illustrated in FIGS. 4A to 4C can be used, for example.

FIG. 43B is a top view of the EL display device. The EL display device includes a substrate 700, a substrate 750, a sealant 734, a driver circuit 735, a driver circuit 736, a pixel 737, and an FPC 732. The sealant 734 is provided between the substrates 700 and 750 so as to surround the pixel 737 and the driver circuits 735 and 736. Note that the driver circuit(s) 735 and/or 736 may be provided outside the sealant 734.

FIG. 43C is a cross-sectional view of the EL display device taken along part of dashed-dotted line M-N in FIG. 43B.

FIG. 43C illustrates a structure of the transistor 741 including an insulator 712a over the substrate 700; a conductor 704a; an insulator 703 over the insulator 712a, an insulator 706a that is over the insulator 712a and the conductor 704a and partly overlaps with the conductor 704a; a semiconductor 706b over the insulator 706a; conductors 716a1 and 716a2 in contact with a top surface of the semiconductor 706b; an insulator 710 over the conductors 716a1 and 716a2; an insulator 706c over the semiconductor 706b; an insulator 718b over the insulator 706c; and a conductor 714a that is over the insulator 718b and overlaps with the semiconductor 706b. Note that the structure of the transistor 741 is just an example; the transistor 741 may have a structure different from that illustrated in FIG. 43C.

In the transistor 741 illustrated in FIG. 43C, the conductor 704a functions as a gate electrode, the insulator 712a functions as a gate insulator, the conductor 716a1 functions as a source electrode, the conductor 716a2 functions as a drain electrode, the insulator 718b functions as a gate insulator, and the conductor 714a functions as a gate electrode. Note that in some cases, electrical characteristics of the insulator 706a, the semiconductor 706b, and the insulator 706c change if light enters the insulator 706a, the semiconductor 706b, and the insulator 706c. To prevent this, it is preferable that one or more of the conductors 704a, 716a1, 716a2, and 714a have a light-blocking property.

FIG. 43C illustrates a structure of the capacitor 742 including an insulator 706d that is over a conductor 704b and partly overlaps with the conductor 704b; a semiconductor 706e over the insulator 706d; conductors 716a3 and 716a4 in contact with a top surface of the semiconductor 706e; the insulator 710 over the conductors 716a3 and 716a4; an insulator 706f over the semiconductor 706e; the insulator 718b over the insulator 706f; and a conductor 714b that is over the insulator 718b and overlaps with the semiconductor 706e.

In the capacitor 742, the conductor 704b functions as one electrode and the conductor 714b functions as the other electrode.

Thus, the capacitor 742 can be formed using a film of the transistor 741. The conductor 704a and the conductor 704b are preferably conductors of the same kind, in which case the conductor 704a and the conductor 704b can be formed through the same step.

Furthermore, the conductor 714a and the conductor 714b are preferably conductors of the same kind, in which case the conductor 714a and the conductor 714b can be formed through the same step.

The capacitor 742 illustrated in FIG. 43C has a large capacitance per area occupied by the capacitor. Therefore, the EL display device illustrated in FIG. 43C has high display quality. Note that the structure of the capacitor 742 is just an example and may be different from that illustrated in FIG. 43C.

An insulator 728 is provided over the transistor 741 and the capacitor 742, and an insulator 720 is provided over the insulator 728. Here, the insulator 728 and the insulator 720 may have an opening reaching the conductor 716a1 that functions as the source electrode of the transistor 741. A conductor 781 is provided over the insulator 720. The conductor 781 may be electrically connected to the transistor 741 through the opening in the insulators 728 and 720.

A partition wall 784 having an opening reaching the conductor 781 is provided over the conductor 781. A light-emitting layer 782 in contact with the conductor 781 through the opening provided in the partition wall 784 is provided over the partition wall 784. A conductor 783 is provided over the light-emitting layer 782. A region where the conductor 781, the light-emitting layer 782, and the conductor 783 overlap with one another functions as the light-emitting element 719.

So far, examples of the EL display device are described. Next, an example of a liquid crystal display device is described.

Figure 44A:
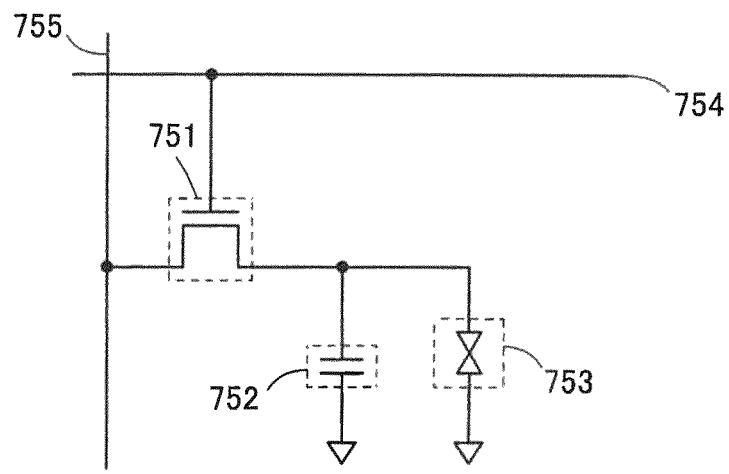
FIGS. 44A and 44B are a circuit diagram and a cross-sectional view of a semiconductor device of one embodiment of the present invention.

FIG. 44A is a circuit diagram showing a structural example of a pixel of the liquid crystal display device. A pixel illustrated in FIG. 44A includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring for supplying a common potential.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the other electrode of the liquid crystal element 753.

Figure 44B:
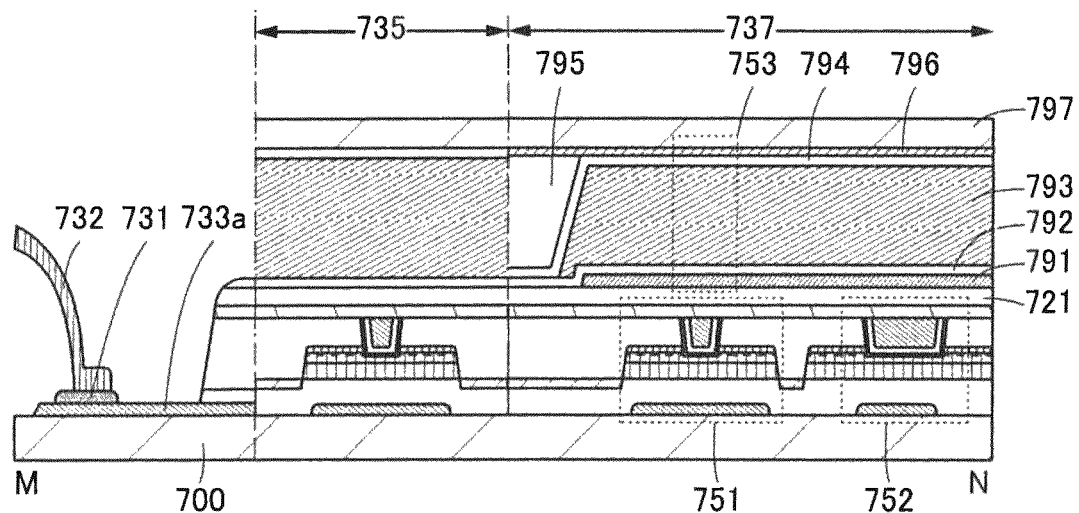

Note the description of the liquid crystal display device is made on the assumption that the top view of the liquid crystal display device is similar to that of the EL display device. FIG. 44B is a cross-sectional view of the liquid crystal display device taken along dashed-dotted line M-N in FIG. 43B. In FIG. 44B, the FPC 732 is connected to a wiring 733a via a terminal 731. Note that the wiring 733a may be formed using the same kind of conductor as the conductor of the transistor 751 or using the same kind of semiconductor as the semiconductor of the transistor 751.

For the transistor 751, the description of the transistor 741 is referred to. For the capacitor 752, the description of the capacitor 742 is referred to. Note that the structure of the capacitor 752 in FIG. 44B corresponds to, but is not limited to, the structure of the capacitor 742 in FIG. 43C.

Note that in the case where an oxide semiconductor is used as the semiconductor of the transistor 751, the off-state current of the transistor 751 can be extremely small. Therefore, an electric charge retained in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 is provided over the transistor 751 and the capacitor 752. Although not illustrated, an opening reaching the transistor 751 is provided in the insulator 721. A conductor 791 is provided over the insulator 721. The conductor 791 is electrically connected to the transistor 751 through the opening in the insulator 721.

An insulator 792 functioning as an alignment film is provided over the conductor 791. A liquid crystal layer 793 is provided over the insulator 792. An insulator 794 functioning as an alignment film is provided over the liquid crystal layer 793. A spacer 795 is provided over the insulator 794. A conductor 796 is provided over the spacer 795 and the insulator 794. A substrate 797 is provided over the conductor 796.

Owing to the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. The display element, the display device, the light-emitting element, or the light-emitting device includes at least one of an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, a display element including a carbon nanotube, and the like. Other than the above, display media whose contrast, luminance, reflectivity, transmittance, or the like is changed by electrical or magnetic effect may be included.

Note that examples of display devices having EL elements include an EL display. Examples of display devices including electron emitters include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of display devices having electronic ink or electrophoretic elements include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an AlN layer may be provided between the n-type GaN semiconductor including crystals and graphene or graphite. The GaN semiconductors included in the LED may be formed by MOCVD. Note that when the graphene is provided, the GaN semiconductors included in the LED can also be formed by a sputtering method.

This embodiment can be combined as appropriate with any of the other embodiments in this specification.

Embodiment 11

In Embodiment 11, a display module using a semiconductor device of one embodiment of the present invention is described with reference to FIG. 45.

<Display Module>

Figure 45:
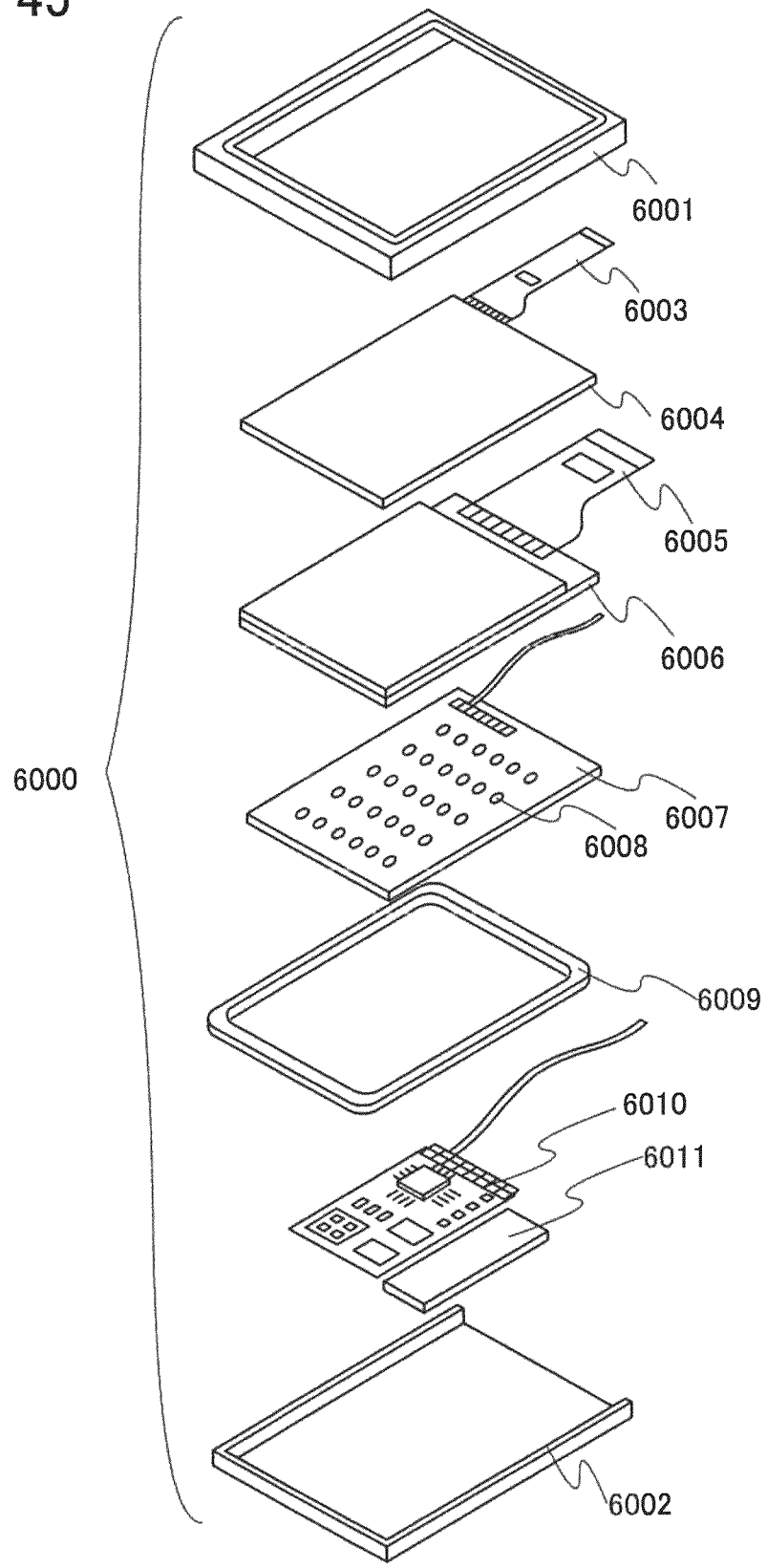
FIG. 45 illustrates a display module.

In a display module 6000 in FIG. 45, a touch panel 6004 connected to an FPC 6003, a display panel 6006 connected to an FPC 6005, a backlight unit 6007, a frame 6009, a printed board 6010, and a battery 6011 are provided between an upper cover 6001 and a lower cover 6002. Note that the backlight unit 6007, the battery 6011, the touch panel 6004, and the like are not provided in some cases.

The semiconductor device of one embodiment of the present invention can be used for, for example, the display panel 6006 and an integrated circuit mounted on a printed board.

The shapes and sizes of the upper cover 6001 and the lower cover 6002 can be changed as appropriate in accordance with the sizes of the touch panel 6004 and the display panel 6006.

The touch panel 6004 can be a resistive touch panel or a capacitive touch panel and may be formed to overlap with the display panel 6006. A counter substrate (sealing substrate) of the display panel 6006 can have a touch panel function. A photosensor may be provided in each pixel of the display panel 6006 so that an optical touch panel function is added. An electrode for a touch sensor may be provided in each pixel of the display panel 6006 so that a capacitive touch panel function is added.

The backlight unit 6007 includes a light source 6008. The light source 6008 may be provided at an end portion of the backlight unit 6007 and a light diffusing plate may be used.

The frame 6009 protects the display panel 6006 and also functions as an electromagnetic shield for blocking electromagnetic waves generated from the printed board 6010. The frame 6009 may function as a radiator plate.

The printed board 6010 has a power supply circuit and a signal processing circuit for outputting a video signal and a clock signal. As a power source for supplying power to the power supply circuit, an external commercial power source or the battery 6011 provided separately may be used. Note that the battery 6011 is not necessary in the case where a commercial power source is used.

The display module 6000 can be additionally provided with a member such as a polarizing plate, a retardation plate, or a prism sheet.

This embodiment can be combined as appropriate with any of the other embodiments and an example in this specification.

Embodiment 12

<Package Using a Lead Frame Interposer>

Figure 46A:
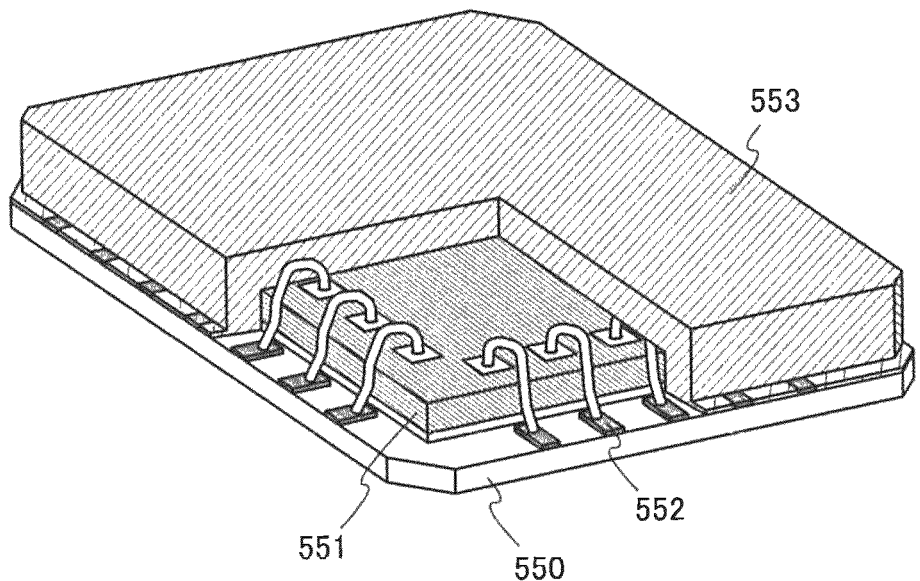
FIGS. 46A and 46B are perspective views illustrating a cross-sectional structure of a package using a lead frame interposer.

FIG. 46A is a perspective view illustrating a cross-sectional structure of a package using a lead frame interposer. In the package illustrated in FIG. 46A, a chip 551 corresponding to the semiconductor device of one embodiment of the present invention is connected to a terminal 552 over an interposer 550 by wire bonding. The terminal 552 is placed on a surface of the interposer 550 on which the chip 551 is mounted. The chip 551 may be sealed by a mold resin 553, in which case the chip 551 is sealed such that part of each of the terminals 552 is exposed.

Figure 46B:
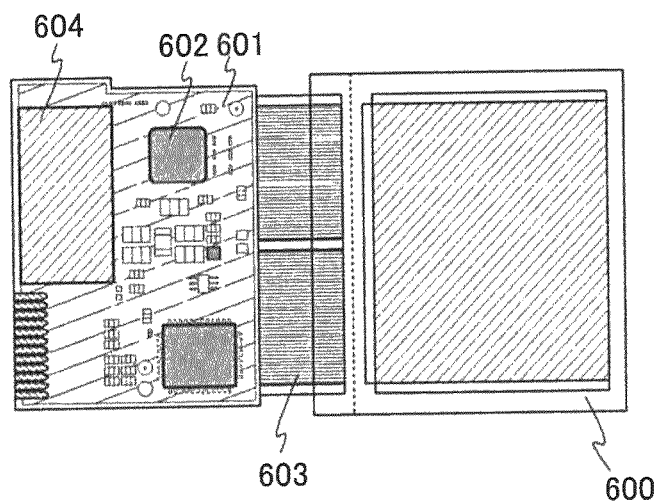

FIG. 46B illustrates the structure of a module of an electronic device (mobile phone) in which a package is mounted on a circuit board. In the module of the mobile phone in FIG. 46B, a package 602 and a battery 604 are mounted on a printed wiring board 601. The printed wiring board 601 is mounted on a panel 600 including a display element by an FPC 603.

This embodiment can be combined as appropriate with any of the other embodiments in this specification.

Embodiment 13

In Embodiment 13, electronic devices and lighting devices of one embodiment of the present invention are described with reference to drawings.

<Electronic Device>

Electronic devices and lighting devices can be manufactured using the semiconductor device of one embodiment of the present invention. In addition, highly reliable electronic devices and lighting devices can be manufactured using the semiconductor device of one embodiment of the present invention. Furthermore, electronic devices and lighting devices including touch sensors with improved detection sensitivity can be manufactured using the semiconductor device of one embodiment of the present invention.

Examples of electronic devices include a television set (also referred to as a television or a television receiver), a monitor of a computer or the like, a digital camera, a digital video camera, a digital photo frame, a mobile phone (also referred to as a mobile phone device), a portable game machine, a portable information terminal, an audio reproducing device, a large game machine such as a pinball machine, and the like.

In the case of having flexibility, the electronic device or lighting device of one embodiment of the present invention can be incorporated along a curved inside/outside wall surface of a house or a building or a curved interior/exterior surface of a car.

Furthermore, the electronic device of one embodiment of the present invention may include a secondary battery. It is preferable that the secondary battery be capable of being charged by non-contact power transmission.

As examples of the secondary battery, a lithium ion secondary battery such as a lithium polymer battery (lithium ion polymer battery) using a gel electrolyte, a lithium ion battery, a nickel-hydride battery, a nickel-cadmium battery, an organic radical battery, a lead-acid battery, an air secondary battery, a nickel-zinc battery, and a silver-zinc battery can be given.

The electronic device of one embodiment of the present invention may include an antenna. When a signal is received by the antenna, the electronic device can display an image, data, or the like on a display portion. When the electronic device includes a secondary battery, the antenna may be used for contactless power transmission.

Figure 47A:
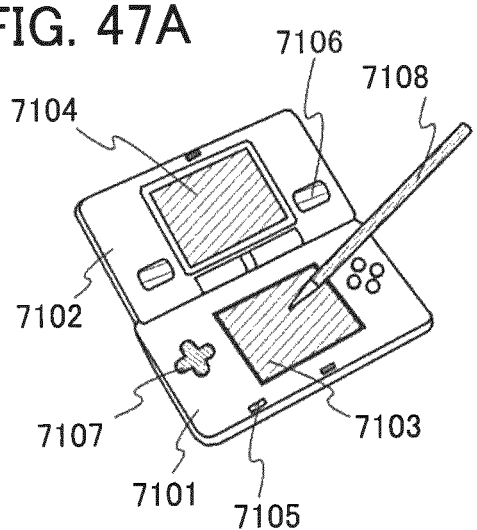
FIGS. 47A to 47E each illustrate an electronic device of one embodiment of the present invention.

FIG. 47A illustrates a portable game machine including housings 7101 and 7102, a display portion 7103, a display portion 7104, a microphone 7105, speakers 7106, an operation key 7107, a stylus 7108, and the like. The semiconductor device of one embodiment of the present invention can be used for an integrated circuit, a CPU, or the like incorporated in the housing 7101. When the light-emitting device of one embodiment of the present invention is used as the display portion 7103 or 7104, it is possible to provide a user-friendly portable game machine with quality that hardly deteriorates. Although the portable game machine illustrated in FIG. 47A includes two display portions, the display portion 7103 and the display portion 7104, the number of display portions included in the portable game machine is not limited to two.

Figure 47B:
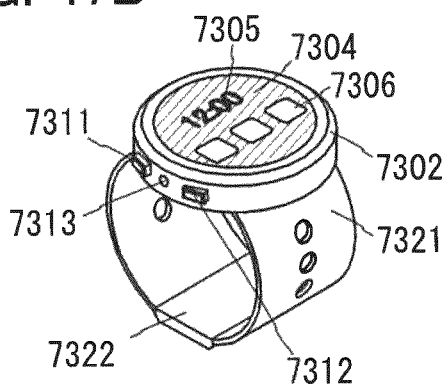

FIG. 47B illustrates a smart watch including a housing 7302, a display portion 7304, operation buttons 7311 and 7312, a connection terminal 7313, a band 7321, a clasp 7322, and the like. The semiconductor device of one embodiment of the present invention can be used for display portion 7304 or a memory, a CPU, or the like incorporated in the housing 7302.

Figure 47C:
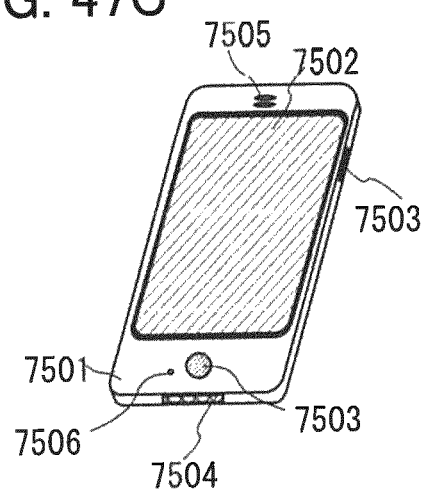

FIG. 47C illustrates a portable information terminal including a display portion 7502 incorporated in a housing 7501, operation buttons 7503, an external connection port 7504, a speaker 7505, a microphone 7506, a display portion 7502, and the like. The semiconductor device of one embodiment of the present invention can be used for a mobile memory, a CPU, or the like incorporated in the housing 7501. Note that the display portion 7502 is small- or medium-sized but can perform full high vision, 4K, or 8K display because it has greatly high definition; therefore, a significantly clear image can be obtained.

Figure 47D:
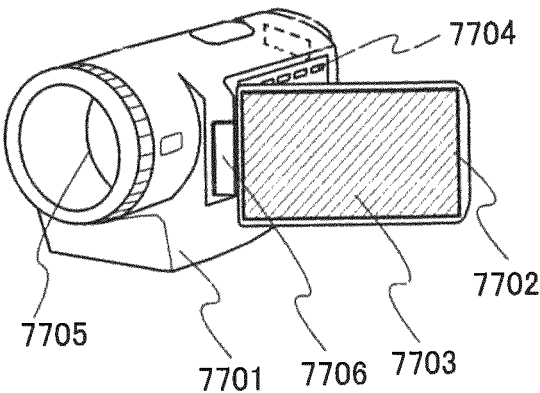

FIG. 47D illustrates a video camera including a first housing 7701, a second housing 7702, a display portion 7703, operation keys 7704, a lens 7705, a joint 7706, and the like. The operation keys 7704 and the lens 7705 are provided for the first housing 7701, and the display portion 7703 is provided for the second housing 7702. The first housing 7701 and the second housing 7702 are connected to each other with the joint 7706, and the angle between the first housing 7701 and the second housing 7702 can be changed with the joint 7706. Images displayed on the display portion 7703 may be switched in accordance with the angle at the joint 7706 between the first housing 7701 and the second housing 7702. The imaging device of one embodiment of the present invention can be provided in a focus position of the lens 7705. The semiconductor device of one embodiment of the present invention can be used for an integrated circuit, a CPU, or the like incorporated in the first housing 7701.

Figure 47E:
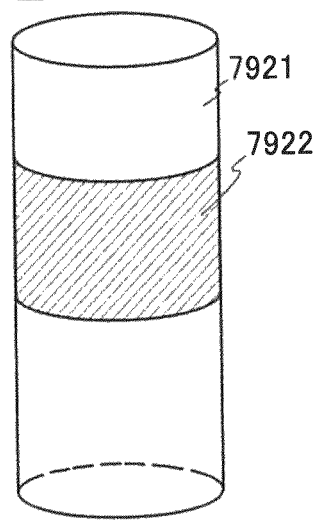

FIG. 47E illustrates a digital signage including a display portion 7902 provided on a utility pole 7901. The display device of one embodiment of the present invention can be used for a control circuit of the display portion 7902.

Figure 48A:
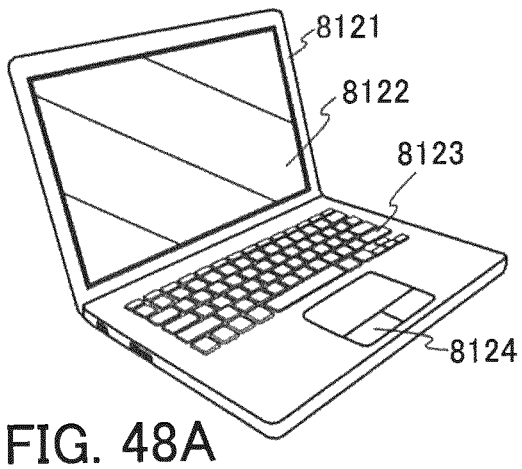
FIGS. 48A to 48D each illustrate an electronic device of one embodiment of the present invention.

FIG. 48A illustrates a laptop personal computer including a housing 8121, a display portion 8122, a keyboard 8123, a pointing device 8124, and the like. The semiconductor device of one embodiment of the present invention can be used for a CPU, a memory, or the like incorporated in the housing 8121. Note that the display portion 8122 is small- or medium-sized but can perform 8K display because it has greatly high definition; therefore, a significantly clear image can be obtained.

Figure 48B:
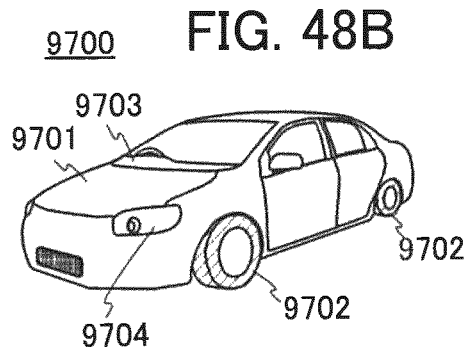
Figure 48C:
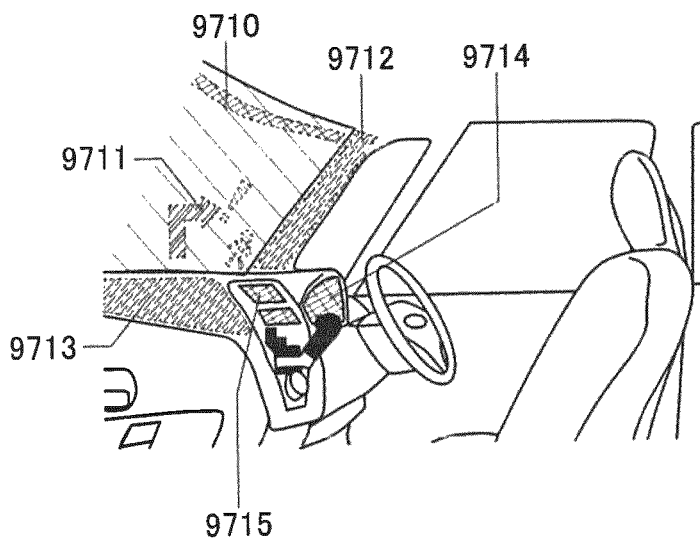

FIG. 48B is an external view of an automobile 9700. FIG. 48C illustrates a driver's seat of the automobile 9700. The automobile 9700 includes a car body 9701, wheels 9702, a dashboard 9703, lights 9704, and the like. The semiconductor device of one embodiment of the present invention can be used in a display portion and a control integrated circuit of the automobile 9700. For example, the semiconductor device of one embodiment of the present invention can be used in display portions 9710 to 9715 illustrated in FIG. 48C.

The display portions 9710 and 9711 are display devices or input/output devices provided in an automobile windshield. The display device or input/output device of one embodiment of the present invention can be a see-through display device or input/output device, through which the opposite side can be seen, by using a light-transmitting conductive material for its electrodes. Such a see-through display device or input/output device does not hinder driver's vision during the driving of the automobile 9700. Therefore, the display device or input/output device of one embodiment of the present invention can be provided in the windshield of the automobile 9700. Note that in the case where a transistor or the like for driving the display device or input/output device is provided in the display device or input/output device, a transistor having light-transmitting properties, such as an organic transistor using an organic semiconductor material or a transistor using an oxide semiconductor, is preferably used.

The display portion 9712 is a display device provided on a pillar portion. For example, an image taken by an imaging unit provided in the car body is displayed on the display portion 9712, whereby the view hindered by the pillar portion can be compensated. The display portion 9713 is a display device provided on the dashboard. For example, an image taken by an imaging unit provided in the car body is displayed on the display portion 9713, whereby the view hindered by the dashboard can be compensated. That is, by displaying an image taken by an imaging unit provided on the outside of the automobile, blind areas can be eliminated and safety can be increased. Displaying an image to compensate for the area which a driver cannot see makes it possible for the driver to confirm safety easily and comfortably.

Figure 48D:
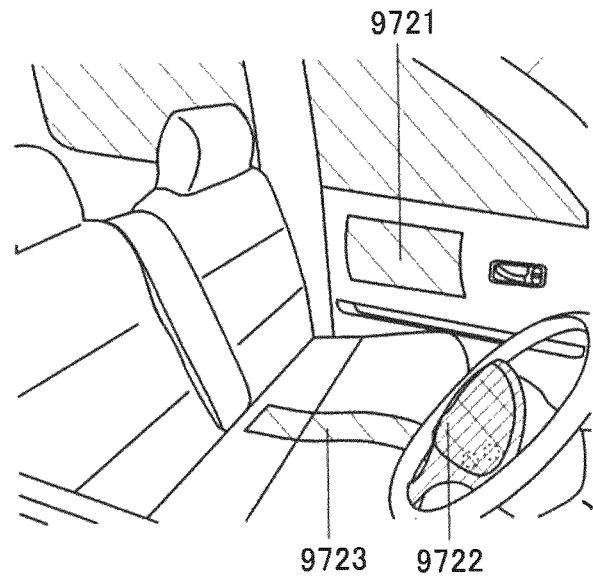

FIG. 48D illustrates the inside of a car in which a bench seat is used as a driver seat and a front passenger seat. A display portion 9721 is a display device or input/output device provided in a door portion. For example, an image taken by an imaging unit provided in the car body is displayed on the display portion 9721, whereby the view hindered by the door can be compensated. A display portion 9722 is a display device provided in a steering wheel. A display portion 9723 is a display device provided in the middle of a seating face of the bench seat. Note that the display device can be used as a seat heater by providing the display device on the seating face or backrest and by using heat generation of the display device as a heat source.

The display portions 9714, 9715, and 9722 can display a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

Figure 49A:
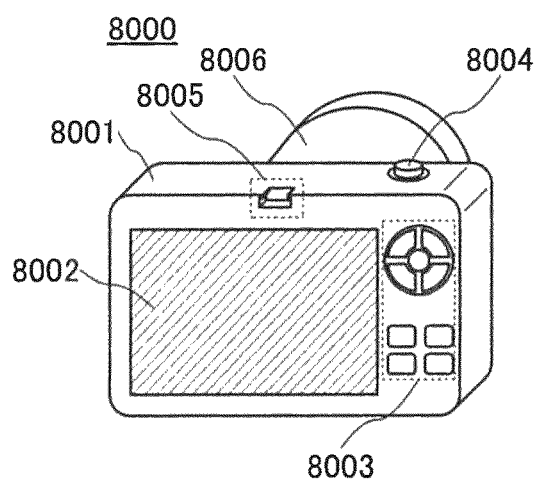
FIGS. 49A to 49C each illustrate an electronic device of one embodiment of the present invention.

FIG. 49A illustrates an external view of a camera 8000. The camera 8000 includes a housing 8001, a display portion 8002, an operation button 8003, a shutter button 8004, a connection portion 8005, and the like. A lens 8006 can be put on the camera 8000.

The connection portion 8005 includes an electrode to connect with a finder 8100, which will be described below, a stroboscope, or the like.

Although the lens 8006 of the camera 8000 here is detachable from the housing 8001 for replacement, the lens 8006 may be included in a housing.

Images can be taken by the touch of the shutter button 8004. In addition, images can be taken by the touch of the display portion 8002 which serves as a touch panel.

The display device or input/output device of one embodiment of the present invention can be used in the display portion 8002.

Figure 49B:
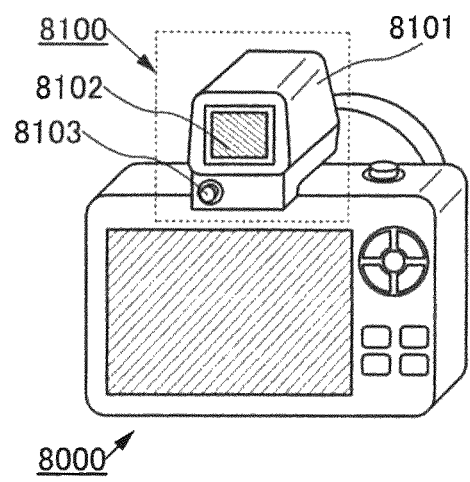

FIG. 49B illustrates the camera 8000 with the finder 8100 connected.

The finder 8100 includes a housing 8101, a display portion 8102, a button 8103, and the like.

The housing 8101 includes a connection portion for the camera 8000 and the connection portion 8005, and the finder 8100 can be connected to the camera 8000. The connection portion includes an electrode, and an image or the like received from the camera 8000 through the electrode can be displayed on the display portion 8102.

The button 8103 functions as a power button, and the display portion 8102 can be turned on and off with the button 8103.

The semiconductor device of one embodiment of the present invention can be used for an integrated circuit and an image sensor included in the housing 8101.

Although the camera 8000 and the finder 8100 are separate and detachable electronic devices in FIGS. 49A and 49B, the housing 8001 of the camera 8000 may include a finder having the display device or input/output device of one embodiment of the present invention.

Figure 49C:
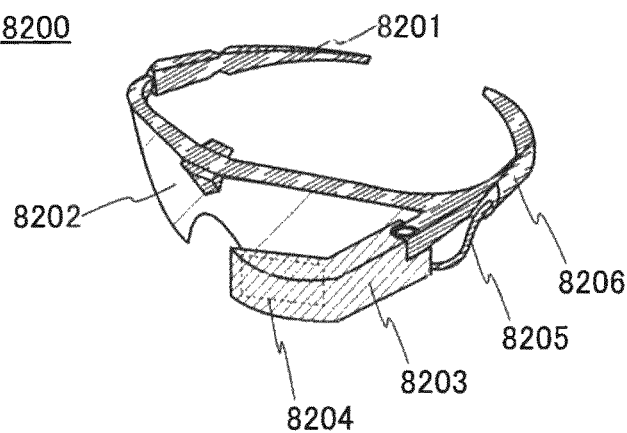

FIG. 49C illustrates an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. In addition, the movement of the eyeball and the eyelid of a user can be captured by a camera in the main body 8203 and then coordinates of the points the user looks at can be calculated using the captured data to utilize the eye point of the user as an input means.

The mounting portion 8201 may include a plurality of electrodes to be in contact with the user. The main body 8203 may be configured to sense current flowing through the electrodes with the movement of the user's eyeball to recognize the direction of his or her eyes. The main body 8203 may be configured to sense current flowing through the electrodes to monitor the user's pulse. The mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The semiconductor device of one embodiment of the present invention can be used for an integrated circuit included in the main body 8203.

At least part of this embodiment can be implemented in combination with any of the embodiments described in this specification as appropriate.

Embodiment 14

In Embodiment 14, application examples of an RF tag using the semiconductor device of one embodiment of the present invention are described with reference to FIGS. 50A to 50F.

<Application Examples of RF Tag>

Figure 50A:
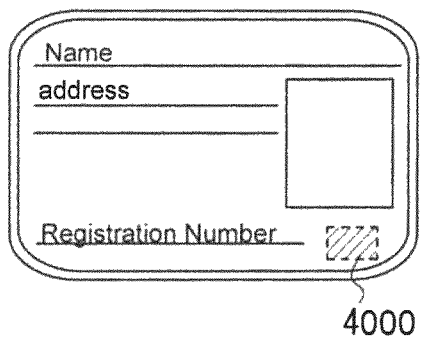
FIGS. 50A to 50F each illustrate an application example of an RF tag of one embodiment of the present invention.
Figure 50B:
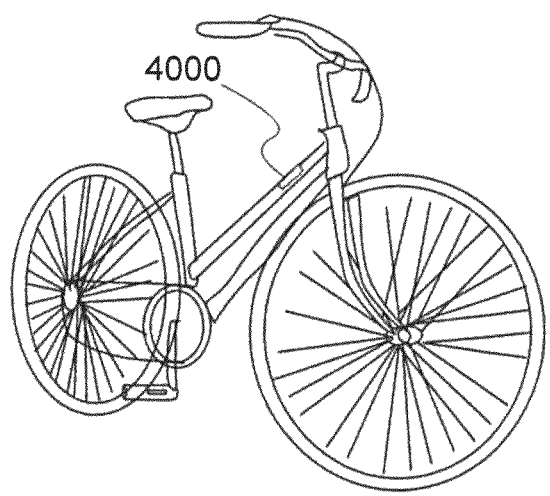
Figure 50C:
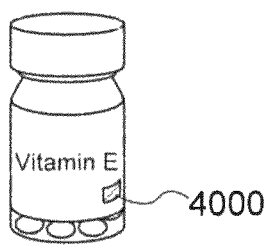
Figure 50D:
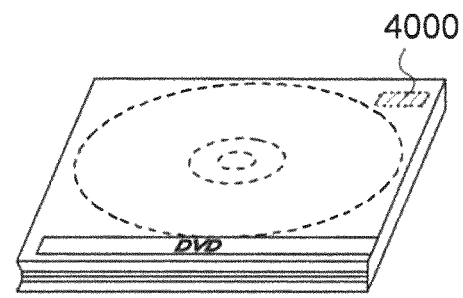
Figure 50E:
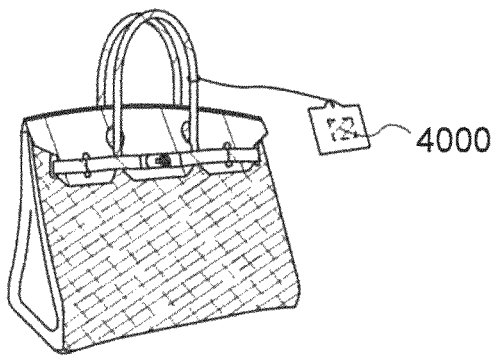
Figure 50F:
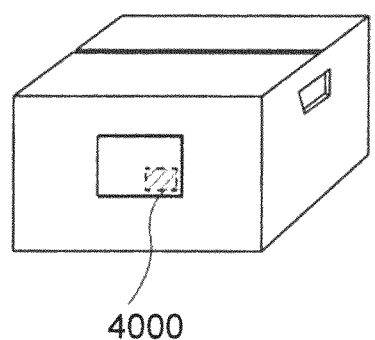

The RF tag is widely used and can be provided for, for example, products such as bills, coins, securities, bearer bonds, documents (e.g., driver's licenses or resident's cards, see FIG. 50A), vehicles (e.g., bicycles, see FIG. 50B), packaging containers (e.g., wrapping paper or bottles, see FIG. 50C), recording media (e.g., DVD or video tapes, see FIG. 50D), personal belongings (e.g., bags or glasses, see FIG. 50E), foods, plants, animals, human bodies, clothing, household goods, medical supplies such as medicine and chemicals, and electronic devices (e.g., liquid crystal display devices, EL display devices, television sets, or mobile phones), or tags on products (see FIG. 50F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag including the semiconductor device of one embodiment of the present invention for each application described in this embodiment, power for operation such as writing or reading of data can be reduced, which results in an increase in the maximum communication distance. Moreover, data can be retained for an extremely long period even in the state where power is not supplied; thus, the RF tag can be preferably used for application in which data is not frequently written or read.

This embodiment can be combined as appropriate with any of the other embodiments in this specification.

Example 1

In Example 1, samples were fabricated by a selective film formation method of one embodiment of the present invention and cross sections thereof were observed with a scanning transmission electron microscope (STEM).

A silicon oxynitride film was formed over a silicon substrate to a thickness of 100 nm with a plasma CVD apparatus. The silicon oxynitride film was formed using a mixed gas of a $SiH_4$ gas with a flow rate of 5 sccm and an $N_2O$ gas with a flow rate of 1000 sccm, a gas pressure of 133.3 Pa, a high-frequency power of 45 W, and a substrate temperature of 325° C.

Then, an In—Ga—Zn oxide was formed over the silicon oxynitride film to a thickness of 50 nm by a sputtering method.

Next, first heat treatment was performed at 450° C. in a nitrogen atmosphere for 1 hour, and then second heat treatment was further performed at 450° C. in an oxygen atmosphere for 1 hour.

Next, part of the In—Ga—Zn oxide was etched by a lithography method with a mixed solution of nitric acid, acetic acid, and phosphoric acid.

Next, a silicon oxide film containing fluorine was formed over the silicon oxynitride film and the In—Ga—Zn oxide with the plasma CVD apparatus. The silicon oxide film containing fluorine of a sample 1 was formed under the following conditions: in a first step, a $SiH_4$ gas with a flow rate of 200 sccm was introduced into a chamber of the plasma CVD apparatus for 20 seconds without applying a high-frequency power, i.e., without generating plasma; in a subsequent second step, a mixed gas of a $SiF_4$ gas with a flow rate of 1.5 sccm, an $N_2O$ gas with a flow rate of 1000 sccm, and an Ar gas with a flow rate of 1000 sccm were introduced; and the gas pressure was controlled to 133 Pa while a high-frequency power of 800 W was applied to generate plasma. The substrate temperature at this time was set to 350° C.

As conditions of the silicon oxide film containing fluorine in a sample 2, only the second step was performed.

Figure 51A:
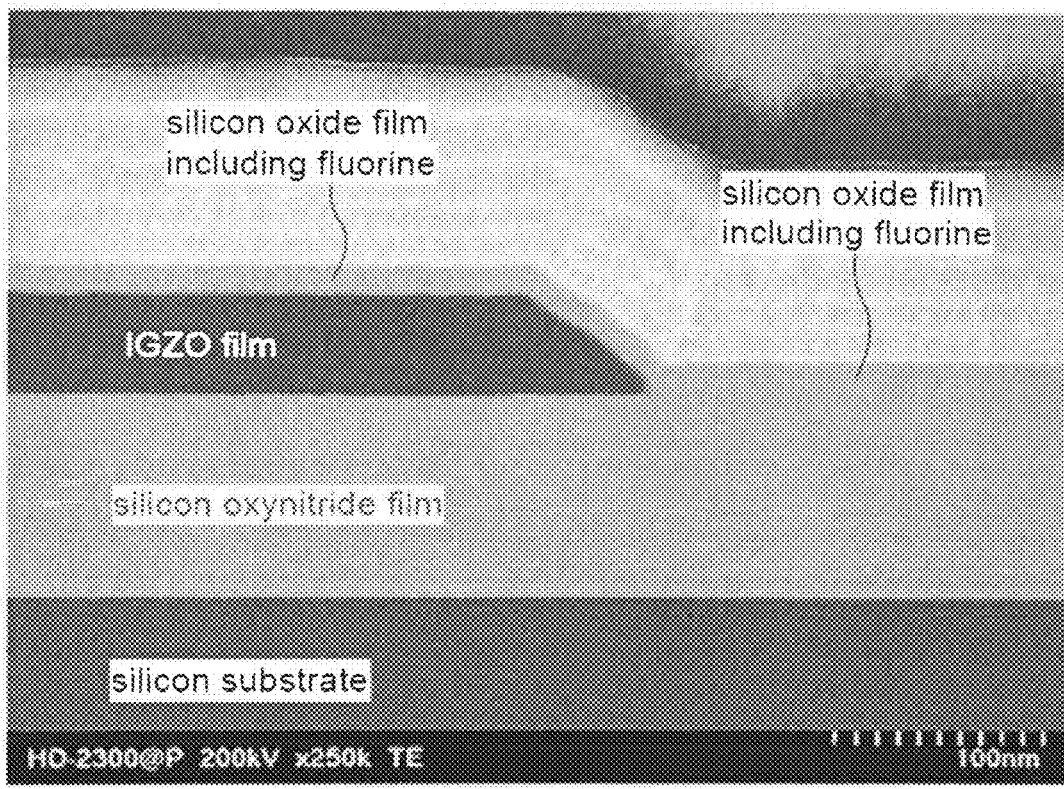
FIGS. 51A and 51B show cross-sectional STEM images in Example.
Figure 51B:
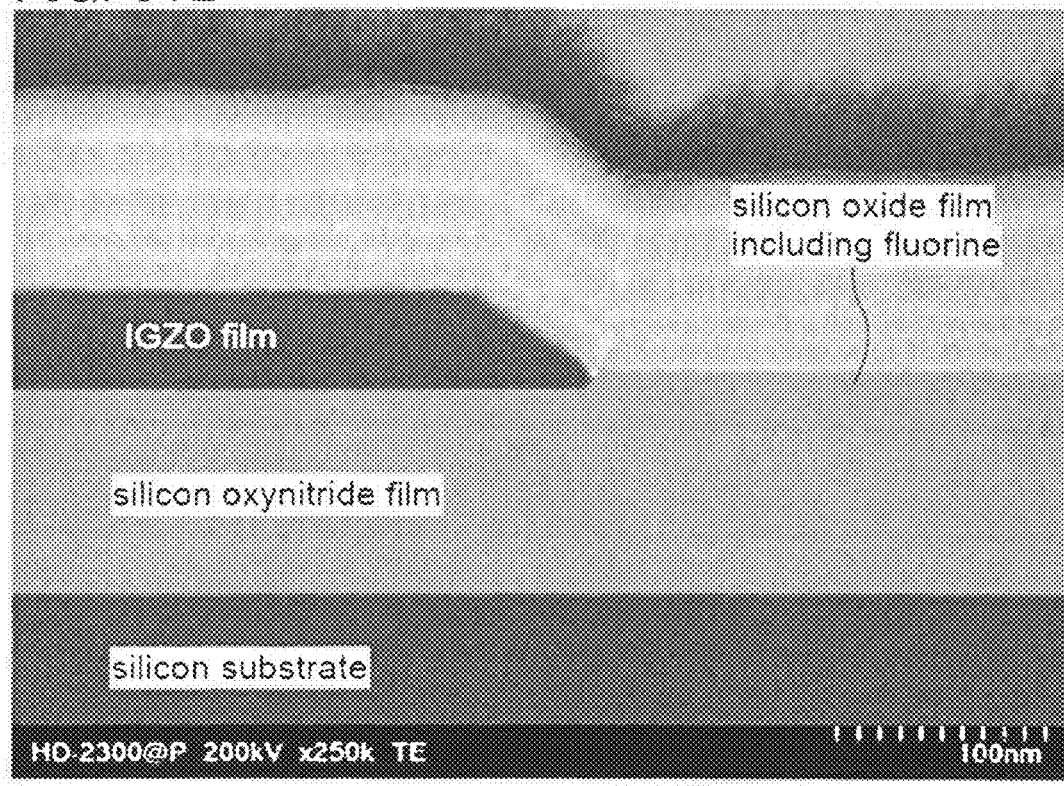

The samples 1 and 2 were fabricated through the above steps, and cross sections thereof were observed with a STEM. FIGS. 51A and 51B show cross-sectional STEM photographs. FIG. 51A is a cross-sectional photograph of the sample 1 and FIG. 51B is a cross-sectional photograph of the sample 2.

The silicon oxide film containing fluorine formed over the silicon oxynitride film and the In—Ga—Zn oxide was observed in the cross-sectional photograph of the sample 1 in FIG. 51A. In contrast, from the observation of the cross-sectional photograph of the sample 2 in FIG. 51B, the silicon oxide film containing fluorine was formed over the silicon oxynitride film but not over the In—Ga—Zn oxide. The difference between the sample 1 and the sample 2 in conditions for forming the silicon oxide film containing fluorine was whether the first step is performed or not. That is, omission of the first step allowed the silicon oxide film containing fluorine to be selectively formed over the silicon oxynitride film.

The above results show that it is possible to selectively form the insulator 403 over the insulator 402 as described in Embodiment 3 and to prevent a breakdown of an element due to an electric field between the conductor 404 and the conductor 310a because the electric field is weakened.

Example 2

In Example 2, samples were fabricated in such a manner that a silicon oxide film was formed over a silicon substrate, and $SiH_4$ and $SiF_4$ were introduced to form a silicon oxide film containing fluorine thereover. The samples were analyzed by SIMS and thermal desorption spectroscopy (TDS) at a film surface temperature of higher than or equal to 100° C. and lower than or equal to 700° C. In Example 2, samples 3A-1 to 3A-8 were formed under the conditions that the flow rate of $SiF_4$ was set to 1.5 sccm and the flow rate of $SiH_4$ was changed; and samples 3B-1 to 3B-8 were formed under the conditions that the flow rate of $SiF_4$ was fixed to 10 sccm and the flow rate of $SiH_4$ was changed.

A method for fabricating the samples 3A-1 to 3A-8 and the samples 3B-1 to 3B-8 is described. First, by thermal oxidation of a silicon wafer, a 100-nm-thick silicon oxide film was formed on a surface of the silicon wafer. The thermal oxidation was performed at 950° C. in an oxygen atmosphere containing HCl at 3 volume % for 4 hours.

Then, a 300-nm-thick silicon oxide film containing fluorine was formed over the silicon oxide film by a PECVD method. The deposition conditions were as follows: $N_2O$ with a flow rate of 1000 sccm and Ar with a flow rate of 1000 sccm were used as deposition gases; RF power source frequency was 60 MHz; RF power was 800 W; deposition pressure was 133 Pa; and the substrate temperature was 400° C. The flow rate of $SiF_4$ was 1.5 sccm for the samples 3A-1 to 3A-8, and was 10 sccm for the samples 3B-1 to 3B-8. The flow rate of $SiH_4$ was 0 sccm for the samples 3A-1 and 3B-1, 0.2 sccm for the samples 3A-2 and 3B-2, 1 sccm for the samples 3A-3 and 3B-3, 2 sccm for the samples 3A-4 and 3B-4, 4 sccm for the samples 3A-5 and 3B-5, 8 sccm for the samples 3A-6 and 3B-6, 10 sccm for the samples 3A-7 and 3B-7, and 20 sccm for the samples 3A-8 and 3B-8.

Figure 52:
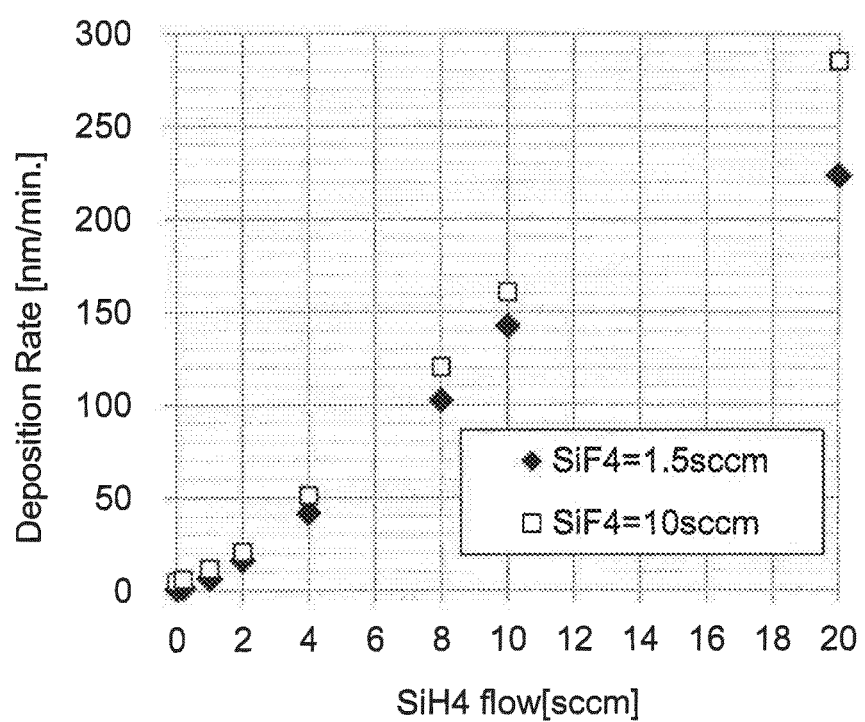
FIG. 52 is a graph showing results of measured deposition rate in Example.

FIG. 52 shows the calculated deposition rates of the silicon oxide films containing fluorine of the samples 3A-1 to 3A-8 and the samples 3B-1 to 3B-8 formed in the above manner. In FIG. 52, the horizontal axis represents the flow rate [sccm] of $SiH_4$ for each sample, and the vertical axis represents the deposition rate [nm/min] of each sample.

As shown in FIG. 52, in the samples 3A-1 to 3A-8 and the samples 3B-1 to 3B-8, the deposition rate tends to be increased with an increase in the flow rate of $SiH_4$. However, when the samples with the same flow rate of $SiH_4$ are compared, the deposition rates of the samples 3B-1 to 3B-8 were slightly higher than those of the samples 3A-1 to 3A-8. The difference in deposition rate becomes larger with an increase in the flow rate of $SiH_4$.

The TDS analysis results of the samples 3A-1 to 3A-8 and the samples 3B-1 to 3B-8 are shown in FIGS. 55A to 55H, FIGS. 56A to 56H, FIGS. 57A to 57H, and FIGS. 58A to 58H. Note that in the TDS analysis, the amount of a released gas with a mass-to-charge ratio m/z=2, which corresponds to a hydrogen molecule and the amount of a released gas with a mass-to-charge ratio m/z=18, which corresponds to a water molecule, were measured. FIGS. 55A to 55H show the TDS measurement results of hydrogen in the samples 3A-1 to 3A-8, and FIGS. 56A to 56H show those of water in the samples 3A-1 to 3A-8. FIGS. 57A to 57H show the TDS measurement results of hydrogen in the samples 3B-1 to 3B-8, and FIGS. 58A to 58H show those of water in the samples 3B-1 to 3B-8. In each of FIGS. 55A to 55H to FIGS. 58A to 58H, the horizontal axis represents substrate heating temperature [° C.] and the vertical axis represents intensity proportional to the amount of a released gas with a mass-to-charge ratio.

Figure 53A:
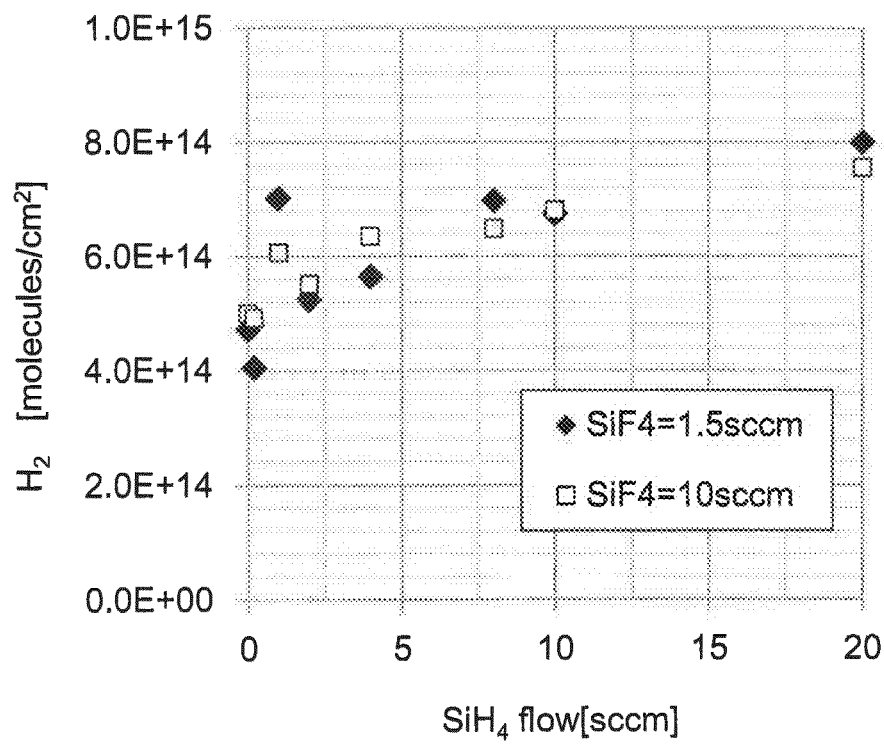
FIGS. 53A and 53B are graphs each showing the amount of released hydrogen calculated from results of TDS analysis in Example.
Figure 53B:
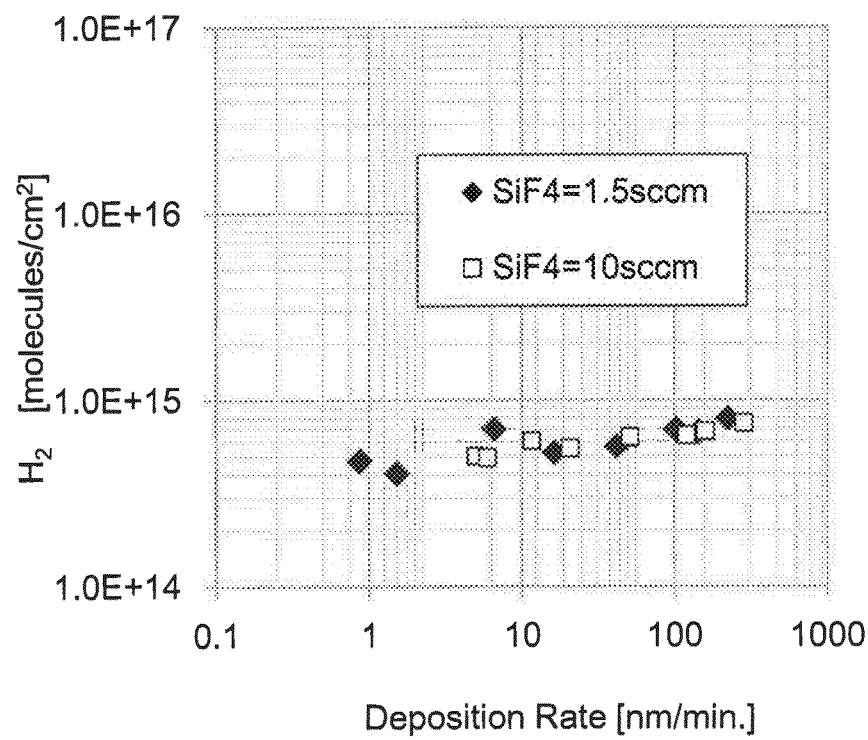

FIGS. 53A and 53B show the number of hydrogen molecules released from each of the samples 3A-1 to 3A-8 and the samples 3B-1 to 3B-8 which was estimated from the measurement results of hydrogen shown in FIGS. 55A to 55H and 57A to 57H. In FIG. 53A, the horizontal axis represents the flow rate [sccm] of $SiH_4$ for each sample, and the vertical axis represents the number of hydrogen molecules [molecules/cm$^2$] released from each sample. In FIG. 53B, the horizontal axis represents the deposition rate [nm/min] of each sample, and the vertical axis represents the number of hydrogen molecules [molecules/cm$^2$] released from each sample.

Figure 54A:
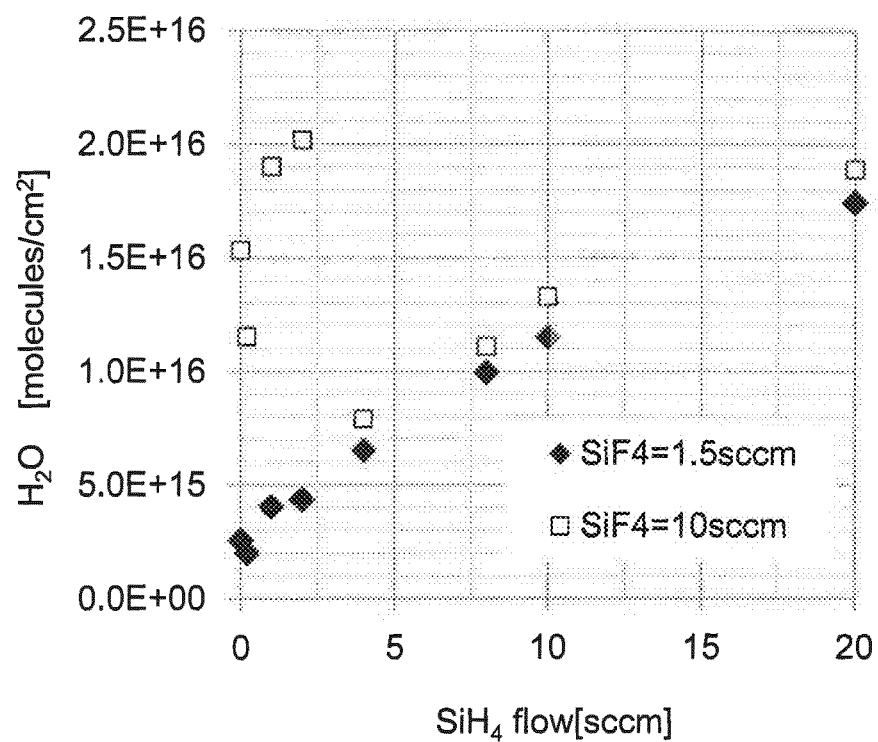
FIGS. 54A and 54B are graphs each showing the amount of released water calculated from results of TDS analysis in Example.
Figure 54B:
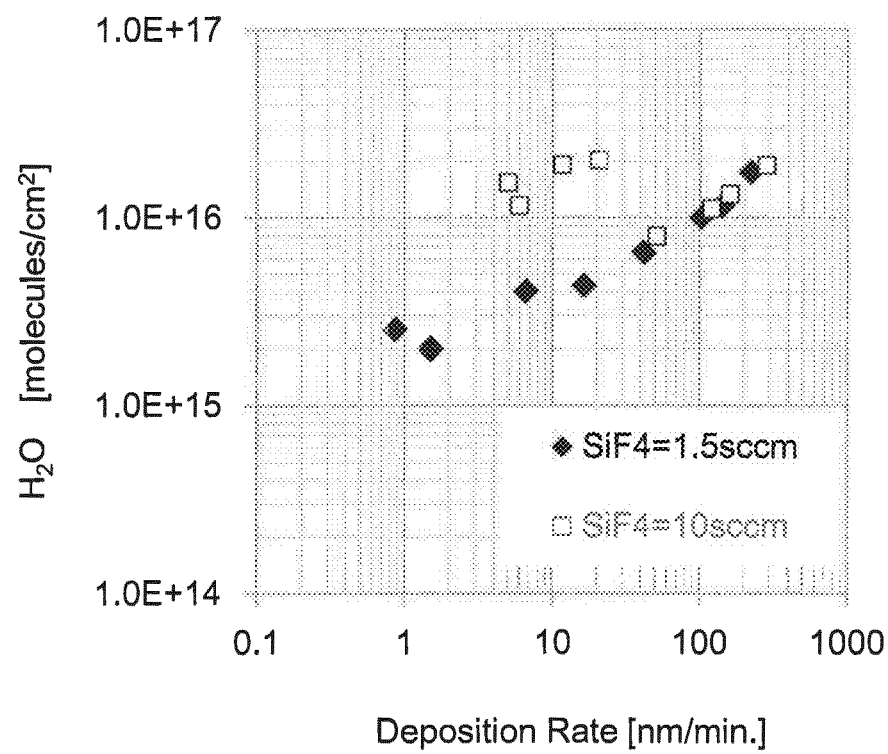
Figure 55A:
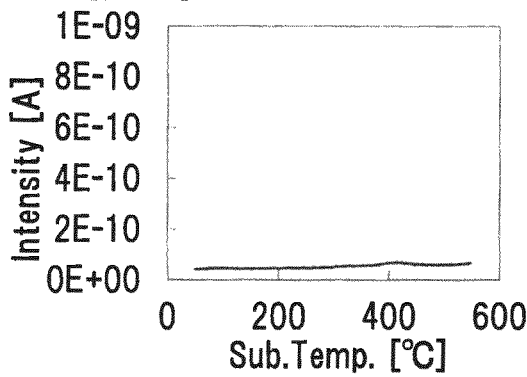
FIGS. 55A to 55H are graphs each showing results of TDS analysis in Example.
Figure 55B:
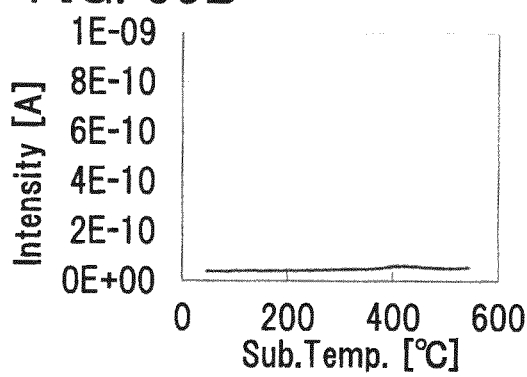
Figure 55C:
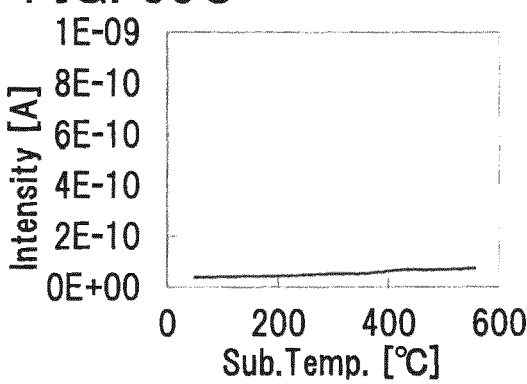
Figure 55D:
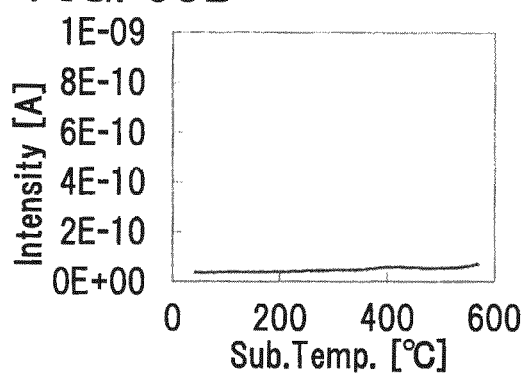
Figure 55E:
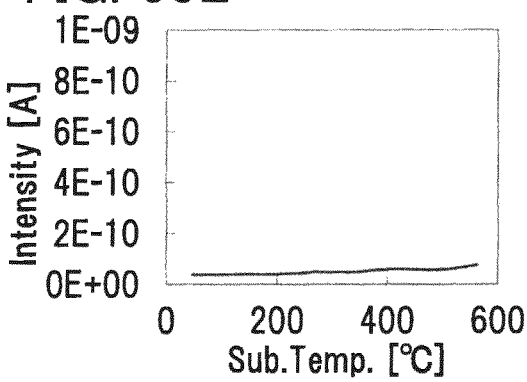
Figure 55F:
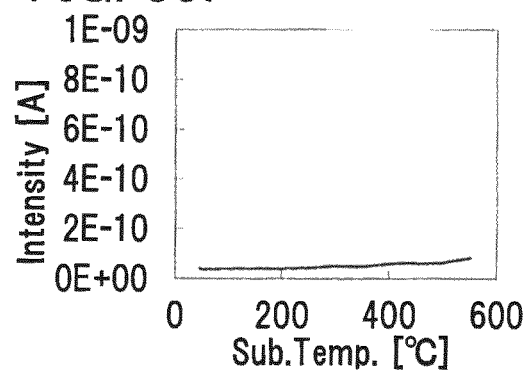
Figure 55G:
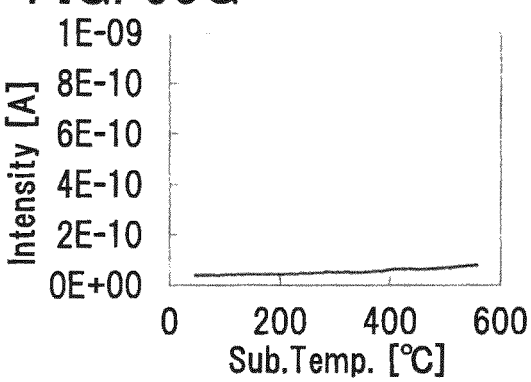
Figure 55H:
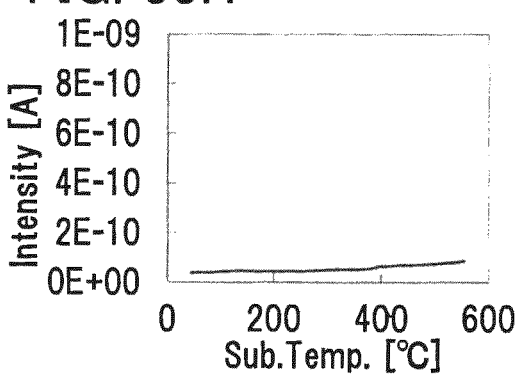
Figure 56A:
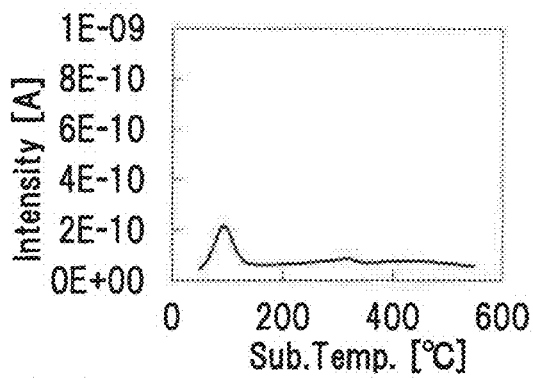
FIGS. 56A to 56H are graphs each showing results of TDS analysis in Example.
Figure 56B:
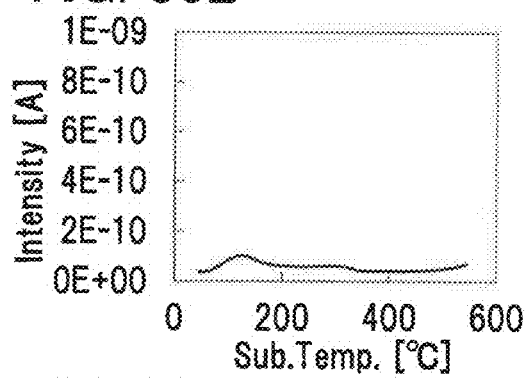
Figure 56C:
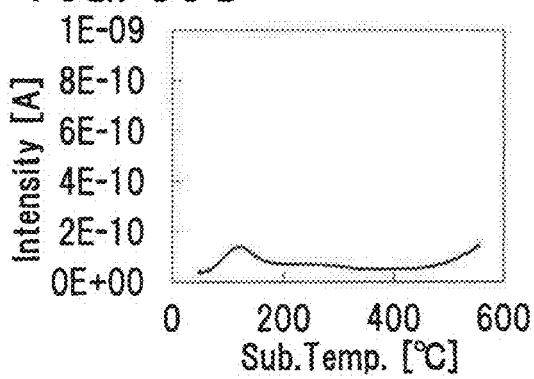
Figure 56D:
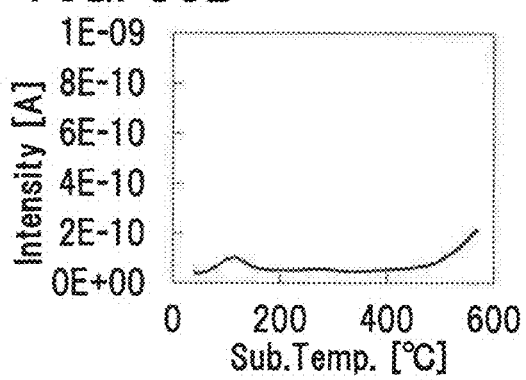
Figure 56E:
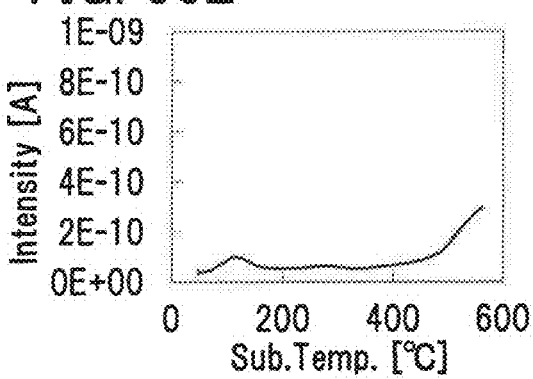
Figure 56F:
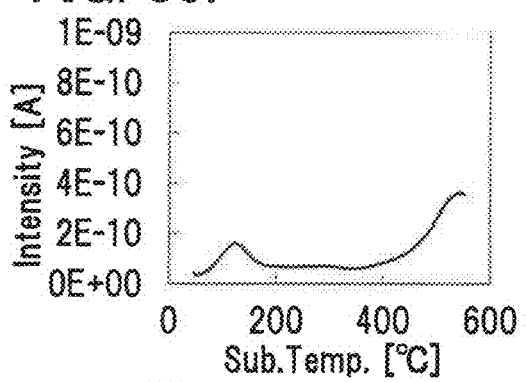
Figure 56G:
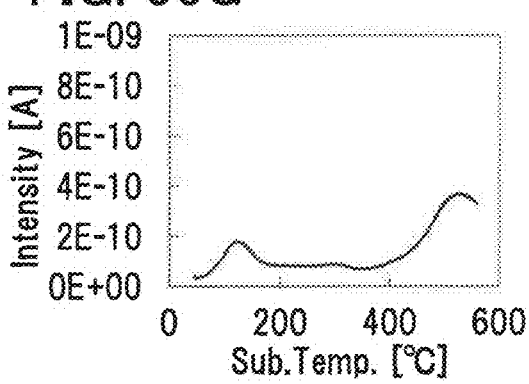
Figure 56H:
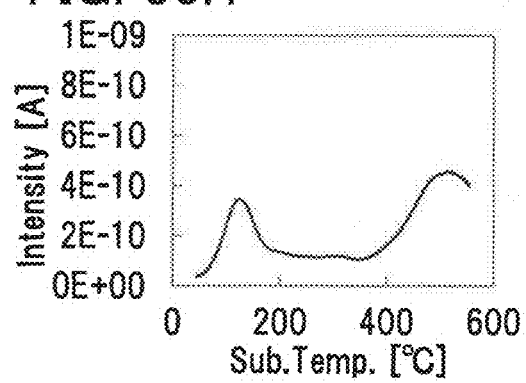
Figure 57A:
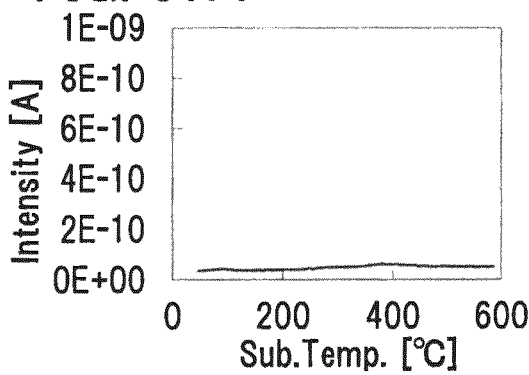
Figure 57B:
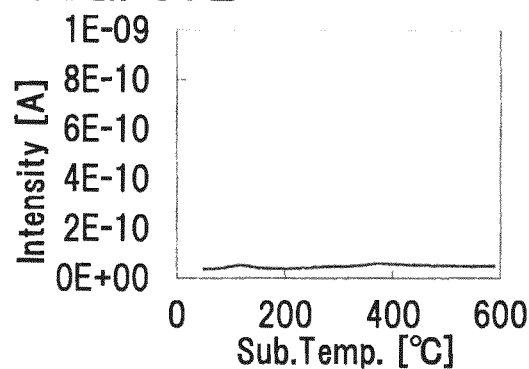
Figure 57C:
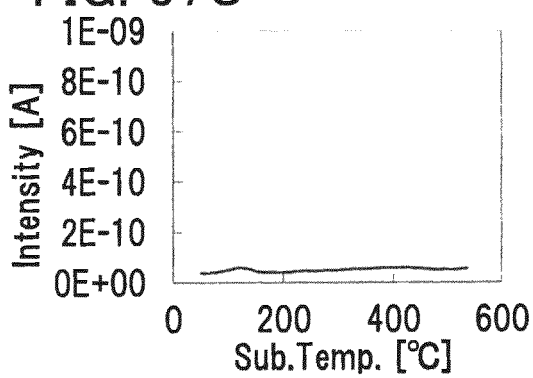
Figure 57D:
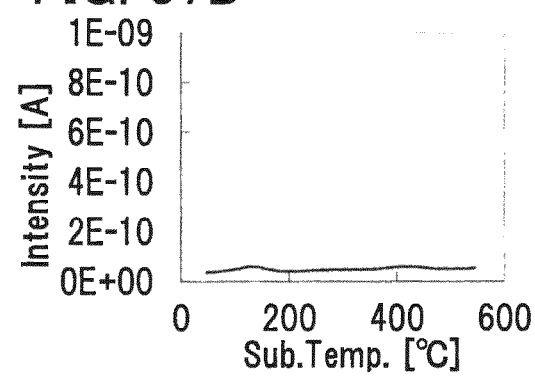
Figure 57D:
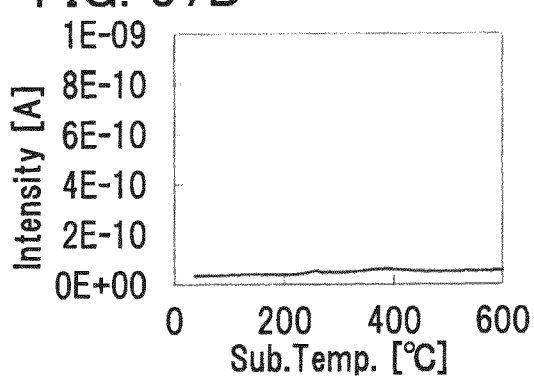
Figure 57F:
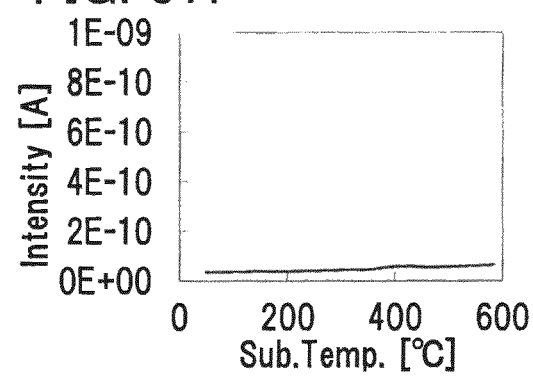
Figure 57G:
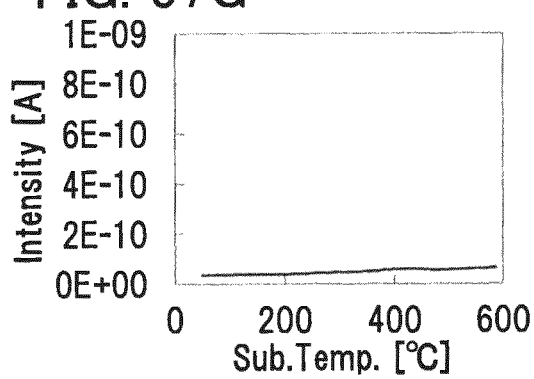
Figure 57H:
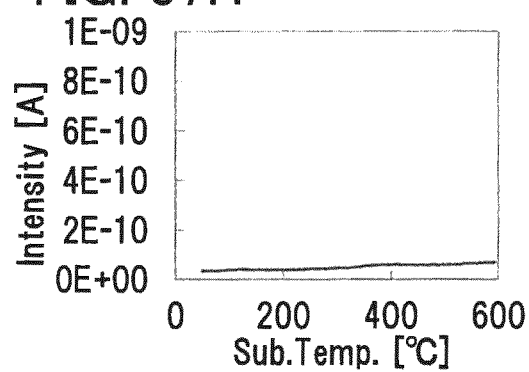
Figure 58A:
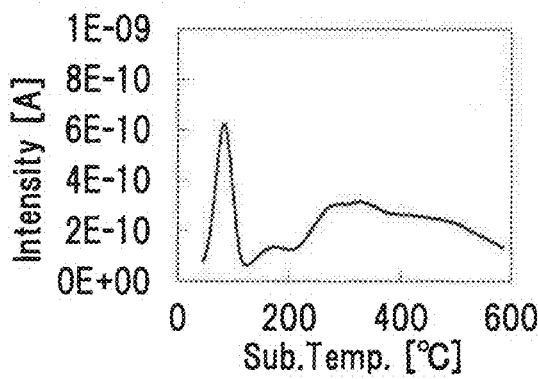
FIGS. 58A to 58H are graphs each showing results of TDS analysis in Example.
Figure 58B:
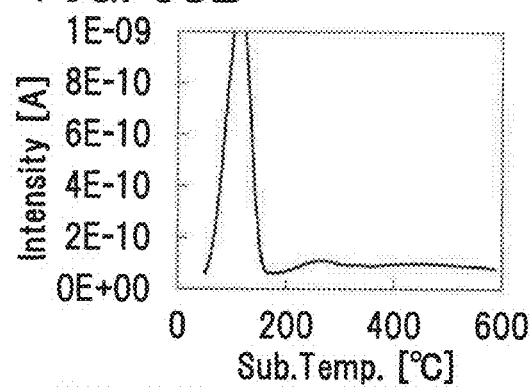
Figure 58C:
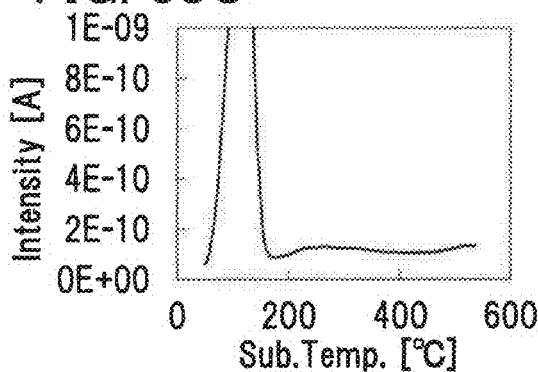
Figure 58D:
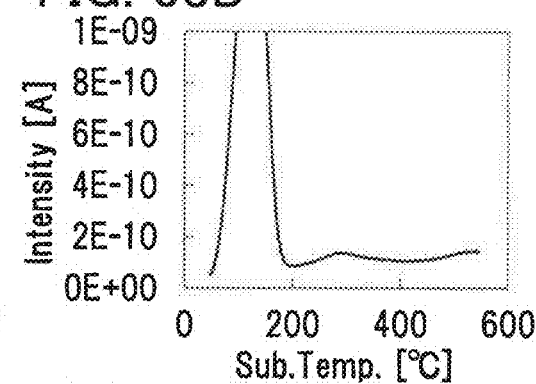
Figure 58E:
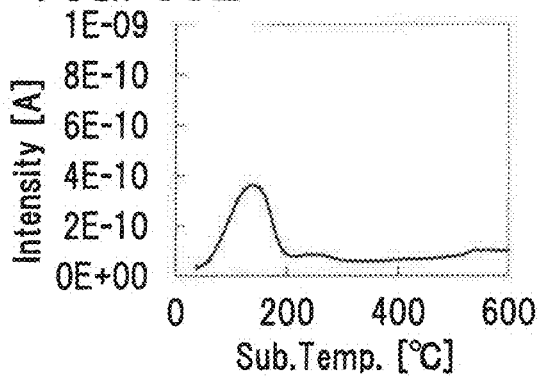
Figure 58F:
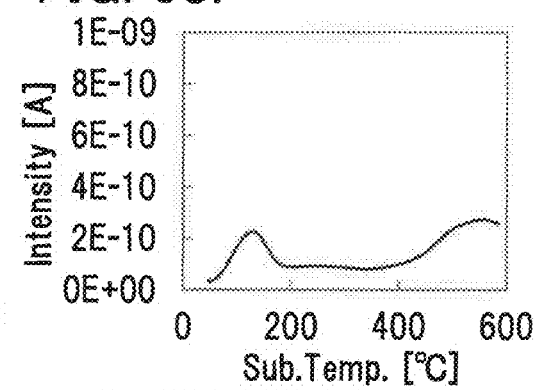
Figure 58G:
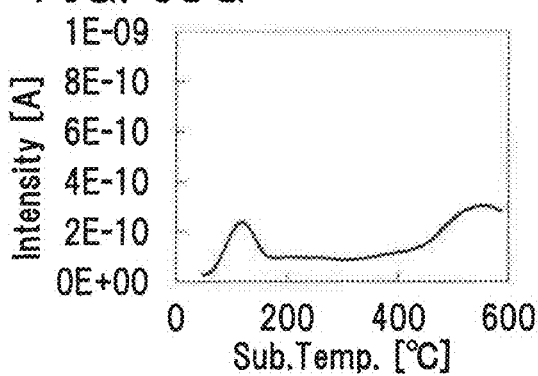
Figure 58H:
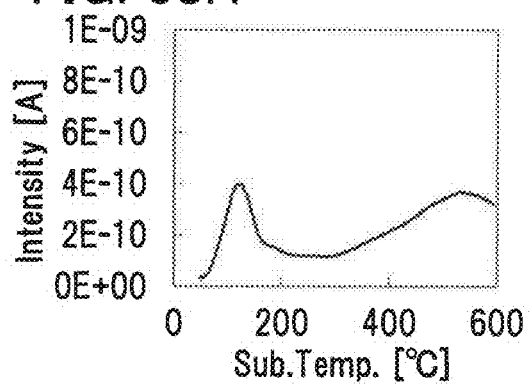

FIGS. 54A and 54B show the number of water molecules released from each of the samples 3A-1 to 3A-8 and the samples 3B-1 to 3B-8 which was estimated from the measurement results of water shown in FIGS. 56A to 56H and 58A to 58H. In FIG. 54A, the horizontal axis represents the flow rate [sccm] of $SiH_4$ for each sample, and the vertical axis represents the number of water molecules [molecules/cm$^2$] released from each sample. In FIG. 54B, the horizontal axis represents the deposition rate [nm/min] of each sample, and the vertical axis represents the number of water molecules [molecules/cm$^2$] released from each sample.

As shown in FIGS. 53A and 53B and FIGS. 54A and 54B, in the samples 3A-1 to 3A-8 and the samples 3B-1 to 3B-8, the number of released hydrogen molecules and the number of released water molecules tend to be increased by an increase in the flow rate of $SiH_4$ or an increase in deposition rate. A significant difference between the samples 3A-1 to 3A-8 and the samples 3B-1 to 3B-8 is not seen in FIGS. 53A and 53B and FIGS. 54A and 54B; accordingly, it seems that the difference in the flow rate of $SiF_4$ did not cause a significant difference.

As shown in FIGS. 55A to 55H and 57A to 57H, a large profile peak of hydrogen is not seen in each of the samples 3A-1 to 3A-8 and the samples 3B-1 to 3B-8 at any temperature, and the number of hydrogen molecules released therefrom was significantly small.

As shown in FIGS. 56A to 56H and 58A to 58H, a large profile peak of water is seen in each of the samples 3A-1 to 3A-8 and the samples 3B-1 to 3B-8 at a substrate temperature of approximately 100° C.; accordingly, which shows release of water. Furthermore, in the samples 3A-1 to 3A-8 and the samples 3B-1 to 3B-8, as the flow rate of $SiH_4$ increases, a peak in a high temperature region starts to rise at a substrate temperature of approximately 400° C.

As shown in FIG. 54A, the number of water molecules released from each of the samples 3B-1 to 3B-4 with a low flow rate of $SiH_4$ is significantly large. The number of water molecules released from each of the samples 3B-1 to 3B-4 shown in FIGS. 58A to 58D shows a very sharp peak at a substrate temperature of approximately 100° C. In other words, a significant factor of the large number of water molecules released from each of the samples 3B-1 to 3B-4 is probably water molecules corresponding to the peak at approximately 100° C. The water molecules corresponding to this peak can be eliminated by heating the substrate at a substrate temperature of approximately 100° C.; thus, the number of water molecules released from each of the samples 3B-1 to 3B-4 can be greatly reduced by heating the substrate at approximately 100° C.

As described above, there is a trade-off between the deposition rate of the silicon oxide film containing fluorine, which depends on the flow rate of $SiH_4$, and the amounts of hydrogen and water in the film. For example, as shown in FIG. 52 and FIG. 54A, the flow rate of $SiH_4$ is set to be greater than 1 sccm and less than 10 sccm, preferably greater than or equal to 2 sccm and less than or equal to 4 sccm, in which case the amounts of water and hydrogen in the insulator and the deposition rate can be relatively favorable values. Note that it is preferable that the proportion of $SiH_4$ be determined as appropriate in view of the amounts of water and hydrogen in the silicon oxide film containing fluorine and the deposition rate.

Figure 59A:
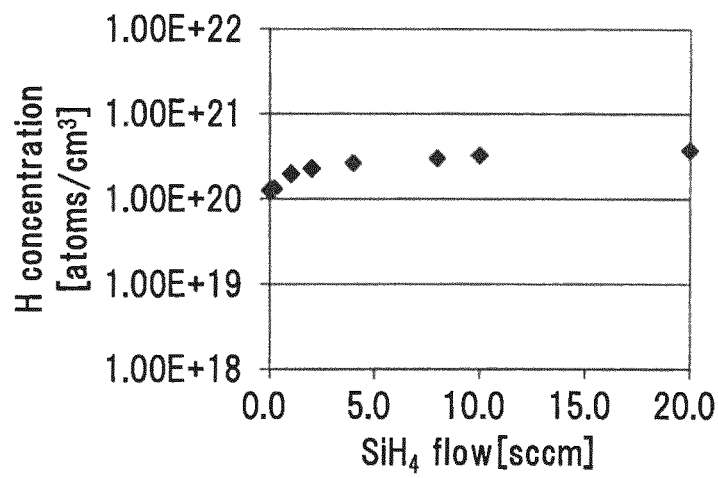
FIGS. 59A to 59C are graphs each showing results of SIMS analysis in Example.
Figure 59B:
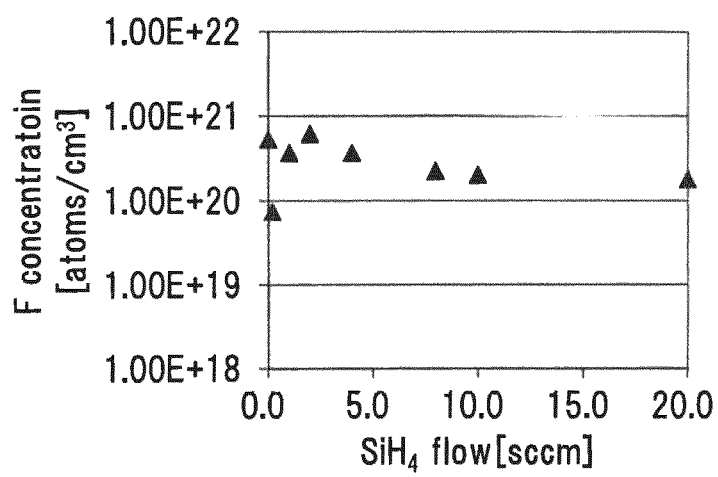
Figure 59C:
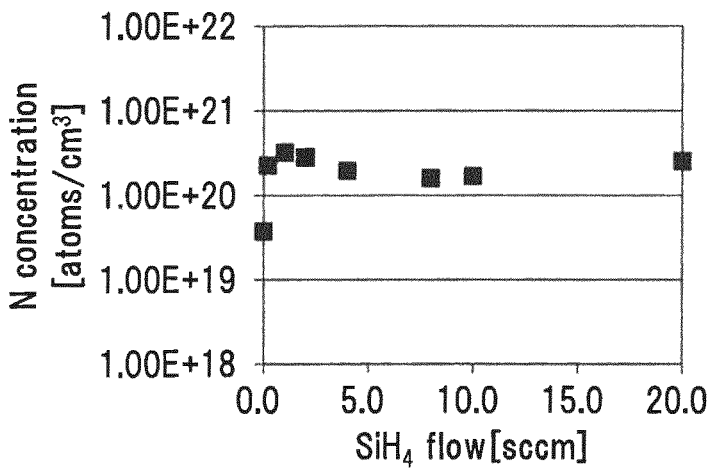
Figure 60A:
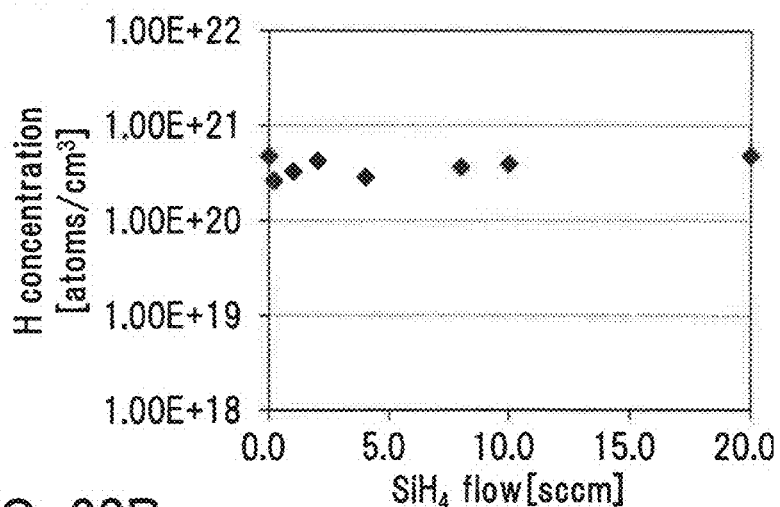
FIGS. 60A to 60C are graphs each showing results of SIMS analysis in Example.
Figure 60B:
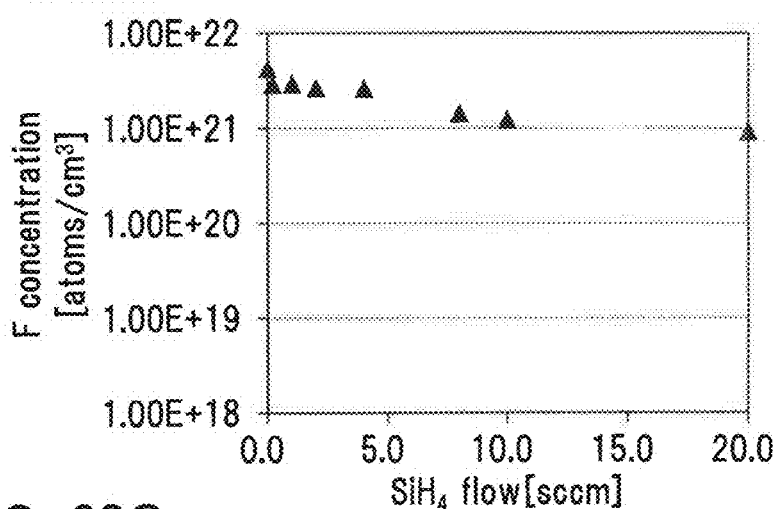
Figure 60C:
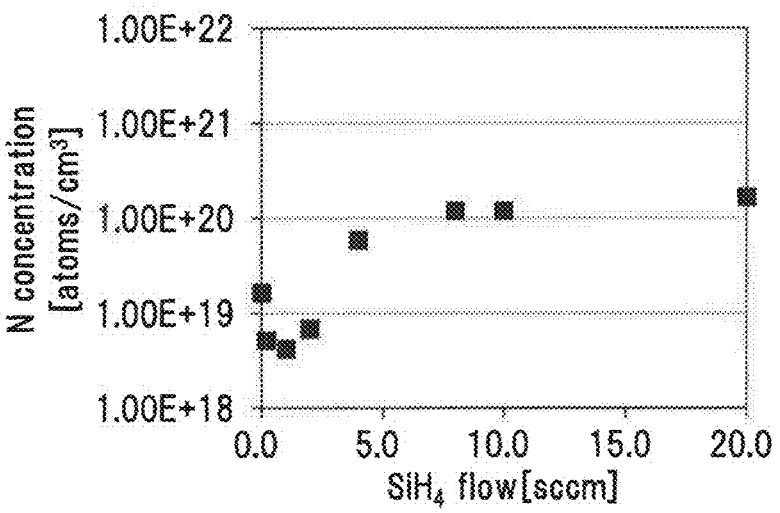

Next, the samples 3A-1 to 3A-8 and the samples 3B-1 to 3B-8 were subjected to SIMS analysis from the rear surface side of the samples to detect H, F, and N, and the results are shown in FIGS. 59A to 59C and FIGS. 60A to 60C. Note that each graph in FIGS. 59A to 59C and FIGS. 60A to 60C shows an average value of the concentration of an element in a sample detected in a region 50 nm to 100 nm above from an interface between the silicon oxide film and the silicon oxide film containing fluorine. FIGS. 59A to 59C show the results of the samples 3A-1 to 3A-8. FIG. 59A shows the detection results of H; FIG. 59B shows the detection results of F; and FIG. 59C shows the detection results of N. FIGS. 60A to 60C show the results of the samples 3B-1 to 3B-8. FIG. 60A shows the detection results of H; FIG. 60B shows the detection results of F; and FIG. 60C shows the detection results of N. In each of FIGS. 59A to 59C and FIGS. 60A to 60C, the horizontal axis represents the flow rate [sccm] of $SiH_4$ for each sample, and the vertical axis represents the average concentration [atoms/cm$^3$] in the sample. Note that SIMS analysis was performed by using an ADEPT-1010 quadrupole mass spectrometry instrument manufactured by ULVAC-PHI, Inc.

As shown in FIG. 59A and FIG. 60A, the SIMS analysis also shows that the hydrogen concentration in each of the samples 3A-1 to 3A-8 and the samples 3B-1 to 3B-8 tends to be increased with an increase in the flow rate of $SiH_4$. The hydrogen concentration in each of the samples 3A-1 to 3A-8 and the samples 3B-1 to 3B-8 was within the range from $1\times10^{20}$ atoms/cm$^3$ to $1\times10^{21}$ atoms/cm$^3$, and a large increase was not observed.

As shown in FIG. 59B and FIG. 60B, the fluorine concentration in each of the samples 3A-1 to 3A-8 and the samples 3B-1 to 3B-8 tends to be decreased with an increase in the flow rate of $SiH_4$. While the fluorine concentration in each of the samples 3A-1 to 3A-8 was within the range from $1\times10^{20}$ atoms/cm$^3$ to $1\times10^{21}$ atoms/cm$^3$, the fluorine concentration in each of the samples 3B-1 to 3B-8 was increased with an increase in the flow rate of $SiF_4$ and within the range from $1\times10^{21}$ atoms/cm$^3$ to $1\times10^{22}$ atoms/cm$^3$.

As shown in FIG. 59C and FIG. 60C, a clear tendency by an increase in the flow rate of $SiH_4$ was not seen for the nitrogen concentration in each of the samples 3A-1 to 3A-8 and the samples 3B-1 to 3B-8. When the flow rate of $SiH_4$ is low, the samples 3A-1 to 3A-8 and the samples 3B-1 to 3B-8 have different tendencies; when the flow rate of $SiH_4$ is high, the nitrogen concentrations of the samples 3A-1 to 3A-8 were substantially equal to those of the samples 3B-1 to 3B-8.

In this example, samples were fabricated by stacking a silicon oxide film, a silicon oxynitride film, a hafnium oxide film, and a silicon oxide film containing fluorine over a silicon substrate and evaluated by X-ray photoelectron spectroscopy (XPS). For the XPS evaluation, samples 3C-1 to 3C-4 were formed as reference samples. The outermost surface of the sample 3C-1 was silicon oxide deposited by a PECVD method. The outermost surface of the sample 3C-2 was silicon oxide containing fluorine deposited by a PECVD method. The outermost surface of the sample 3C-3 was silicon oxide containing fluorine deposited by a PECVD method using a deposition gas containing 0.2 sccm of $SiH_4$. The outermost surface of the sample 3C-4 was silicon oxide containing fluorine deposited by a PECVD method using a deposition gas containing 4 sccm of $SiH_4$.

A method for forming the samples used in the XPS analysis is described. First, by thermal oxidation of a silicon wafer, a 100-nm-thick silicon oxide film was formed on a surface of the silicon wafer. The thermal oxidation was performed at 950° C. in an oxygen atmosphere containing HCl at 3 volume % for 4 hours.

Then, a 10-nm-thick silicon oxynitride film was formed over the silicon oxide film by a PECVD method at a substrate temperature of 400° C.

Next, a 20-nm-thick hafnium oxide film was formed over the silicon oxynitride film by an ALD method. In the film formation by an ALD method, the substrate temperature was 200° C., and a source gas obtained by sublimating a solid containing tetrakis(dimethylamido)hafnium (TDMAH) and an $O_3$ gas) that was an oxidizer were used.

Then, a 30-nm-thick silicon oxide film containing fluorine was formed over the hafnium oxide film by a PECVD method. Note that for the sample 3C-1 (comparative example), a silicon oxide film was formed by a PECVD method at a substrate temperature of 500° C.

For the samples 3C-2 to 3C-4, before the deposition of the silicon oxide film containing fluorine, pretreatment for letting $SiH_4$ flow at 200 sccm for 20 seconds was performed. The deposition conditions were as follows: 1.5 sccm of $SiF_4$, 1000 sccm of $N_2O$, and 1000 sccm of Ar were used as deposition gases; RF power source frequency was 60 MHz; RF power was 800 W; deposition pressure was 133 Pa; and the substrate temperature was 400° C. In addition, 0.2 sccm of $SiH_4$ was added to the deposition gases for the sample 3C-3, and 4 sccm of $SiH_4$ was added to the deposition gases for the sample 3C-4.

Figure 61A:
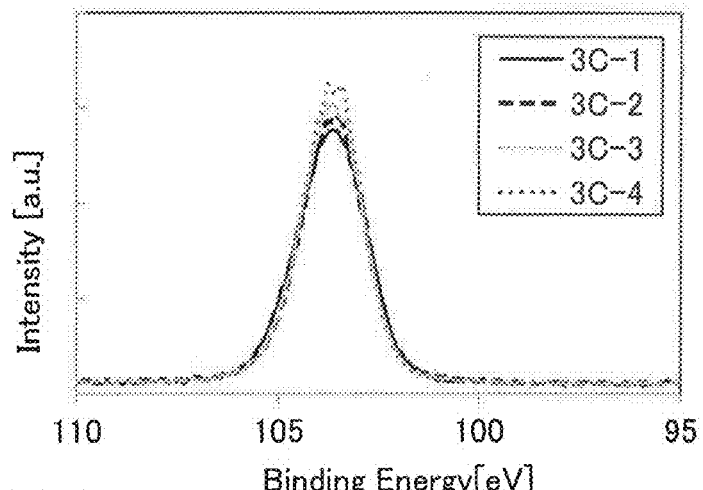
FIGS. 61A to 61C are graphs each showing results of XPS measurement in Example.
Figure 61B:
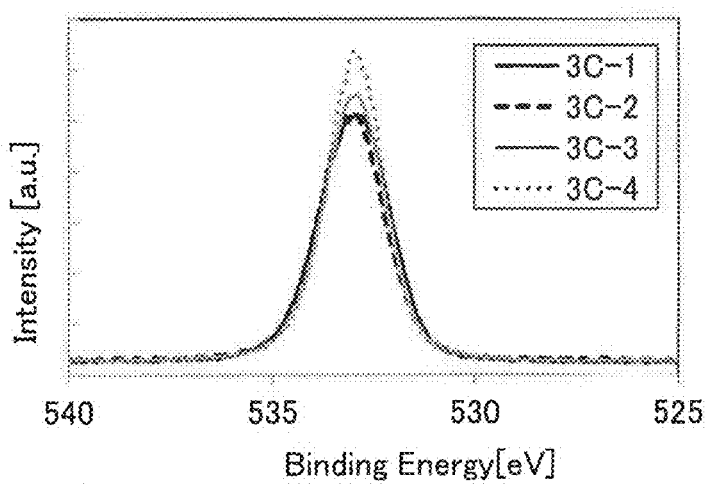
Figure 61C:
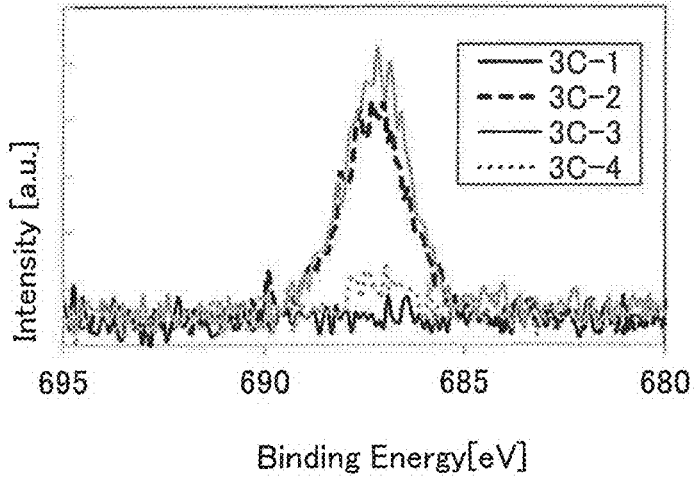

The samples 3C-1 to 3C-4 formed in the above manner were analyzed by XPS and the results are shown in FIGS. 61A to 61C. FIG. 61A shows a spectrum corresponding to the 2p orbital of Si; FIG. 61B shows a spectrum corresponding to the is orbital of O; and FIG. 61C shows a spectrum corresponding to the 1s orbital of F. In each of FIGS. 61A to 61C, the horizontal axis represents binding energy [eV], and the vertical axis represents the spectrum intensity. Table 1 shows the compositions [atomic %] of Si, O, C, and F in each of the samples 3C-1 to 3C-4.

TABLE 1

|  | Si | O | C | F |
|---|---|---|---|---|
| Sample 3C-1 [atomic %] | 29.0 | 61.9 | 9.0 | — |
| Sample 3C-2 [atomic %] | 29.1 | 59.1 | 8.5 | 3.3 |
| Sample 3C-3 [atomic %] | 29.1 | 59.3 | 8.0 | 3.6 |
| Sample 3C-4 [atomic %] | 29.3 | 62.5 | 7.9 | 0.3 |

As shown in FIGS. 61A and 61B, a significant difference in the amounts of silicon and oxygen was not observed between the samples 3C-1 to 3C-4. However, when focusing on oxygen and fluorine, as the flow rate of $SiH_4$ in the deposition gas is decreased and thus the flow rate of $SiF_4$ is relatively increased, the proportion of fluorine is increased and the proportion of oxygen is decreased, as shown in Table 1.

As shown in FIG. 61C, each of the samples 3C-2 and 3C-3 with relatively high flow rates of $SiF_4$ in the deposition gas shows a large peak of the 1s orbital of F. This peak appears in the region of a SiF covalent bond (higher than or equal to 685.4 eV and lower than or equal to 687.5 eV, the median value: 686.5 eV), which means that the SiF covalent bond is formed on a surface of each of the samples 3C-2 and 3C-3.

REFERENCE NUMERALS

200: imaging device, 201: switch, 202: switch, 203: switch, 210: pixel portion, 211: pixel, 212: subpixel, 212B: subpixel, 212G: subpixel, 212R: subpixel, 220: photoelectric conversion element, 230: pixel circuit, 231: wiring, 247: wiring, 248: wiring, 249: wiring, 250: wiring, 253: wiring, 254: filter, 254B: filter, 254G: filter, 254R: filter, 255: lens, 256: light, 257: wiring, 260: peripheral circuit, 270: peripheral circuit, 280: peripheral circuit, 290: peripheral circuit, 291: light source, 300: silicon substrate, 301: insulator, 302: insulator, 303: electron trap layer, 305: layer, 310a: conductor, 310b: conductor, 310c: conductor, 320: layer, 331: layer, 340: layer, 351: transistor, 352: transistor, 353: transistor, 354: transistor, 360: photodiode, 361: anode, 362: cathode, 363: low-resistance region, 365: photodiode, 366: semiconductor layer, 367: semiconductor layer, 368: semiconductor layer, 370: plug, 371: wiring, 372: wiring, 373: wiring, 374: wiring, 380: insulator, 381: insulator, 400: substrate, 401: insulator, 402: insulator, 403: insulator, 404: insulator, 405h1: distance, 405h2: distance, 406a: insulator, 406a1: insulator, 406b: semiconductor, 406b1: semiconductor, 406c: insulator, 407: region, 407a1: region, 407a2: region, 408: insulator, 410: insulator, 410a: insulator, 411: resist mask, 412: insulator, 414: conductor, 415: conductor, 416a1: conductor, 416a2: conductor, 418: insulator, 428: insulator, 429: conductor, 430: conductor, 431: conductor, 432: conductor, 433: conductor, 434: conductor, 437: conductor, 438: conductor, 440: conductor, 442: conductor, 444: conductor, 450: semiconductor substrate, 454: conductor, 460: region, 462: insulator, 464: insulator, 465: insulator, 466: insulator, 467: insulator, 468: insulator, 469: insulator, 470: insulator, 472: insulator, 474a: region, 474b: region, 475: insulator, 476a: conductor, 476b: conductor, 476c: conductor, 477a: conductor, 477b: conductor, 477c: conductor, 478a: conductor, 478b: conductor, 478c: conductor, 479a: conductor, 479b: conductor, 479c: conductor, 480a: conductor, 480b: conductor, 480c: conductor, 483a: conductor, 483b: conductor, 483c: conductor, 483d: conductor, 483e: conductor, 483f: conductor, 484a: conductor, 484b: conductor, 484c: conductor, 484d: conductor, 485a: conductor, 485b: conductor, 485c: conductor, 485d: conductor, 487a: conductor, 487b: conductor, 487c: conductor, 488a: conductor, 488b: conductor, 488c: conductor, 489a: conductor, 489b: conductor, 490a: conductor, 490b: conductor, 491a: conductor, 491b: conductor, 491c: conductor, 492a: conductor, 492b: conductor, 492c: conductor, 494: conductor, 496: conductor, 498: insulator, 550: interposer, 551: chip, 552: terminal, 553: mold resin, 600: panel, 601: printed wiring board, 602: package, 603: FPC, 604: battery, 700: substrate, 703: insulator, 704a: conductor, 704b: conductor, 706a: insulator, 706b: conductor, 706c: insulator, 706d: insulator, 706e: conductor, 706f: insulator, 710: insulator, 712a: insulator, 714a: conductor, 714b: conductor, 716a1: conductor, 716a2: conductor, 716a3: conductor, 716a4: conductor, 718b: insulator, 719: light-emitting element, 720: insulator, 721: insulator, 728: insulator, 731: terminal, 732: FPC, 733a: wiring, 734: sealant, 735: driver circuit, 736: driver circuit, 737: pixel, 741: transistor, 742: capacitor, 743: switching element, 744: signal line, 750: substrate, 751: transistor, 752: capacitor, 753: liquid crystal element, 754: scan line, 755: signal line, 781: conductor, 782: light-emitting layer, 783: conductor, 784: partition wall, 791: conductor, 792: insulator, 793: liquid crystal layer, 794: insulator, 795: spacer, 796: conductor, 797: substrate, 800: RF tag, 801: communication device, 802: antenna, 803: radio signal, 804: antenna, 805: rectifier circuit, 806: constant voltage circuit, 807: demodulation circuit, 808: modulation circuit, 809: logic circuit, 810: memory circuit, 811: ROM, 1010: ADEPT, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 1200: memory element, 1201: circuit, 1202: circuit, 1203: switch, 1204: switch, 1206: logic element, 1207: capacitor, 1208: capacitor, 1209: transistor, 1210: transistor, 1213: transistor, 1214: transistor, 1220: circuit, 2100: transistor, 2200: transistor, 2201: insulator, 2202: wiring, 2203: plug, 2204: insulator, 2205: wiring, 2207: insulator, 2208: insulator, 2211: semiconductor substrate, 2212: insulator, 2213: gate electrode, 2214: gate insulator, 2215: source and drain regions, 3001: wiring, 3002: wiring, 3003: wiring, 3004: wiring, 3005: wiring, 3200: transistor, 3300: transistor, 3400: capacitor, 4000: RF tag, 6000: display module, 6001: upper cover, 6002: lower cover, 6003: FPC, 6004: touch panel, 6005: FPC, 6006: display panel, 6007: backlight unit, 6008: light source, 6009: frame, 6010: printed board, 6011: battery, 7101: housing, 7102: housing, 7103: display portion, 7104: display portion, 7105: microphone, 7106: speaker, 7107: operation key, 7108: stylus, 7302: housing, 7304: display portion, 7311: operation button, 7312: operation button, 7313: connection terminal, 7321: band, 7322: clasp, 7501: housing, 7502: display portion, 7503: operation button, 7504: external connection port, 7505: speaker, 7506: microphone, 7701: housing, 7702: housing, 7703: display portion, 7704: operation key, 7705: lens, 7706: joint, 7901: utility pole, 7902: display portion, 8000: camera, 8001: housing, 8002: display portion, 8003: operation button, 8004: shutter button, 8005: connection portion, 8006: lens, 8100: finder, 8101: housing, 8102: display portion, 8103: button, 8121: housing, 8122: display portion, 8123: keyboard, 8124: pointing device, 8200: head-mounted display, 8201: mounting portion, 8202: lens, 8203: main body, 8204: display portion, 8205: cable, 8206: battery, 9700: automobile, 9701: car body, 9702: wheel, 9703: dashboard, 9704: light, 9710: display portion, 9711: display portion, 9712: display portion, 9713: display portion, 9714: display portion, 9715: display portion, 9721: display portion, 9722: display portion, 9723: display portion.

This application is based on Japanese Patent Application serial no. 2015-091597 filed with Japan Patent Office on Apr. 28, 2015, the entire contents of which are hereby incorporated by reference.

The invention claimed is:

1. A method for manufacturing a semiconductor device comprising the steps of:
   forming a second insulator over a first insulator;
   forming a first conductor over the second insulator;
   forming a first conductive layer by etching the first conductor;
   forming a third insulator over the second insulator and the first conductive layer;
   forming a fourth insulator over the third insulator;

forming a semiconductor over the fourth insulator;
forming a second conductor over the semiconductor;
forming a second conductive layer by etching the second conductor;
separating the second conductive layer into a third conductive layer and a fourth conductive layer by etching the second conductive layer;
forming a semiconductor layer by etching the semiconductor;
forming a first insulating layer by etching the fourth insulator;
forming a fifth insulator over the third insulator but not over the semiconductor layer, the third conductive layer, and the fourth conductive layer;
forming a sixth insulator over the fifth insulator, the semiconductor layer, the third conductive layer, and the fourth conductive layer, and in contact with a side surface of the first insulating layer, a side surface of the semiconductor layer, a side surface of the third conductive layer, and a side surface of the fourth conductive layer;
forming a third conductor over the sixth insulator; and
forming a fifth conductive layer by etching the third conductor.

2. The method for manufacturing a semiconductor device according to claim 1, wherein the fifth insulator is formed with a gas containing silicon and fluorine.

3. The method for manufacturing a semiconductor device according to claim 1, wherein the forth insulator is a multilayer film comprising a metal oxide.

4. The method for manufacturing a semiconductor device according to claim 1, wherein the sixth insulator is a multilayer film comprising a metal oxide.

5. The method for manufacturing a semiconductor device according to claim 1, wherein the semiconductor comprises indium, gallium, zinc, and oxygen.

6. The method for manufacturing a semiconductor device according to claim 1, further comprising a step of forming an electron trap layer below the third insulator.

\* \* \* \* \*